US012021503B2

(12) United States Patent
Garcia et al.

(10) Patent No.: US 12,021,503 B2
(45) Date of Patent: *Jun. 25, 2024

(54) TRANSVERSELY-EXCITED FILM BULK ACOUSTIC RESONATOR WITH OPTIMIZED PIEZOELECTRIC PLATE THICKNESS AND HAVING MULTIPLE PITCHES AND MARKS

(71) Applicant: Murata Manufacturing Co., Ltd., Nagaokakyo (JP)

(72) Inventors: Bryant Garcia, Mississauga (CA); Robert B. Hammond, Santa Barbara, CA (US); Patrick Turner, San Bruno, CA (US); Viktor Plesski, Gorgier (CH); Ventsislav Yantchev, Sofia (BG); Soumya Yandrapalli, Lausanne (CH)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 138 days.

This patent is subject to a terminal disclaimer.

(21) Appl. No.: 17/565,762

(22) Filed: Dec. 30, 2021

(65) Prior Publication Data

US 2022/0131526 A1 Apr. 28, 2022

Related U.S. Application Data

(63) Continuation of application No. 17/560,889, filed on Dec. 23, 2021, which is a continuation-in-part of (Continued)

(51) Int. Cl.
*H03H 9/17* (2006.01)
*H03H 9/02* (2006.01)
(Continued)

(52) U.S. Cl.
CPC .............. *H03H 9/171* (2013.01); *H03H 9/02* (2013.01); *H03H 9/54* (2013.01); *H03H 9/02015* (2013.01); *H03H 9/13* (2013.01)

(58) Field of Classification Search
CPC ........ H03H 9/02015; H03H 3/02; H03H 9/13; H03H 9/54; H03H 9/171
(Continued)

(56) References Cited

U.S. PATENT DOCUMENTS

| 5,204,575 A | 4/1993 | Kanda et al. |
| 5,274,345 A | 12/1993 | Gau |

(Continued)

FOREIGN PATENT DOCUMENTS

| CN | 113765495 A | 12/2021 |
| JP | 2002300003 A | 10/2002 |

(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Hafizur Rahman
(74) *Attorney, Agent, or Firm* — ARENTFOX SCHIFF LLP

(57) ABSTRACT

Acoustic resonators and filter devices. An acoustic resonator including a piezoelectric plate having front and back surfaces, a portion of the piezoelectric plate forming a diaphragm, and a conductor pattern on the front surface, the conductor pattern including an interdigital transducer (IDT), fingers of the IDT on the diaphragm. A thickness between the front and back surfaces is greater than or equal to 200 nm and less than or equal to 1000 nm. The IDT comprises a first portion having a first pitch and a first mark and a second portion having a second pitch and a second mark not equal to the first pitch and first mark.

20 Claims, 31 Drawing Sheets

Related U.S. Application Data application No. 17/460,737, filed on Aug. 30, 2021, and a continuation-in-part of application No. 17/388,745, filed on Jul. 29, 2021, and a continuation-in-part of application No. 17/351,204, filed on Jun. 17, 2021, and a continuation-in-part of application No. 17/229,767, filed on Apr. 13, 2021, and a continuation-in-part of application No. 17/217,923, filed on Mar. 30, 2021, and a continuation-in-part of application No. 17/169,155, filed on Feb. 5, 2021, and a continuation-in-part of application No. 17/122,977, filed on Dec. 15, 2020, now Pat. No. 11,509,279, and a continuation-in-part of application No. 17/115,765, filed on Dec. 8, 2020, said application No. 17/351,204 is a continuation of application No. 17/030,066, filed on Sep. 23, 2020, now Pat. No. 11,146,232, said application No. 17/560,889 is a continuation-in-part of application No. 17/022,042, filed on Sep. 15, 2020, now Pat. No. 11,323,090, and a continuation-in-part of application No. 16/989,710, filed on Aug. 10, 2020, now Pat. No. 11,323,089, said application No. 17/115,765 is a continuation of application No. 16/933,224, filed on Jul. 20, 2020, now Pat. No. 10,911,023, said application No. 17/169,155 is a continuation-in-part of application No. 16/930,534, filed on Jul. 16, 2020, now Pat. No. 11,323,096, said application No. 17/030,066 is a continuation-in-part of application No. 16/920,173, filed on Jul. 2, 2020, now Pat. No. 11,139,794, said application No. 17/022,042 is a continuation-in-part of application No. 16/829,617, filed on Mar. 25, 2020, now Pat. No. 10,868,512, said application No. 17/460,737 is a continuation of application No. 16/805,471, filed on Feb. 28, 2020, now Pat. No. 11,206,009, said application No. 17/022,042 is a continuation-in-part of application No. 16/782,971, filed on Feb. 5, 2020, now Pat. No. 10,790,802, which is a continuation-in-part of application No. 16/689,707, filed on Nov. 20, 2019, now Pat. No. 10,917,070, said application No. 16/930,534 is a continuation-in-part of application No. 16/689,707, filed on Nov. 20, 2019, now Pat. No. 10,917,070, said application No. 16/829,617 is a continuation of application No. 16/578,811, filed on Sep. 23, 2019, now Pat. No. 10,637,438, said application No. 16/989,710 is a continuation-in-part of application No. 16/438,121, filed on Jun. 11, 2019, now Pat. No. 10,756,697, said application No. 16/782,971 is a continuation-in-part of application No. 16/438,141, filed on Jun. 11, 2019, now Pat. No. 10,601,392, said application No. 16/920,173 is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192, said application No. 16/689,707 is a continuation of application No. 16/230,443, filed on Dec. 21, 2018, now Pat. No. 10,491,192, said application No. 16/578,811 is a continuation-in-part of application No. 16/230,443, filed on Dec. 21, 2018, now Pat. No. 10,491,192, said application No. 16/438,141 is a continuation-in-part of application No. 16/230,443, filed on Dec. 21, 2018, now Pat. No. 10,491,192.

(60) Provisional application No. 63/144,977, filed on Feb. 3, 2021, provisional application No. 63/112,395, filed on Nov. 11, 2020, provisional application No. 63/088,344, filed on Oct. 6, 2020, provisional application No. 63/081,169, filed on Sep. 21, 2020, provisional application No. 63/074,991, filed on Sep. 4, 2020, provisional application No. 63/066,520, filed on Aug. 17, 2020, provisional application No. 63/053,584, filed on Jul. 18, 2020, provisional application No. 63/026,824, filed on May 19, 2020, provisional application No. 63/012,849, filed on Apr. 20, 2020, provisional application No. 62/993,586, filed on Mar. 23, 2020, provisional application No. 62/978,133, filed on Feb. 18, 2020, provisional application No. 62/951,452, filed on Dec. 20, 2019, provisional application No. 62/904,386, filed on Sep. 23, 2019, provisional application No. 62/904,133, filed on Sep. 23, 2019, provisional application No. 62/892,871, filed on Aug. 28, 2019, provisional application No. 62/874,709, filed on Jul. 16, 2019, provisional application No. 62/818,564, filed on Mar. 14, 2019, provisional application No. 62/753,815, filed on Oct. 31, 2018, provisional application No. 62/753,809, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/682,825, filed on Jun. 15, 2018.

(51) Int. Cl.
*H03H 9/54* (2006.01)
*H03H 9/13* (2006.01)

(58) Field of Classification Search
USPC .......................................................... 333/193
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Motorola |
| 5,729,186 A | 3/1998 | Seki et al. |
| 5,853,601 A | 12/1998 | Krishaswamy |
| 6,172,582 B1 | 1/2001 | Tickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |

(56) References Cited

U.S. PATENT DOCUMENTS

| | | |
|---|---|---|
| 9,130,145 B2 | 9/2015 | Martin et al. |
| 9,148,121 B2 | 9/2015 | Inoue |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0099091 A1 | 5/2005 | Mishima et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0090898 A1 | 4/2007 | Kando |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0296304 A1 | 12/2007 | Fujii et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2010/0212127 A1 | 8/2010 | Heinze et al. |
| 2010/0310703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0199163 A1 | 8/2011 | Yamanaka |
| 2011/0278993 A1 | 11/2011 | Iwamoto |
| 2012/0073390 A1 | 3/2012 | Zaghloul et al. |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0165479 A1 | 6/2015 | Lasiter et al. |
| 2015/0244149 A1 | 8/2015 | Van Someren |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0036415 A1 | 2/2016 | Ikeuchi |
| 2016/0079958 A1 | 3/2016 | Burak |
| 2016/0087187 A1 | 3/2016 | Burak |
| 2016/0149554 A1 | 5/2016 | Nakagawa |
| 2016/0182009 A1 | 6/2016 | Bhattacharjee |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0214389 A1 | 7/2017 | Tsutsumi |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0278227 A1 | 9/2018 | Hurwitz |

(56) References Cited

U.S. PATENT DOCUMENTS

| | | |
|---|---|---|
| 2018/0316333 A1 | 11/2018 | Nakamura et al. |
| 2018/0358948 A1 | 12/2018 | Gong et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0295729 A1 | 9/2020 | Yantchev |
| 2020/0304091 A1 | 9/2020 | Yantchev |
| 2020/0313645 A1 | 10/2020 | Caron |
| 2020/0321939 A1 | 10/2020 | Turner et al. |
| 2020/0328728 A1 | 10/2020 | Nakagawa et al. |
| 2020/0350891 A1 | 11/2020 | Turner |
| 2020/0373907 A1 | 11/2020 | Garcia |
| 2021/0013859 A1 | 1/2021 | Turner et al. |
| 2021/0273631 A1 | 9/2021 | Jachowski et al. |
| 2021/0313951 A1 | 10/2021 | Yandrapalli et al. |
| 2021/0328574 A1 | 10/2021 | Garcia |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123721 A1* | 4/2022 | Garcia .................. H03H 9/171 |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | | |
|---|---|---|---|
| JP | 2004096677 A | 3/2004 | |
| JP | 2004523179 A | 7/2004 | |
| JP | 2007329584 A | 12/2007 | |
| JP | 2010062816 A | 3/2010 | |
| JP | 2010103803 A | 5/2010 | |
| JP | 2010154505 A | 7/2010 | |
| JP | 2010233210 A | 10/2010 | |
| JP | 2013528996 A | 7/2013 | |
| JP | 2013214954 A | 10/2013 | |
| JP | 2017526254 A | 9/2017 | |
| JP | 2017220910 A | 12/2017 | |
| JP | 2018093487 A | 6/2018 | |
| JP | 2018166259 A | 10/2018 | |
| JP | 2018207144 A | 12/2018 | |
| JP | 2019186655 A | 10/2019 | |
| JP | 2020113939 A | 7/2020 | |
| JP | 2022186631 A * | 12/2022 | ............... H03H 9/13 |
| WO | 2010047114 A1 | 4/2010 | |
| WO | 2013021948 A1 | 2/2013 | |
| WO | 2015098694 A1 | 7/2015 | |
| WO | 2016017104 | 2/2016 | |
| WO | 2016052129 A1 | 4/2016 | |
| WO | 2016147687 A1 | 9/2016 | |
| WO | 2017188342 A1 | 11/2017 | |
| WO | 2018003268 A1 | 1/2018 | |
| WO | 2018003273 | 1/2018 | |
| WO | 2018163860 A1 | 9/2018 | |
| WO | 2019117133 A1 | 6/2019 | |
| WO | 2019138810 A1 | 7/2019 | |
| WO | 2020092414 A2 | 5/2020 | |
| WO | 2020100744 A1 | 5/2020 | |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Material Properties of Tibtech Innovations, @ 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

(56) References Cited

OTHER PUBLICATIONS

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

Chen et al., "Development and Application of SAW Filter," Micromachines, Apr. 20, 2022, vol. 13, No. 656, pp. 1-15.

Heremann et al., "Properties of shear-horizontal surface acoustic waves in different layered quartz-SiO2 structures," Ultrasonics, 1999, vol. 37, pp. 335-341.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

* cited by examiner

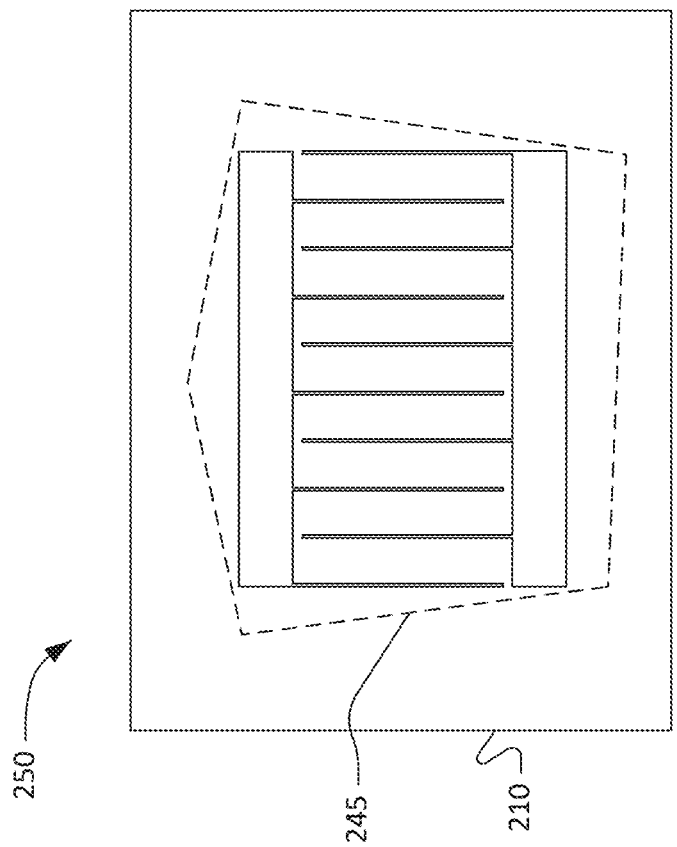
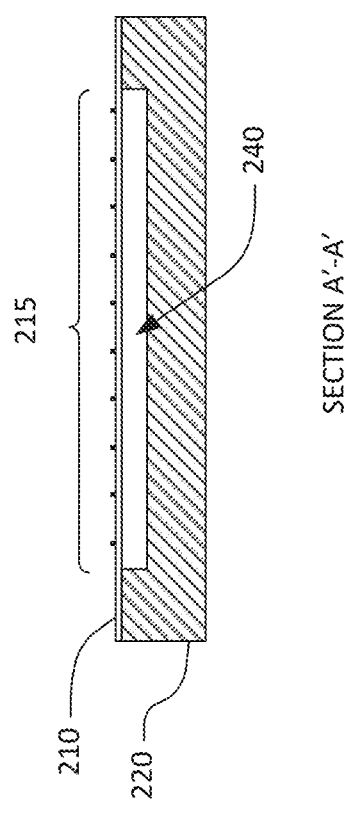
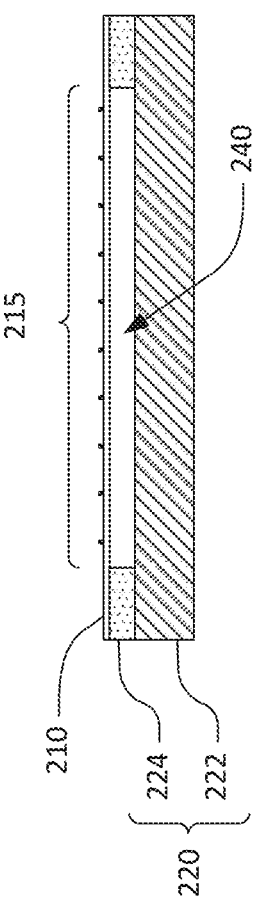
FIG. 2C
FIG. 2A
FIG. 2B

TRANSVERSELY-EXCITED FILM BULK ACOUSTIC RESONATOR WITH OPTIMIZED PIEZOELECTRIC PLATE THICKNESS AND HAVING MULTIPLE PITCHES AND MARKS

RELATED APPLICATION INFORMATION

This patent is a continuation of application Ser. No. 17/560,889, filed Dec. 23, 2021, entitled TRANSVERSELY-EXCITED FILM BULK ACOUSTIC RESONATOR WITH OPTIMIZED ELECTRODE THICKNESS, MARK, AND PITCH.

Application Ser. No. 17/560,889 is a continuation-in-part of application Ser. No. 17/022,042, filed Sep. 15, 2020, entitled TRANSVERSELY-EXCITED FILM BULK ACOUSTIC RESONATOR USING YX-CUT LITHIUM NIOBATE FOR HIGH POWER APPLICATIONS, which claims priority from provisional patent application 63/026,824, filed May 19, 2020, entitled IDT SIDEWALL ANGLE TO CONTROL SPURIOUS MODES IN XBARS.

Application Ser. No. 17/022,042 is also continuation-in-part of application Ser. No. 16/829,617, entitled HIGH POWER TRANSVERSELY-EXCITED FILM BULK ACOUSTIC RESONATORS ON Z-CUT LITHIUM NIOBATE, filed Mar. 25, 2020, now U.S. Pat. No. 10,868,512, which is a continuation of application Ser. No. 16/578,811, entitled TRANSVERSELY-EXCITED FILM BULK ACOUSTIC RESONATORS FOR HIGH POWER APPLICATIONS, filed Sep. 23, 2019, now U.S. Pat. No. 10,637,438. application Ser. No. 17/022,042 is also a continuation in part of application Ser. No. 16/782,971, entitled TRANSVERSELY-EXCITED FILM BULK ACOUSTIC RESONATOR USING ROTATED Y-X CUT LITHIUM NIOBATE, filed Feb. 5, 2020, now U.S. Pat. No. 10,790,802, which claims priority from 62/904,133, filed Sep. 23, 2019, entitled WIDE BAND BAW RESONATORS ON 120-130 Y-X LITHIUM NIOBATE SUBSTRATES; is a continuation-in-part of application Ser. No. 16/689,707, entitled BANDPASS FILTER WITH FREQUENCY SEPARATION BETWEEN SHUNT AND SERIES RESONATORS SET BY DIELECTRIC LAYER THICKNESS, filed Nov. 20, 2019, now U.S. Pat. No. 10,917,070; and is a continuation in part of application Ser. No. 16/438,141, filed Jun. 11, 2019, entitled SOLIDLY-MOUNTED TRANSVERSELY-EXCITED FILM BULK ACOUSTIC RESONATOR, now U.S. Pat. No. 10,601,392, which claims priority from application 62/818,564, filed Mar. 14, 2019, entitled SOLIDLY MOUNTED XBAR and application 62/753,809, filed Oct. 31, 2018, entitled SOLIDLY MOUNTED SHEAR-MODE FILM BULK ACOUSTIC RESONATOR. application Ser. No. 16/438,141 is also a continuation-in-part of application Ser. No. 16/230,443. application Ser. No. 16/578,811 is a continuation-in-part of application Ser. No. 16/230,443 and application Ser. No. 16/689,707 is a continuation of application Ser. No. 16/230,443. application Ser. No. 16/230,443, entitled TRANSVERSELY-EXCITED FILM BULK ACOUSTIC RESONATOR, filed Dec. 21, 2018, now U.S. Pat. No. 10,491,192, claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR.

Application Ser. No. 17/560,889 is also a continuation-in-part of application Ser. No. 17/351,204, filed Jun. 17, 2021, entitled TRANSVERSELY-EXCITED FILM BULK ACOUSTIC RESONATOR WITH REDUCED SPURIOUS MODES, which is a continuation of application Ser. No. 17/030,066, filed Sep. 23, 2020, entitled TRANSVERSELY-EXCITED FILM BULK ACOUSTIC RESONATOR WITH REDUCED SPURIOUS MODES, now U.S. Pat. No. 11,146,232, which claims priority from provisional patent application 62/904,386, filed Sep. 23, 2019, entitled ANALYSIS OF XBAR RESONANCE AND HIGHER ORDER SPURIOUS MODES.

Application Ser. No. 17/030,066 is also a continuation-in-part of application Ser. No. 16/920,173, filed Jul. 2, 2020, entitled TRANSVERSELY-EXCITED FILM BULK ACOUSTIC RESONATOR, now U.S. Pat. No. 11,139,794, which is a continuation of application Ser. No. 16/438,121, filed Jun. 11, 2019, entitled TRANSVERSELY-EXCITED FILM BULK ACOUSTIC RESONATOR, now U.S. Pat. No. 10,756,697, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192 B2, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR.

Application Ser. No. 17/560,889 is also a continuation-in-part of application Ser. No. 17/169,155, filed Feb. 5, 2021, entitled TRANSVERSELY-EXCITED FILM BULK ACOUSTIC RESONATOR WITH PERIODIC ETCHED HOLES, which claims priority from provisional application 63/081,169, filed Sep. 21, 2020, entitled XBAR WITH HOLES and is a continuation in part of application Ser. No. 16/930,534, filed Jul. 16, 2020, entitled TRANSVERSELY-EXCITED FILM BULK ACOUSTIC RESONATOR WITH PERIODIC ETCHED HOLES.

Application Ser. No. 16/930,534 claims priority from provisional patent application 62/874,709, filed Jul. 16, 2019, entitled XBAR WITH SLANTED AND/OR PERFORATED MEMBRANE, and is also a continuation in part of application Ser. No. 16/689,707, entitled BANDPASS FILTER WITH FREQUENCY SEPARATION BETWEEN SHUNT AND SERIES RESONATORS SET BY DIELECTRIC LAYER THICKNESS, filed Nov. 20, 2019, now U.S. Pat. No. 10,917,070, which is a continuation of application Ser. No. 16/230,443, entitled TRANSVERSELY-EXCITED FILM BULK ACOUSTIC RESONATOR, filed Dec. 21, 2018, now U.S. Pat. No. 10,491,192, issued Nov. 26, 2019, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUS- TIC RESONATOR, and application 62/753,815, filed Oct. 31, 2018, entitled LITHIUM TANTALATE SHEAR-MODE FILM BULK ACOUSTIC RESONATOR.

Application Ser. No. 17/560,889 is also a continuation-in-part of application Ser. No. 16/989,710, filed Aug. 10, 2020, entitled FILTER USING PIEZOELECTRIC FILM BONDED TO HIGH RESISTIVITY SILICON SUBSTRATE WITH TRAP-RICH LAYER, which claims priority to provisional patent application 62/951,452, filed Dec. 20, 2019, entitled PIEZOELECTRIC FILM BONDED TO HIGH RESISTIVITY SILICON HAVING TRAP-RICH LAYER FOR RF FILTERS. application Ser. No. 16/989,710 is a continuation-in-part of application Ser. No. 16/438,121, filed Jun. 11, 2019, entitled TRANSVERSELY-EXCITED FILM BULK ACOUSTIC RESONATOR, now U.S. Pat. No. 10,756,697, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR.

Application Ser. No. 17/560,889 is also a continuation-in-part of application Ser. No. 17/115,765, filed Dec. 8, 2020, entitled TRANSVERSELY-EXCITED FILM BULK ACOUSTIC RESONATOR WITH THERMALLY CONDUCTIVE ETCH-STOP LAYER, which is a continuation of application Ser. No. 16/933,224, titled TRANSVERSELY-EXCITED FILM BULK ACOUSTIC RESONATOR WITH ETCH-STOP LAYER, filed Jul. 20, 2020, now U.S. Pat. No. 10,911,023, which claims priority to provisional patent application 62/978,133, titled XBAR WITH AL2O3 ETCH-STOP AND BONDING LAYER, filed Feb. 18, 2020, and provisional patent application 62/993,586, titled THIN FILM LAYER TO IMPROVE POWER OF XBAR RESONATORS, filed Mar. 23, 2020.

Application Ser. No. 17/560,889 is also a continuation-in-part of application Ser. No. 17/217,923, filed Mar. 30, 2021, entitled TRANSVERSELY-EXCITED FILM BULK ACOUSTIC RESONATOR WITH LOW THERMAL IMPEDANCE, which claims priority to U.S. provisional patent application No. 63/112,395, titled XBAR WITH LOW THERMAL IMPEDANCE, filed Nov. 11, 2020.

Application Ser. No. 17/560,889 is a continuation-in-part of application Ser. No. 17/229,767, filed Apr. 13, 2021, entitled SMALL TRANSVERSELY-EXCITED FILM BULK ACOUSTIC RESONATORS WITH ENHANCED Q-FACTOR, which claim priority to the following provisional patent applications: application No. 63/012,849, filed Apr. 20, 2020, entitled SMALL HIGH Q XBAR RESONATORS; application No. 63/066,520, filed Aug. 17, 2020, entitled SMALL REFLECTORS TO IMPROVE XBAR LOSS; and application No. 63/074,991, filed Sep. 4, 2020, entitled SMALL REFLECTORS TO IMPROVE PERFORMANCE OF TRANSVERSELY-EXCITED FILM BULK ACOUSTIC RESONATORS AT A SPECIFIED FREQUENCY.

Application Ser. No. 17/560,889 is also a continuation-in-part of application Ser. No. 17/460,737, filed Aug. 20, 2021, entitled TRANSVERSELY-EXCITED FILM BULK ACOUSTIC RESONATOR WITH INTERDIGITAL TRANSDUCER WITH VARIED MARK AND PITCH, which is a continuation of application Ser. No. 16/805,471, filed Feb. 28, 2020, entitled TRANSVERSELY-EXCITED FILM BULK ACOUSTIC RESONATOR WITH INTERDIGITAL TRANSDUCER WITH VARIED MARK AND PITCH, which claims priority from provisional patent application 62/892,871, filed Aug. 28, 2019, entitled XBAR RESONATORS WITH REDUCED SPURIOUS MODES.

Application Ser. No. 17/560,889 is also a continuation-in-part of application Ser. No. 17/388,745, filed Jul. 29, 2021, entitled TRANSVERSELY-EXCITED FILM BULK ACOUSTIC RESONATOR WITH MULTI-MARK INTERDIGITAL TRANSDUCER, which claims priority from provisional patent application 63/144,977, filed Feb. 3, 2021, entitled CHIRPED XBAR ELECTRODES.

Application Ser. No. 17/560,889 is also a continuation-in-part of application Ser. No. 17/122,977, Dec. 15, 2020, entitled ACOUSTIC RESONATORS AND FILTERS WITH REDUCED TEMPERATURE COEFFICIENT OF FREQUENCY, which claims priority to provisional patent application 63/053,584, filed Jul. 18, 2020, entitled TCF OPTIMIZED XBAR DEVICES, and provisional patent application 63/088,344, filed Oct. 6, 2020, entitled OPTIMAL CUT ANGLE TO REDUCE TCF OF XBAR FILTERS.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

All of these applications are incorporated herein by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 2A is an alternative schematic cross-sectional view of the XBAR of FIG. 1.

FIG. 2B is another alternative schematic cross-sectional view of the XBAR of FIG. 1.

FIG. 2C is an alternative schematic plan view of an XBAR

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
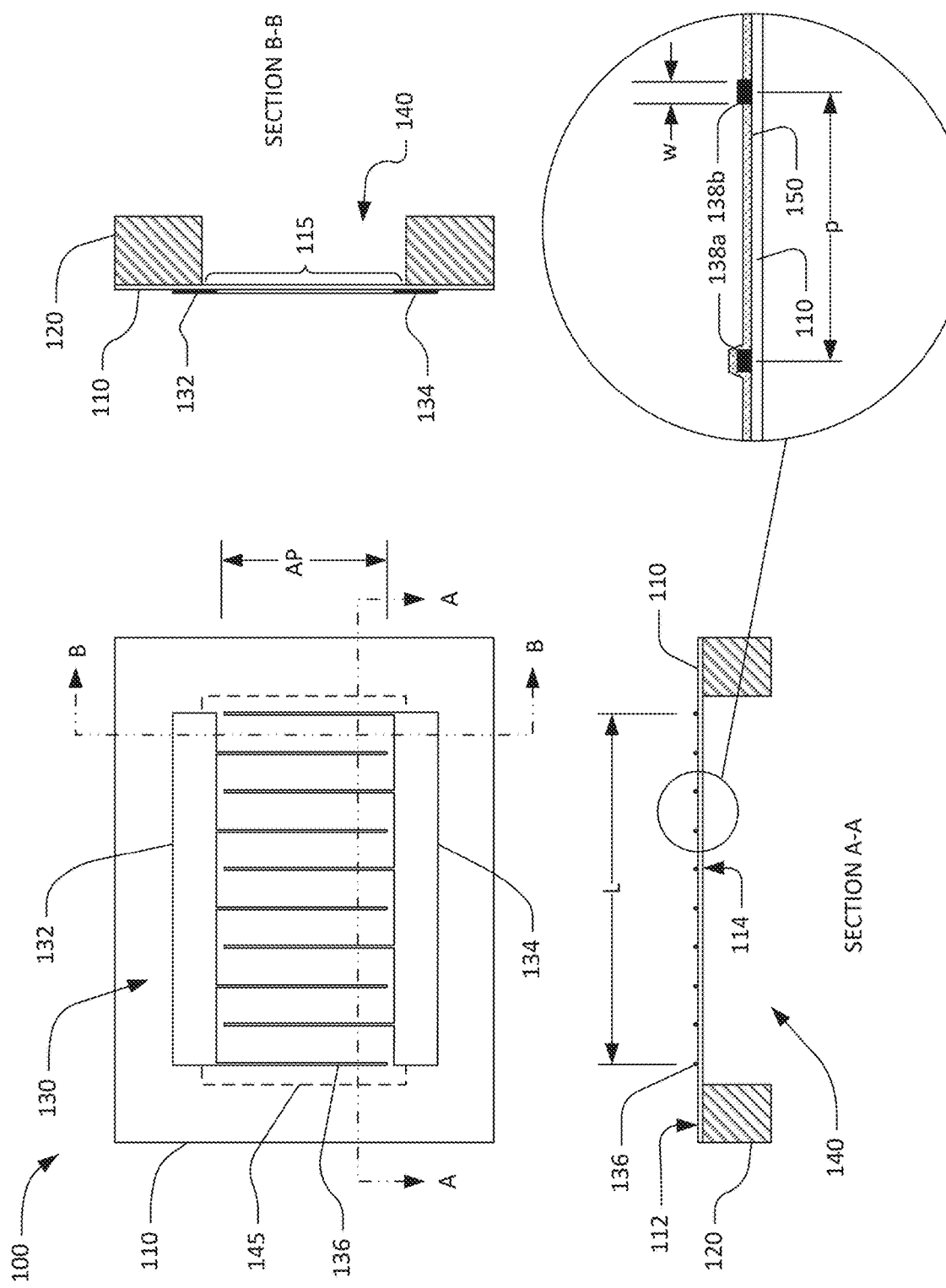
FIG. 1 includes a schematic plan view, two schematic cross-sectional views, and a detail view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations. A thickness between the front and back surfaces 112, 114 of the piezoelectric plate can be greater than or equal to 200 nm and less than or equal to 1000 nm.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode (e.g., a shear primary acoustic mode) within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials. A resonant frequency of the XBAR may be determined in part by a thickness of the front-side dielectric layer.

The IDT fingers 138a and 138b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers.

FIG. 2A and FIG. 2B show two alternative cross-sectional views along the section plane A-A defined in FIG. 1. In FIG. 2A, a piezoelectric plate 210 is attached to a substrate 220. A portion of the piezoelectric plate 210 forms a diaphragm 215 spanning a cavity 240 in the substrate. The cavity 240 does not fully penetrate the substrate 220. Fingers of an IDT are disposed on the diaphragm 215. The cavity 240 may be formed, for example, by etching the substrate 220 before attaching the piezoelectric plate 210. Alternatively, the cavity 240 may be formed by etching the substrate 220 with a selective etchant that reaches the substrate through one or more openings (not shown) provided in the piezoelectric plate 210. In this case, the diaphragm 215 may be contiguous with the rest of the piezoelectric plate 210 around a large portion of a perimeter 245 of the cavity 240. For example, the diaphragm 215 may be contiguous with the rest of the piezoelectric plate 210 around at least 50% of the perimeter 245 of the cavity 240. A intermediate layer (not shown), such as a dielectric bonding layer, may be present between the piezo electric plate 240 and the substrate 220.

In FIG. 2B, the substrate 220 includes a base 222 and an intermediate layer 224 disposed between the piezoelectric plate 210 and the base 222. For example, the base 222 may be silicon and the intermediate layer 224 may be silicon dioxide or silicon nitride or some other material. A portion of the piezoelectric plate 210 forms a diaphragm 215 spanning a cavity 240 in the intermediate layer 224. Fingers of an IDT are disposed on the diaphragm 215. The cavity 240 may be formed, for example, by etching the intermediate layer 224 before attaching the piezoelectric plate 210. Alternatively, the cavity 240 may be formed by etching the intermediate layer 224 with a selective etchant that reaches the substrate through one or more openings provided in the piezoelectric plate 210. In this case, the diaphragm 215 may be contiguous with the rest of the piezoelectric plate 210 around a large portion of a perimeter 245 of the cavity 240. For example, the diaphragm 215 may be contiguous with the rest of the piezoelectric plate 210 around at least 50% of the perimeter 245 of the cavity 240 as shown in FIG. 2C. Although not shown in FIG. 2B, a cavity formed in the intermediate layer 224 may extend into the base 222.

FIG. 2C is a schematic plan view of another XBAR 250. The XBAR 250 includes an IDT formed on a piezoelectric plate 210. A portion of the piezoelectric plate 210 forms a diaphragm spanning a cavity in a substrate. In this example, the perimeter 245 of the cavity has an irregular polygon shape such that none of the edges of the cavity are parallel, nor are they parallel to the conductors of the IDT. A cavity may have a different shape with straight or curved edges.

Figure 3:
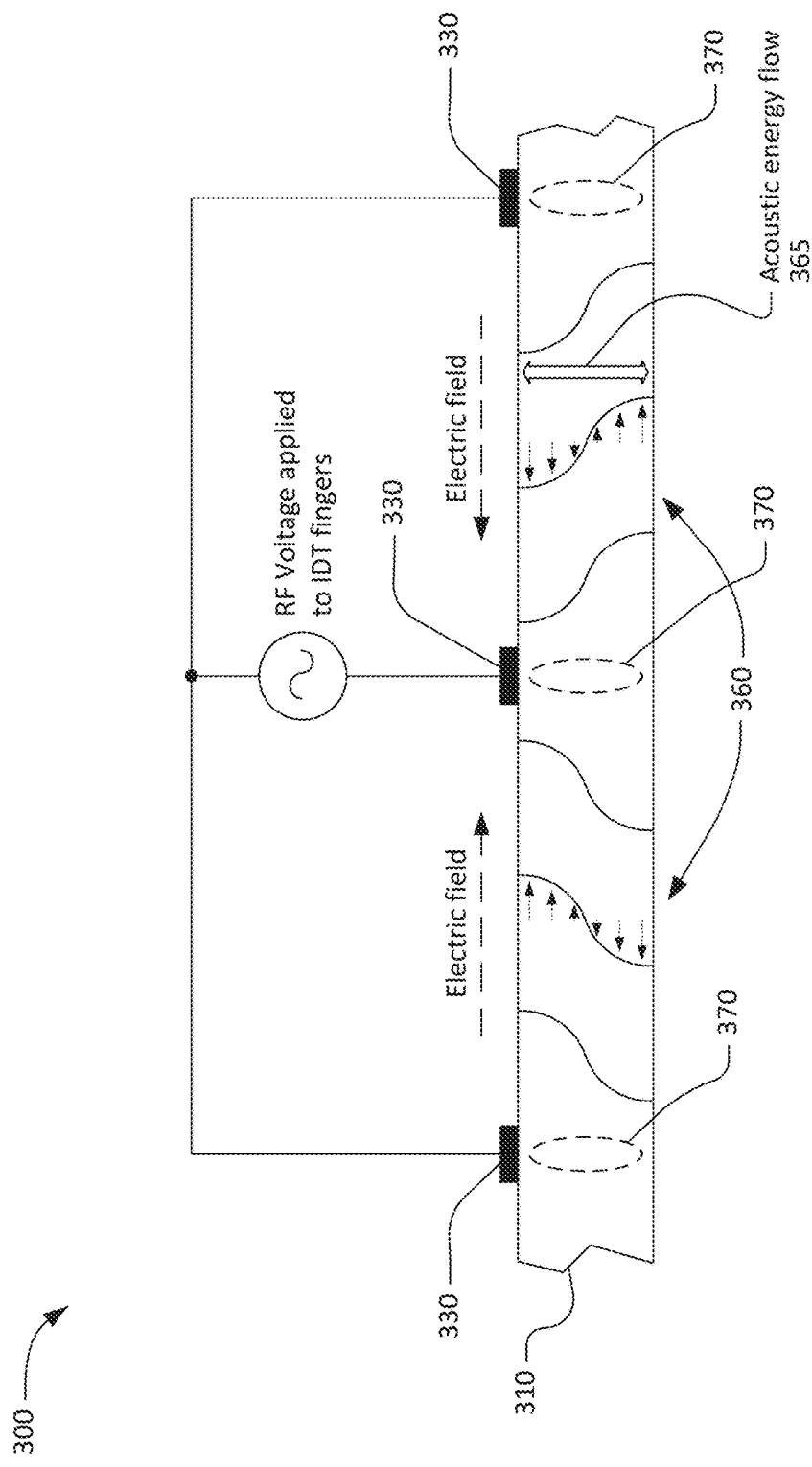
FIG. 3 is a graphic illustrating a shear primary acoustic mode in an XBAR.

FIG. 3 is a graphical illustration of the primary acoustic mode of interest in an XBAR. FIG. 3 shows a small portion of an XBAR 300 including a piezoelectric plate 310 and three interleaved IDT fingers 330 which alternate in electrical polarity from finger to finger. An RF voltage is applied to the interleaved fingers 330. This voltage creates a time-varying electric field between the fingers. The direction of the electric field is predominantly lateral, or parallel to the surface of the piezoelectric plate 310, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 310. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 300 are represented by the curves 360, with the adjacent small arrows providing a schematic indication of the direction and relative magnitude of atomic motion at the resonance frequency. The degree of atomic motion, as well as the thickness of the piezoelectric plate 310, have been greatly exaggerated for ease of visualization. While the atomic motions are predominantly lateral (i.e. horizontal as shown in FIG. 3), the direction of acoustic energy flow of the excited primary acoustic mode is substantially orthogonal to the surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
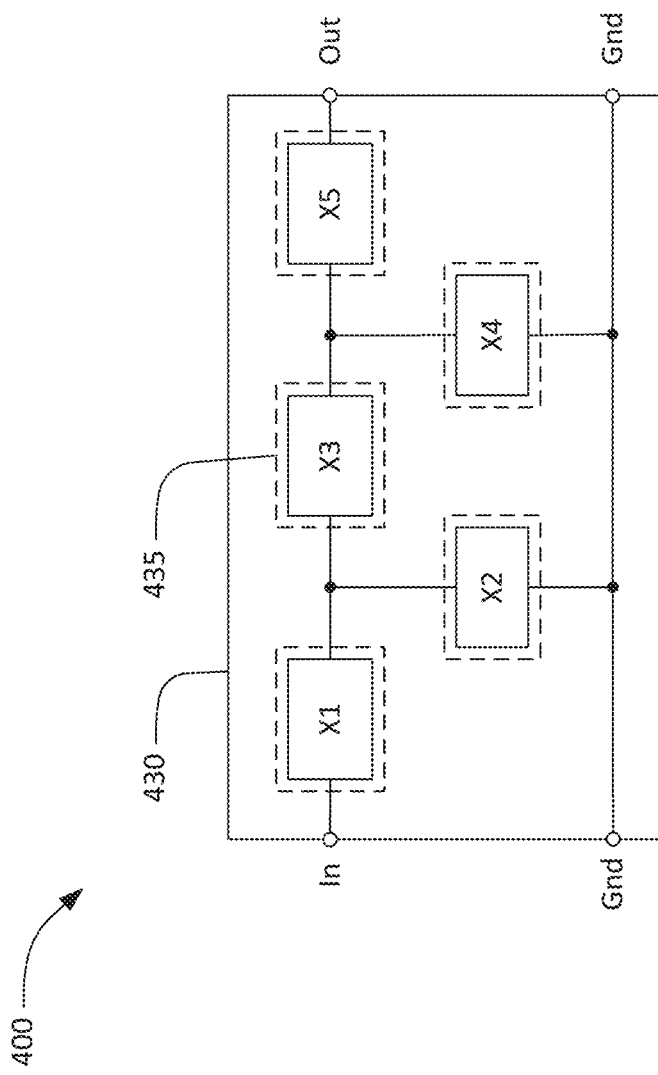
FIG. 4 is a schematic circuit diagram of a band-pass filter using acoustic resonators in a ladder circuit.

FIG. 4 is a schematic circuit diagram of a band-pass filter 400 using five XBARs X1-X5. The filter 400 may be, for example, a band n79 band-pass filter for use in a communication device. The filter 400 has a conventional ladder filter architecture including three series resonators X1, X3, X5 and two shunt resonators X2, X4. The three series resonators X1, X3, X5 are connected in series between a first port and a second port. In FIG. 4, the first and second ports are labeled "In" and "Out", respectively. However, the filter 400 is symmetrical and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 400 maybe formed on a single plate 430 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as the rectangle 435). In this example, an IDT of each resonator is disposed over a respective cavity. In other filters, the IDTs of two or more resonators may be disposed over a common cavity. Resonators may also be cascaded into multiple IDTs which may be formed on multiple cavities.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators are above the passband, and the resonance frequencies of the shunt resonators are below the passband.

A band-pass filter for use in a communications device, such as a cellular telephone, must meet a variety of requirements. First, a band-pass filter, by definition, must pass, or transmit with acceptable loss, a defined pass-band. Typically, a band-pass filter for use in a communications device must also stop, or substantially attenuate, one or more stop band(s). For example, a band n79 band-pass filter is typically required to pass the n79 frequency band from 4400 MHz to 5000 MHz and to stop the 5 GHz WiFi™ band and/or the n77 band from 3300 MHz to 4200 MHz. To meet these requirements, a filter using a ladder circuit would require series resonators with anti-resonance frequencies about or above 5100 MHz, and shunt resonators with resonance frequencies about or below 4300 MHz.

Figure 5:
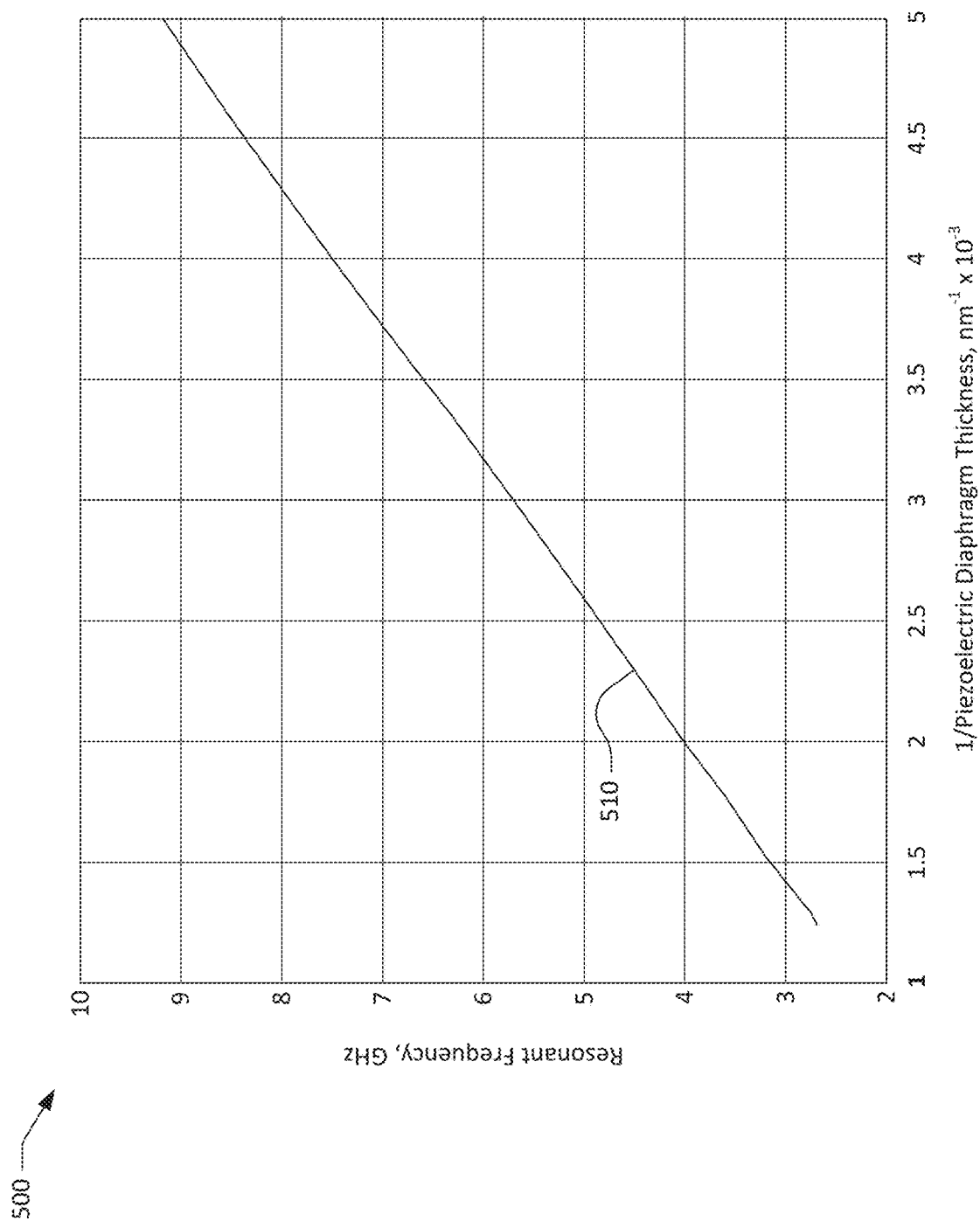
FIG. 5 is a graph showing the relationship between piezoelectric diaphragm thickness and resonance frequency of an XBAR.

The resonance and anti-resonance frequencies of an XBAR are strongly dependent on the thickness ts of the piezoelectric membrane (115 in FIG. 1). FIG. 5 is a graph 500 of resonance frequency of an XBAR versus piezoelectric diaphragm thickness. In this example, the piezoelectric diaphragm is z-cut lithium niobate. The solid curve 510 is plot of resonance frequency as function of the inverse of the piezoelectric plate thickness for XBARs with IDT pitch equal to 3 microns. This plot is based on results of simulations of XBARs using finite element methods. The resonance frequency is roughly proportional to the inverse of the piezoelectric plate thickness.

Figure 6:
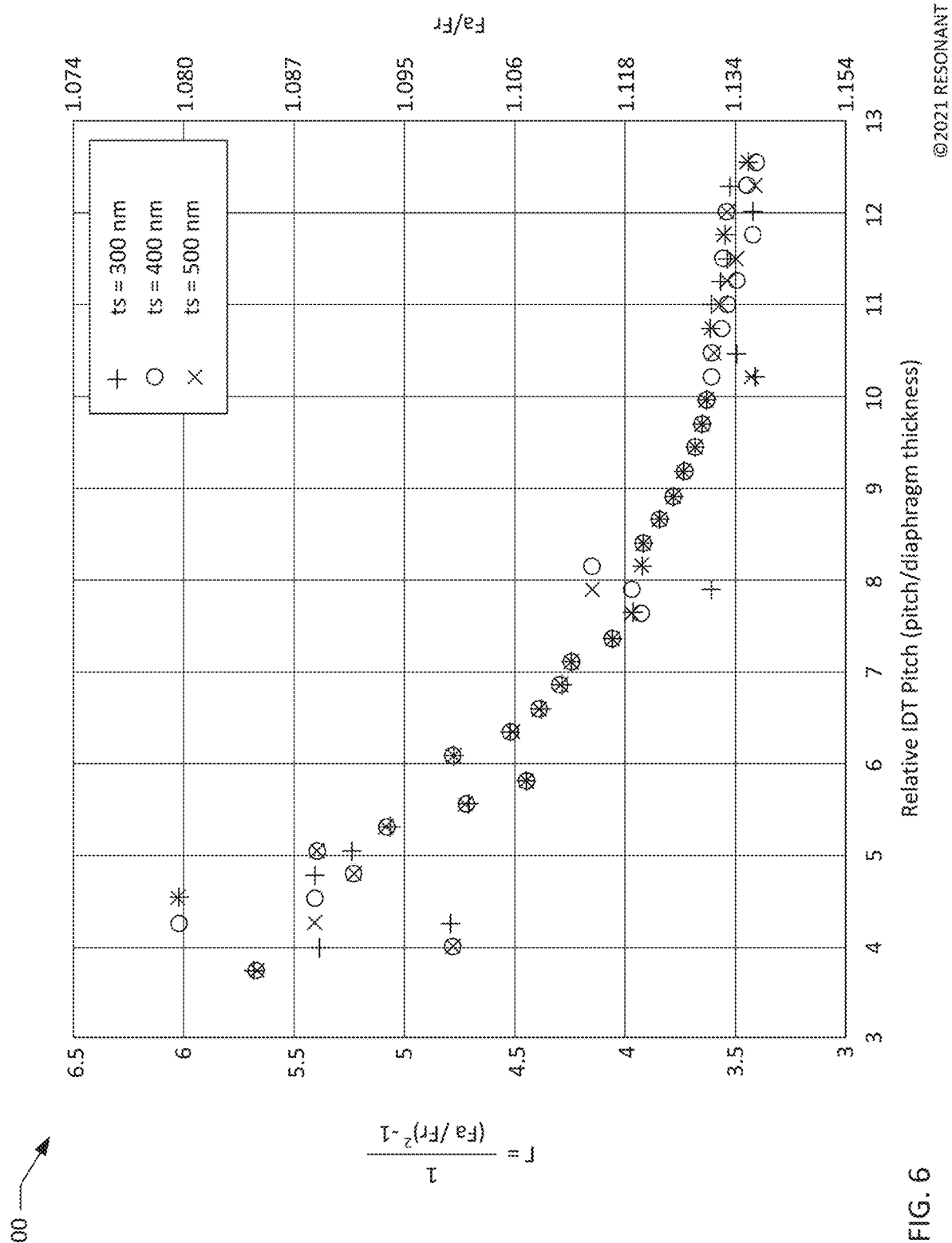
FIG. 6 is a plot showing the relationship between coupling factor Gamma (Γ) and IDT pitch for an XBAR.

The resonance and anti-resonance frequencies of an XBAR are also dependent on the pitch (dimension p in FIG. 1) of the IDT. Further, the electromechanical coupling of an XBAR, which determines the separation between the resonance and anti-resonance frequencies, is dependent on the pitch. FIG. 6 is a graph of gamma (Γ) as a function of normalized pitch, which is to say IDT pitch p divided by diaphragm thickness ts. Gamma is a metric defined by the equation:

$$\Gamma = \frac{1}{(Fa/Fr)^2 - 1}$$

where Fa is the antiresonance frequency and Fr is the resonance frequency. Large values for gamma correspond to smaller separation between the resonance and anti-resonance frequencies. Low values of gamma indicate strong coupling which is good for wideband ladder filters.

In this example, the piezoelectric diaphragm is z-cut lithium niobate, and data is presented for diaphragm thicknesses of 300 nm, 400 nm, and 500 nm. In all cases the IDT is aluminum with a thickness of 25% of the diaphragm thickness, the duty factor (i.e. the ratio of the width w to the pitch p) of the IDT fingers is 0.14, and there are no dielectric layers. The "+" symbols, circles, and "x" symbols represent diaphragm thicknesses of 300 nm, 400 nm, and 500 nm, respectively. Outlier data points, such as those for relative IDT pitch about 4.5 and about 8, are caused by spurious modes interacting with the primary acoustic mode and altering the apparent gamma. The relationship between gamma and IDT pitch is relatively independent of diaphragm thickness, and roughly asymptotic to Γ=3.5 as the relative pitch is increased.

Another typical requirement on a band-pass filter for use in a communications device is the input and output impedances of the filter have to match, at least over the pass-band of the filter, the impedances of other elements of the communications device to which the filter is connected (e.g. a transmitter, receiver, and/or antenna) for maximum power transfer. Commonly, the input and output impedances of a band-pass filter are required to match a 50-ohm impedance within a tolerance that may be expressed, for example, as a maximum return loss or a maximum voltage standing wave ratio. When necessary, an impedance matching network comprising one or more reactive components can be used at the input and/or output of a band-pass filter. Such impedance matching networks add to the complexity, cost, and insertion loss of the filter and are thus undesirable. To match, without additional impedance matching components, a 50-Ohm impedance at a frequency of 5 GHz, the capacitances of at least the shunt resonators in the band-pass filter need to be in a range of about 0.5 picofarads (pF) to about 1.5 picofarads.

Figure 7:
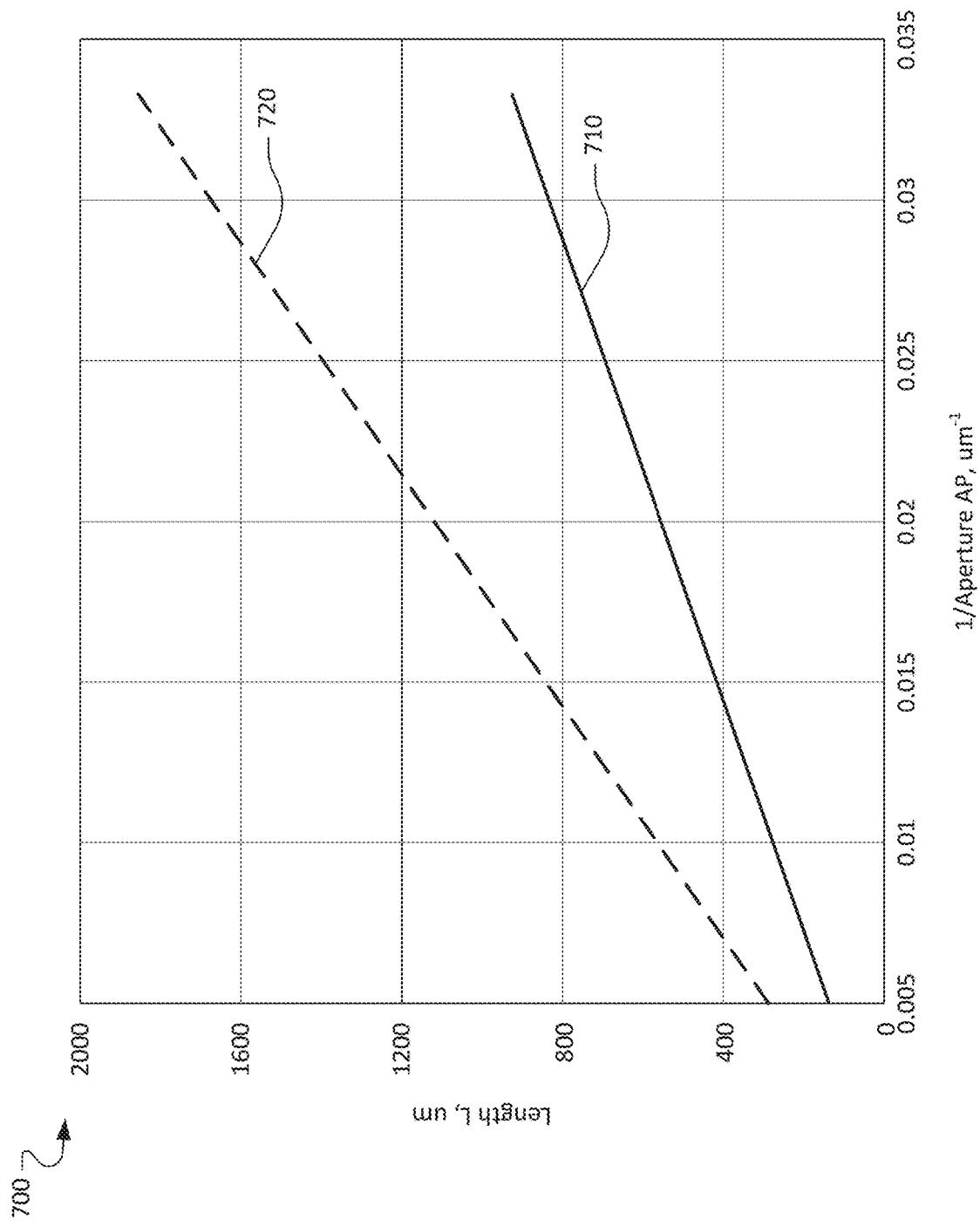
FIG. 7 is a graph showing the dimensions of XBAR resonators with capacitance equal to one picofarad.

FIG. 7 is a graph showing the area and dimensions of XBAR resonators with capacitance equal to one picofarad.

The solid line 710 is a plot of the IDT length required provide a capacitance of 1 pF as a function of the inverse of the IDT aperture when the IDT pitch is 3 microns. The dashed line 720 is a plot of the IDT length required provide a capacitance of 1 pF as a function of the inverse of the IDT aperture when the IDT pitch is 5 microns. The data plotted in FIG. 7 is specific to XBAR devices with lithium niobate diaphragm thickness of 400 nm.

For any aperture, the IDT length required to provide a desired capacitance is greater for an IDT pitch of 5 microns than for an IDT pitch of 3 microns. The required IDT length is roughly proportional to the change in IDT pitch. The design of a filter using XBARs is a compromise between somewhat conflicting objectives. As shown in FIG. 6, a larger IDT pitch may be preferred to reduce gamma and maximize the separation between the anti-resonance and resonance frequencies. As can be understood from FIG. 7, smaller IDT pitch is preferred to minimize IDT area. A reasonable compromise between these objectives is $6 \leq p/ts \leq 12.5$. Setting the IDT pitch p equal to or greater than six times the diaphragm thickness ts provides Fa/Fr greater than 1.1. Setting the maximum IDT pitch p to 12.5 times the diaphragm thickness ts is reasonable since Fa/Fr does not increase appreciably for higher values of relative pitch.

As will be discussed is greater detail subsequently, the metal fingers of the IDTs provide the primary mechanism for removing heat from an XBAR resonator. Increasing the aperture of a resonator increases the length and the electrical and thermal resistance of each IDT finger. Further, for a given IDT capacitance, increasing the aperture reduces the number of fingers required in the IDT, which, in turn, proportionally increases the RF current flowing in each finger. All of these effects argue for using the smallest possible aperture in resonators for high-power filters.

Conversely, several factors argue for using a large aperture. First, the total area of an XBAR resonator includes the area of the IDT and the area of the bus bars. The area of the bus bars is generally proportional to the length of the IDT. For very small apertures, the area of the IDT bus bars may be larger than the area occupied by the interleaved IDT fingers. Further, some electrical and acoustic energy may be lost at the ends of the IDT fingers. These loss effects become more significant as IDT aperture is reduced and the total number of fingers is increased. These losses may be evident as a reduction in resonator Q-factor, particularly at the anti-resonance frequency, as IDT aperture is reduced.

As a compromise between conflicting objectives, resonators apertures will typically fall in the range from 20 μm and 60 μm.

Figure 8:
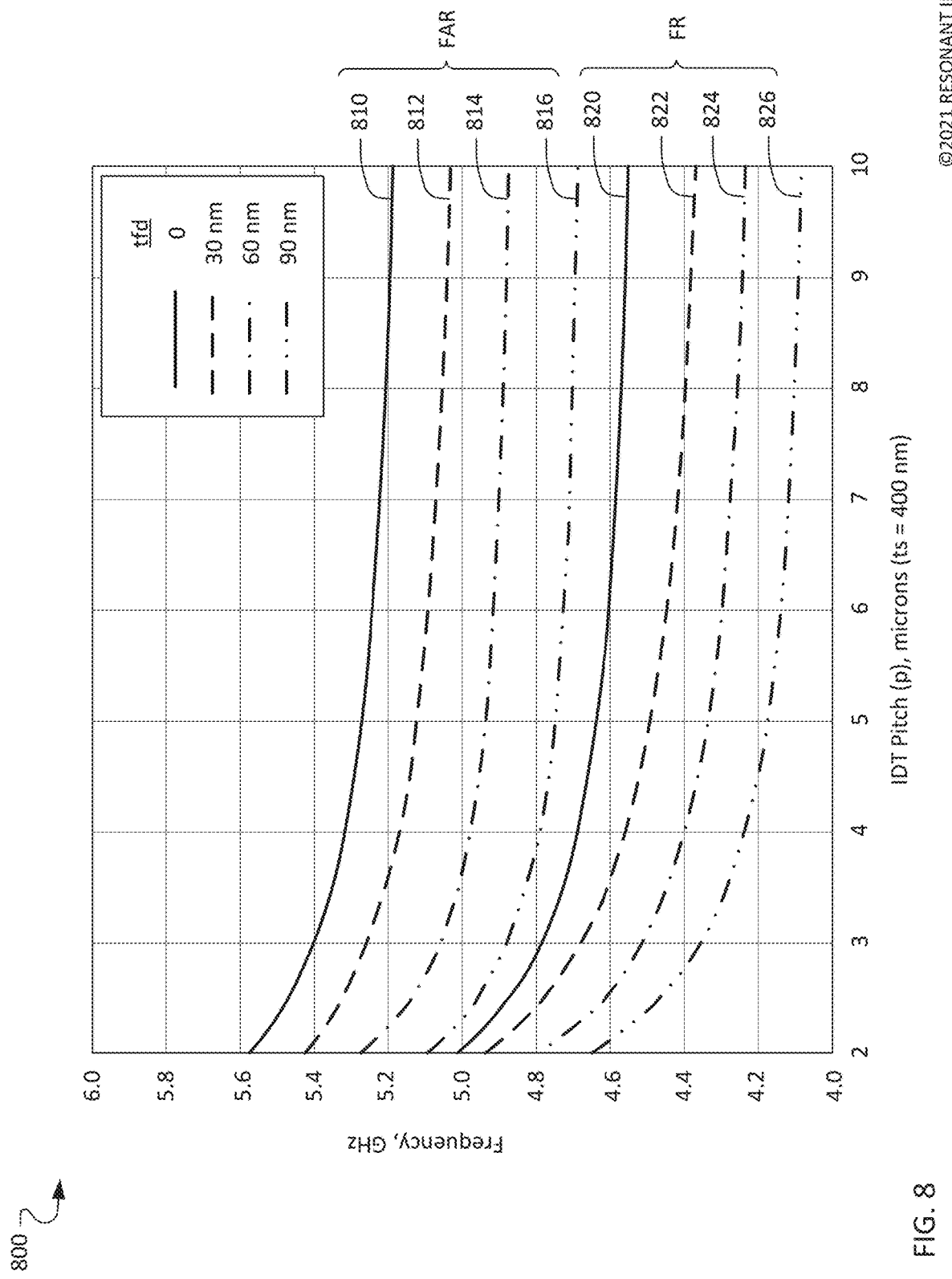
FIG. 8 is a graph showing the relationship between IDT finger pitch and resonance and anti-resonance frequencies of an XBAR, with dielectric layer thickness as a parameter.

The resonance and anti-resonance frequencies of an XBAR are also dependent on the thickness (dimension tfd in FIG. 2) of the front-side dielectric layer applied between (and optionally over) the fingers of the IDT. FIG. 8 is a graph 800 of anti-resonant frequency and resonant frequency as a function of IDT finger pitch p for XBAR resonators with z-cut lithium niobate piezoelectric plate thickness ts=400 nm, with front-side dielectric layer thickness tfd as a parameter. The solid lines 810 and 820 are plots of the anti-resonance and resonance frequencies, respectively, as functions of IDT pitch for tfd=0. The dashed lines 812 and 822 are plots of the anti-resonance and resonance frequencies, respectively, as functions of IDT pitch for tfd=30 nm. The dash-dot lines 814 and 824 are plots of the anti-resonance and resonance frequencies, respectively, as functions of IDT pitch for tfd=60 nm. The dash-dot-dot lines 816 and 826 are plots of the anti-resonance and resonance frequencies, respectively, as functions of IDT pitch for tfd=90 nm. The frequency shifts are approximately linear functions of tfd.

In FIG. 8, the difference between the resonance and anti-resonance frequencies is 600 to 650 MHz for any particular values for front-side dielectric layer thickness and IDT pitch. This difference is large compared to that of older acoustic filter technologies, such as surface acoustic wave filters. However, 650 MHz is not sufficient for very wide band filters such as band-pass filters needed for bands n77 and n79. As described in application Ser. No. 16/230,443, the front-side dielectric layer over shunt resonators may be thicker than the front-side dielectric layer over series resonators to increase the frequency difference between the resonant frequencies of the shunt resonators and the anti-resonance frequencies of the series resonators.

Communications devices operating in time-domain duplex (TDD) bands transmit and receive in the same frequency band. Both the transmit and receive signal paths pass through a common bandpass filter connected between an antenna and a transceiver. Communications devices operating in frequency-domain duplex (FDD) bands transmit and receive in different frequency bands. The transmit and receive signal paths pass through separate transmit and receive bandpass filters connected between an antenna and the transceiver. Filters for use in TDD bands or filters for use as transmit filters in FDD bands can be subjected to radio frequency input power levels of 30 dBm or greater and must avoid damage under power.

The insertions loss of acoustic wave bandpass filters is usually not more than a few dB. Some portion of this lost power is return loss reflected back to the power source; the rest of the lost power is dissipated in the filter. Typical band-pass filters for LTE bands have surface areas of 1.0 to 2.0 square millimeters. Although the total power dissipation in a filter may be small, the power density can be high given the small surface area. Further, the primary loss mechanisms in an acoustic filter are resistive losses in the conductor patterns and acoustic losses in the IDT fingers and piezoelectric material. Thus the power dissipation in an acoustic filter is concentrated in the acoustic resonators. To prevent excessive temperature increase in the acoustic resonators, the heat due to the power dissipation must be conducted away from the resonators through the filter package to the environment external to the filter.

In traditional acoustic filters, such as surface acoustic wave (SAW) filters and bulk acoustic wave (BAW) filters, the heat generated by power dissipation in the acoustic resonators is efficiently conducted through the filter substrate and the metal electrode patterns to the package. In an XBAR device, the resonators are disposed on thin piezoelectric membranes that are inefficient heat conductors. The large majority of the heat generated in an XBAR device must be removed from the resonator via the IDT fingers and associated conductor patterns.

To minimize power dissipation and maximize heat removal, the IDT fingers and associated conductors should be formed from a material that has low electrical resistivity and high thermal conductivity. Metals having both low resistivity and high thermal conductivity are listed in the following table:

| Metal | Electrical resistivity ($10^{-6}$ Ω-cm) | Thermal conductivity (W/m-K) |
|---|---|---|
| Silver | 1.55 | 419 |
| Copper | 1.70 | 385 |

| Metal | Electrical resistivity ($10^{-6}$ Ω-cm) | Thermal conductivity (W/m-K) |
|---|---|---|
| Gold | 2.2 | 301 |
| Aluminium | 2.7 | 210 |

Silver offers the lowest resistivity and highest thermal conductivity but is not a viable candidate for IDT conductors due to the lack of processes for deposition and patterning of silver thin films. Appropriate processes are available for copper, gold, and aluminum. Aluminum offers the most mature processes for use in acoustic resonator devices and potentially the lowest cost, but with higher resistivity and reduced thermal conductivity compared to copper and gold. For comparison, the thermal conductivity of lithium niobate is about 4 W/m-K, or about 2% of the thermal conductivity of aluminum. Aluminum also has good acoustic attenuation properties which helps minimize dissipation.

The electric resistance of the IDT fingers can be reduced, and the thermal conductivity of the IDT fingers can be increased, by increasing the cross-sectional area of the fingers to the extent possible. As described in conjunction with FIG. 3, unlike SAW or AlN BAW, for XBAR there is little coupling of the primary acoustic mode to the IDT fingers. Changing the width and/or thickness of the IDT fingers has minimal effect on the primary acoustic mode in an XBAR device. This is a very uncommon situation for an acoustic wave resonator. However, the IDT finger geometry does have a substantial effect on coupling to spurious acoustic modes, such as higher order shear modes and plate modes that travel laterally in the piezoelectric diaphragm.

Given the complex dependence of spurious mode frequency and amplitude on diaphragm thickness ts, IDT metal thickness tm, IDT pitch p and IDT finger width w, the inventors undertook an empirical evaluation, using two-dimensional finite element modeling, of a large number of hypothetical XBAR resonators. For each combination of diaphragm thickness ts, IDT finger thickness tm, and IDT pitch p, the XBAR resonator was simulated for a sequence of IDT finger width w values. A figure of merit (FOM) was calculated for each value if w to estimate the negative impact of spurious modes. The FOM is calculated by integrating the negative impact of spurious modes across a defined frequency range. The FOM and the frequency range depend on the requirements of a particular filter. The frequency range typically includes the passband of the filter and may include one or more stop bands. Spurious modes occurring between the resonance and anti-resonance frequencies of each hypothetical resonator were given a heavier weight in the FOM than spurious modes at frequencies below resonance or above anti-resonance. Hypothetical resonators having a minimized FOM below a threshold value were considered potentially "useable", which is to say probably having sufficiently low spurious modes for use in a filter. Hypothetical resonators having a minimized cost function above the threshold value were considered not useable.

Figure 9:
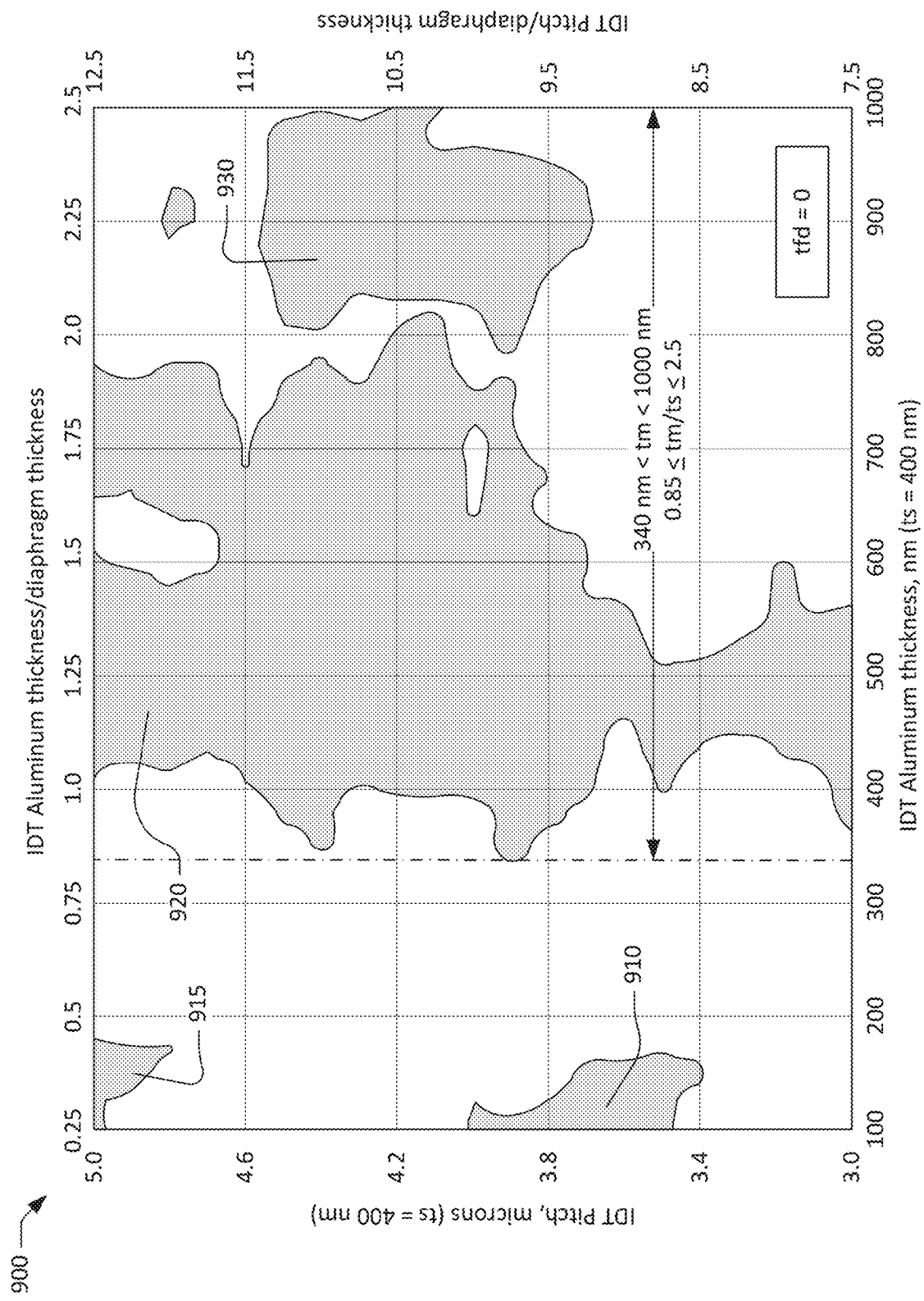
FIG. 9 is a graph identifying preferred combinations of aluminum IDT thickness and IDT pitch for XBARs without a front dielectric layer.

FIG. 9 is a chart 900 showing combinations of IDT pitch and IDT finger thickness that may provide useable resonators. This chart is based on two-dimensional simulations of XBARs with lithium niobate diaphragm thickness ts=400 nm, aluminum conductors, and front-side dielectric thickness tfd=0. XBARs with IDT pitch and thickness within shaded regions 910, 915, 920, 930 are likely to have sufficiently low spurious effects for use in filters. For each combination of IDT pitch and IDT finger thickness, the width of the IDT fingers was selected to minimize the FOM. Usable resonators exist for IDT finger thickness greater than or equal to 340 nm and less than or equal to 1000 nm.

As previously discussed, wide bandwidth filters using XBARs may use a thicker front-side dielectric layer on shunt resonators than on series resonators to lower the resonance frequencies of the shunt resonators with respect to the resonance frequencies of the series resonators. The front-side dielectric layer on shunt resonators may be as much as 150 nm thicker than the front side dielectric on series resonators. For ease of manufacturing, it may be preferable that the same IDT finger thickness be used on both shunt and series resonators.

Figure 10:
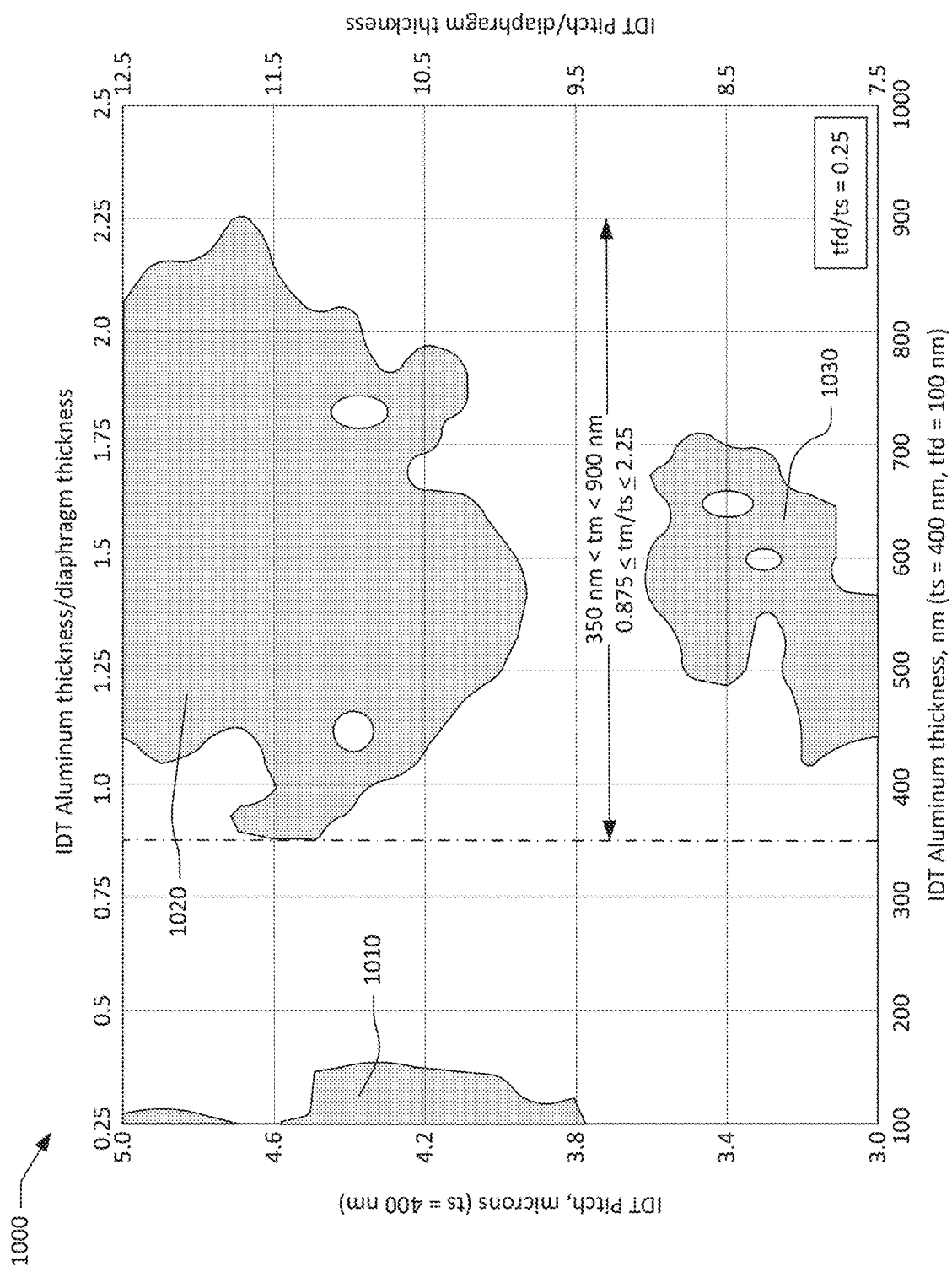
FIG. 10 is a graph identifying preferred combinations of aluminum IDT thickness and IDT pitch for XBARs with front dielectric layer thickness equal to 0.25 times the XBAR diaphragm thickness.

FIG. 10 is another chart 1000 showing combinations of IDT pitch and IDT finger thickness that may provide useable resonators. This chart is based on simulations of XBARs with lithium niobate diaphragm thickness=400 nm, aluminum conductors, and tfd=100 nm. XBARs having IDT pitch and thickness within shaded regions 1010, 1020, 1030 are likely to have sufficiently low spurious effects for use in filters. For each combination of IDT pitch and IDT finger thickness, the width of the IDT fingers was selected to minimize the FOM. Usable resonators exist for IDT finger thickness greater than or equal to 350 nm and less than or equal to 900 nm.

Assuming that a filter is designed with no front-side dielectric layer on series resonators and 100 nm of front-side dielectric on shunt resonators, FIG. 9 and FIG. 10 jointly define the combinations of metal thickness and IDT pitch that result in useable resonators. Specifically, FIG. 9 defines useable combinations of metal thickness and IDT pitch for series resonators and FIG. 10 defines useable combinations of metal thickness and IDT for shunt resonators. Since only a single metal thickness is desirable for ease of manufacturing, the overlap between the ranges defined in FIG. 9 and FIG. 10 defines the range of metal thicknesses for filter using a front-side dielectric to shift the resonance frequency of shunt resonator. Comparing FIG. 9 and FIG. 10, IDT aluminum thickness between 350 nm and 900 nm (350 nm≤tm≤900 nm) provides at least one useable value of pitch for both series and shunt resonators.

Figure 11:
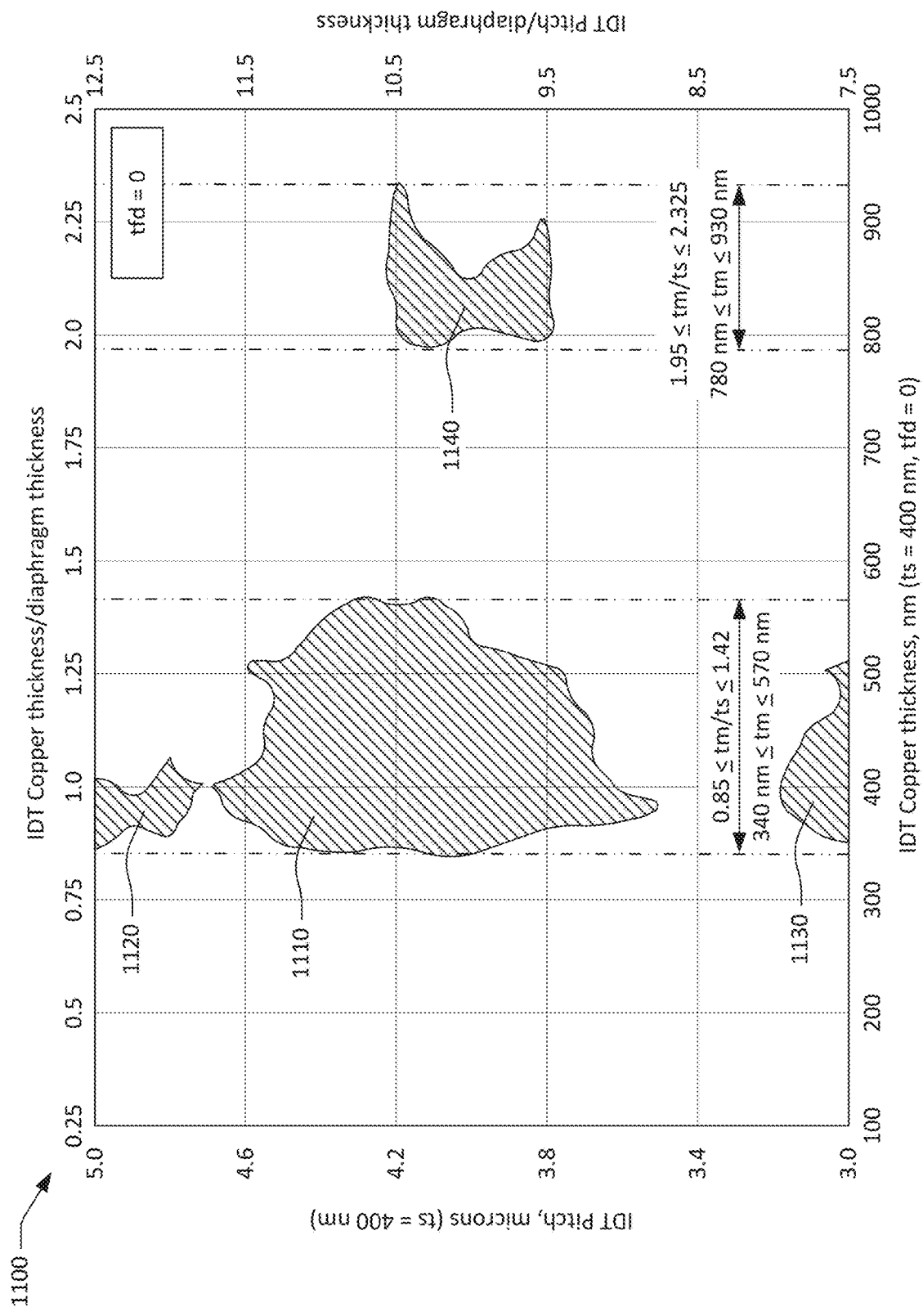
FIG. 11 is a graph identifying preferred combinations of copper IDT thickness and IDT pitch for XBARs without a front dielectric layer.

FIG. 11 is another chart 1100 showing combinations of IDT pitch and IDT finger thickness that may provide useable resonators. The chart is comparable to FIG. 9 with copper, rather than aluminum, conductors. FIG. 11 is based on simulations of XBARs with lithium niobate diaphragm thickness=400 nm, copper conductors, and tfd=0. XBARs having IDT pitch and finger width within shaded regions 1110, 1120, 1130, 1140 are likely to have sufficiently low spurious effects for use in filters. For each combination of IDT pitch and IDT finger thickness, the width of the IDT fingers is selected to minimize the FOM. Usable resonators exist for IDT finger thickness greater than or equal to 340 nm and less than or equal to 570 nm, and for IDT finger thickness greater than or equal to 780 nm and less than or equal to 930 nm.

Figure 12:
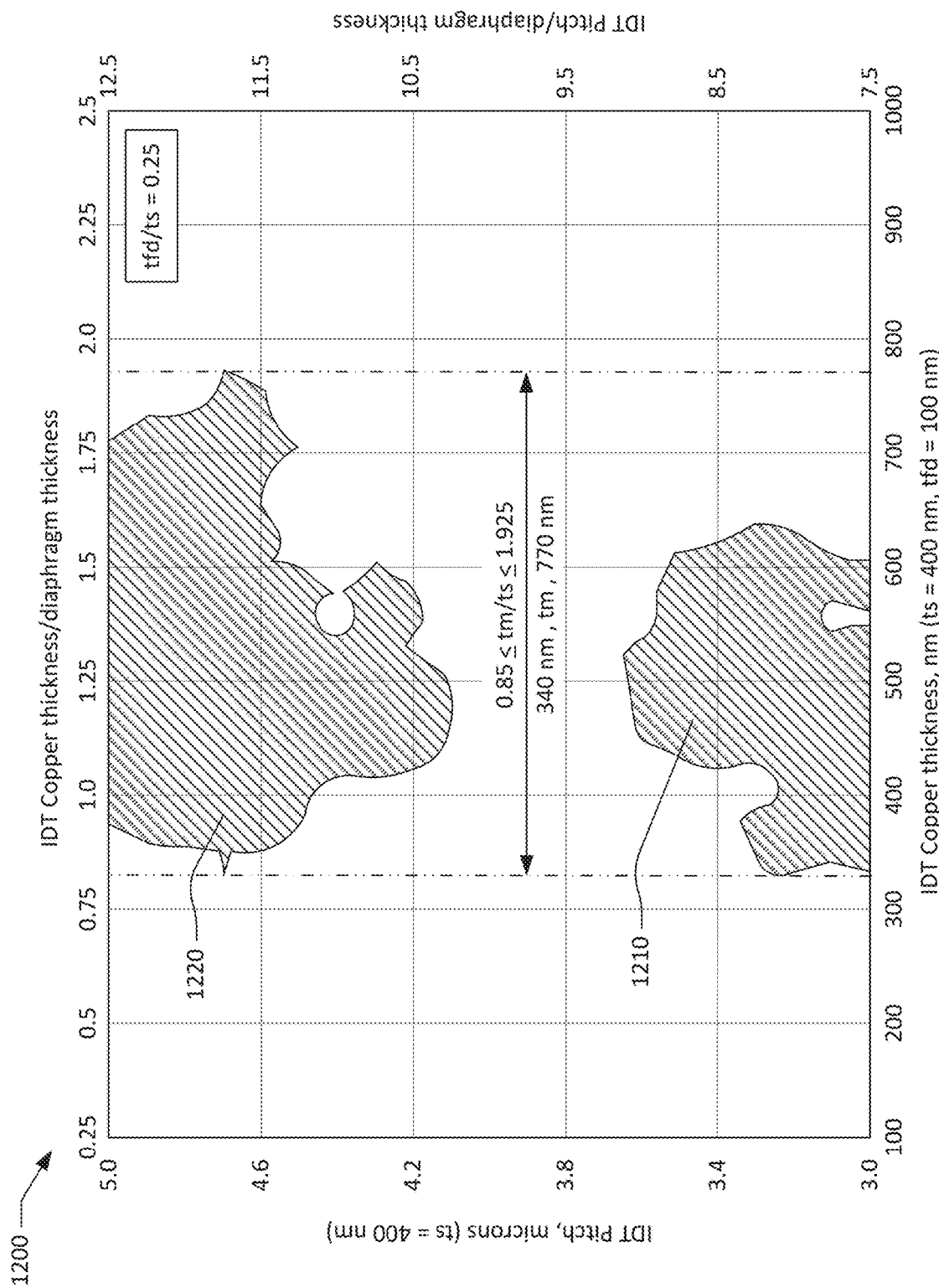
FIG. 12 is a graph identifying preferred combinations of copper IDT thickness and IDT pitch for XBARs with front dielectric layer thickness equal to 0.25 times the XBAR diaphragm thickness.

FIG. 12 is another chart 1200 showing combinations of IDT pitch and IDT finger thickness that may provide usable resonators. This chart is based on simulations of XBARs with lithium niobate diaphragm thickness=400 nm, copper conductors, and tfd=100 nm. XBARs having IDT pitch and finger thickness within shaded regions 1210, 1220 are likely to have sufficiently low spurious effects for use in filters. For each combination of IDT pitch and IDT finger thickness, the width of the IDT fingers is selected to minimize the cost function. IDT finger thickness greater than or equal to 340 nm and less than or equal to 770 nm Assuming that a filter is designed with no front-side dielectric layer on series resonators and 100 nm of front-side dielectric on shunt resonators, FIG. 11 and FIG. 12 jointly define the combinations of metal thickness and IDT pitch that result in useable resonators. Specifically, FIG. 11 defines useful combinations of metal thickness and IDT pitch for series resonators and FIG. 12 defines useful combinations of metal thickness and IDT pitch for shunt resonators. Since only a single metal thickness is desirable for ease of manufacturing, the overlap between the ranges defined in FIG. 11 and FIG. 12 defines the range of metal thicknesses for filter using a front-side dielectric to shift the resonance frequency of shunt resonator. Comparing FIG. 11 and FIG. 12, IDT copper thickness between 340 nm and 570 nm provides at least one useable value of pitch for series and shunt resonators.

Charts similar to FIG. 9, FIG. 10, FIG. 11, and FIG. 12, can be prepared for other values of front-side dielectric thickness, and other conductor materials such as Gold.

Figure 13:
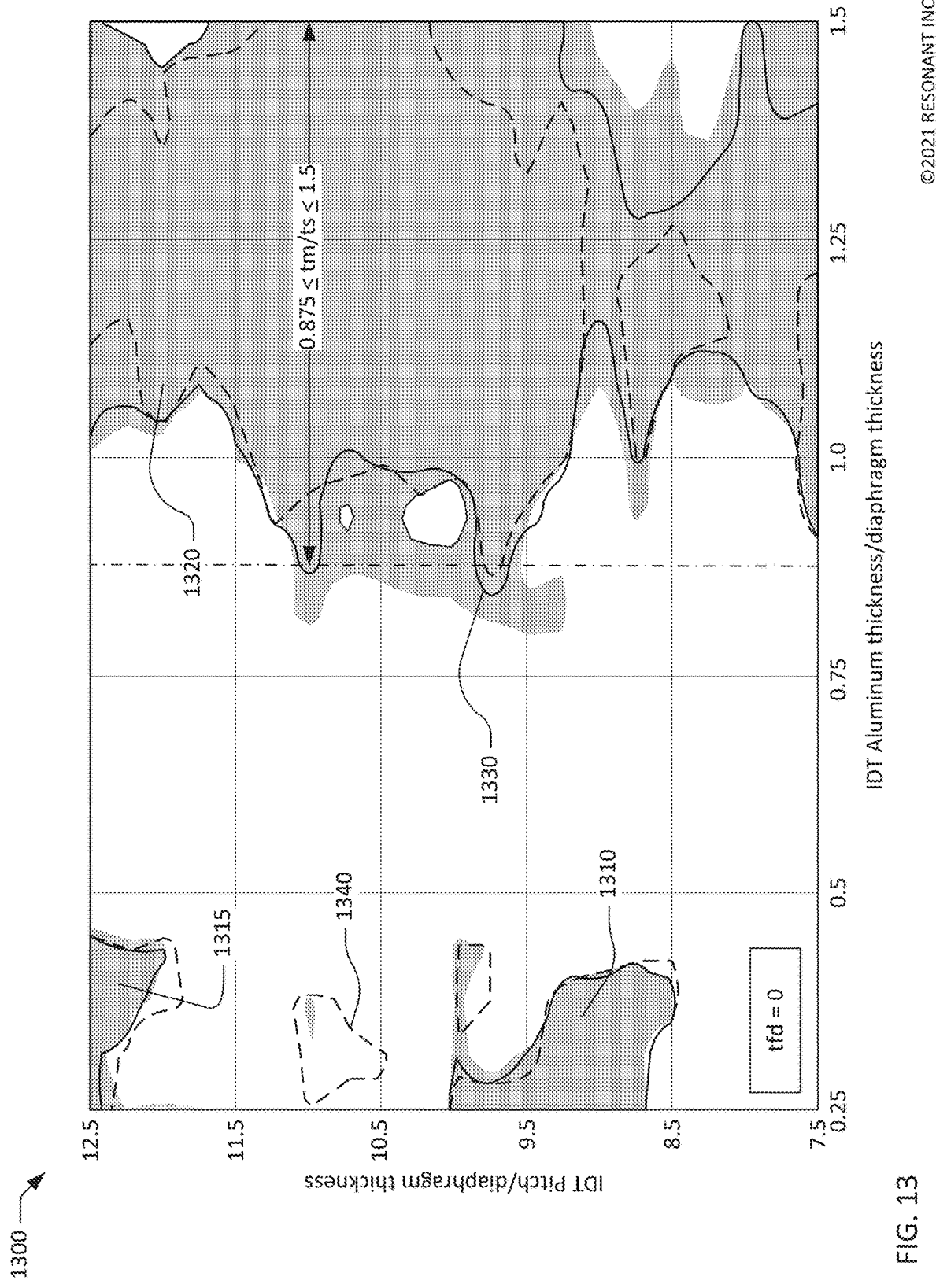
FIG. 13 is a graph identifying preferred combinations of aluminum IDT thickness and IDT pitch for XBARs without a front dielectric layer for diaphragm thicknesses of 300 nm, 400 nm, and 500 nm.

FIG. 13 is a chart 1300 showing combinations of IDT pitch and IDT finger thickness that may provide useable resonators on different thickness diaphragms. The shaded regions 1310, 1315, 1320 define useable combinations of IDT pitch and aluminum IDT thickness for a diaphragm thickness of 500 nm. The areas enclosed by solid lines, such as line 1330, define useable combinations of IDT pitch and aluminum IDT thickness for a diaphragm thickness of 400 nm. The solid lines are the boundaries of the shaded areas 910, 915, and 920 of FIG. 9. The areas enclosed by dashed lines, such as line 1340, define useable combinations of IDT pitch and aluminum IDT thickness for a diaphragm thickness of 300 nm.

Although the combinations of IDT thickness and pitch that result in useable resonators on 500 nm diaphragms (shaded regions 1310, 1315, 1320), 400 nm diaphragms (regions enclosed by solid lines), and 300 nm diaphragms (regions enclosed by dashed lines) are not identical, the same general trends are evident. For diaphragm thicknesses of 300, 400, and 500 nm, useable resonators may be made with IDT metal thickness less than about 0.375 times the diaphragm thickness. Further, for diaphragm thicknesses of 300, 400, and 500 nm, useable resonators may be made with IDT aluminum thickness greater than about 0.85 times the diaphragm thickness and up to at least 1.5 times the diaphragm thickness. Although not shown in FIG. 13, it is believed that the conclusions drawn from FIG. 9 to FIG. 12 can be scaled with diaphragm thickness. For aluminum IDT conductors, the range of IDT thickness that will provide useful resonators is given by the formula $0.85 \leq tm/ts \leq 2.5$. For filters using a front-side dielectric to shift the resonance frequency of shunt resonators, the range of aluminum IDT thickness that will provide useful resonators is given by the formula $0.875 \leq tm/ts \leq 2.25$. For copper IDT conductors, the range of IDT thickness that will provide useful resonators is given by the formula $0.85 \leq tm/ts \leq 1.42$ or the formula $1.95 \leq tm/ts \leq 2.325$. For filters using a front-side dielectric to shift the resonance frequency of shunt resonators, the range of aluminum IDT thickness that will provide useful resonators is given by the formula $0.85 \leq tm/ts \leq 1.42$.

Experimental results indicate that thin IDT fingers (i.e. $tm/ts<0.375$) cannot adequately transport heat out of the resonator area and IDTs with such thin IDT fingers are unsuitable for high power applications. Thick IDT conductors (i.e. $tm/ts>0.85$) provide greatly improved heat transport. Experimental results indicate that filters using XBAR resonators with 500 nm aluminum IDT fingers and 400 nm diaphragm thickness (tm/ts=1.25) can tolerate 31 dBm CW (continuous wave) RF power input at the upper edge of the filter passband (commonly the frequency with the highest power dissipation within a filter passband).

Figure 14:
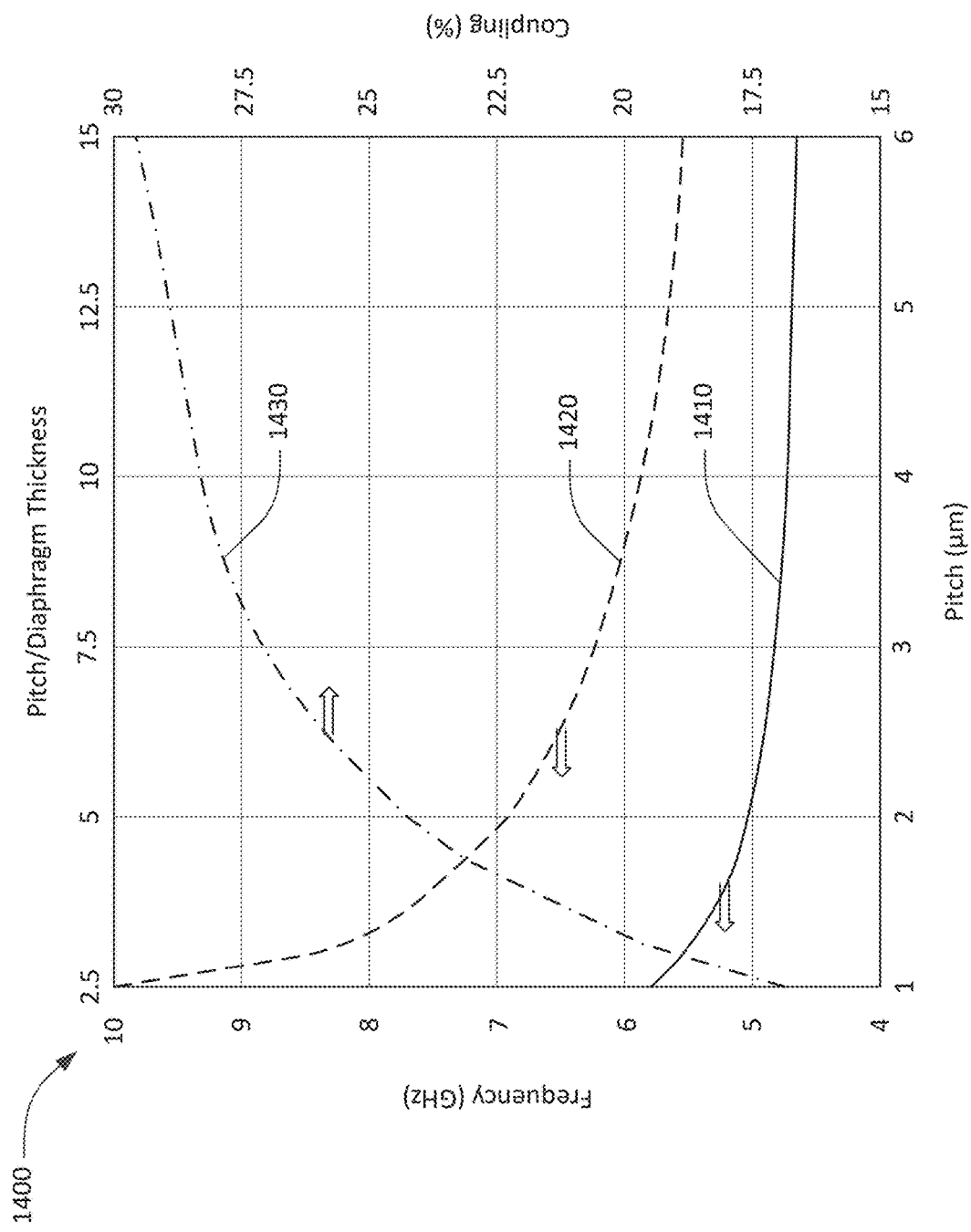
FIG. 14 is a graph of the frequency and coupling of a primary shear mode and the frequency of an A1-3 spurious mode as functions of interdigital transducer (IDT) pitch.

FIG. 14 is a graph 1400 of relationships between XBAR performance and IDT pitch. The solid curve 1410 is a plot of the resonance frequency of the XBAR shear primary mode as a function of IDT pitch for an XBAR with a z-cut lithium niobate diaphragm 400 nm thick and aluminum conductors 100 nm thick. The solid curve 1410 is read against the left vertical axis of the graph. The diaphragm thickness is the dominant parameter that determines resonance frequency of an XBAR. The resonance frequency has a smaller dependence on IDT pitch. As shown in FIG. 14, varying the IDT pitch from 1 μm to 6 μm results in reduction in resonance frequency by about 25%.

The dashed curve 1420 is a plot of the resonance frequency of the A1-3 spurious mode of the same XBAR as a function of IDT pitch. The dashed curve 1420 is read against the left vertical axis of the graph. Diaphragm thickness is also the dominant parameter that determines resonance frequency of A1-3 mode. However, the resonance frequency of the A1-3 mode has a much larger dependence on IDT pitch compared to the shear primary mode. Varying the JDT pitch from 1 μm to 6 μm results in reduction in resonance frequency of the A1-4 mode by about 85%. The frequencies of other spurious modes (i.e. spurious modes 640 in FIG. 6) are also very dependent on IDT pitch.

The dot-dash curve 1430 is a plot of electromechanical coupling of the shear primary mode as a function of IDT pitch. The dot-dash curve 1430 is read against the right vertical axis of the graph. The relationship between coupling and pitch is nonlinear. Larger IDT pitch results in higher coupling and coupling decreases rapidly for pitch values less than 3 μm. However, 17% coupling is available at pitch value of 1 μm, which is still sufficient for many filter applications.

Figure 15:
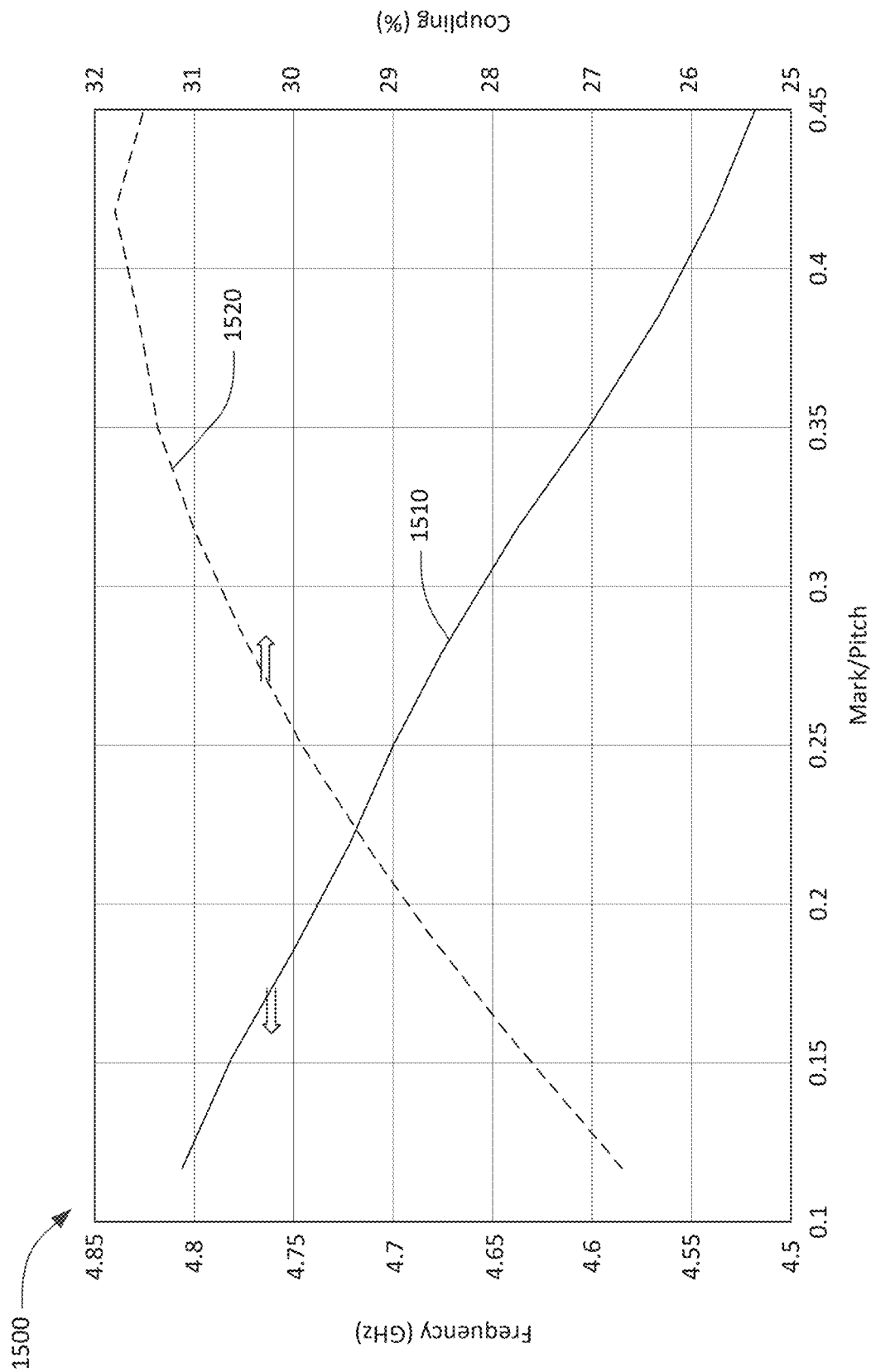
FIG. 15 is a graph of the frequency and coupling of the primary shear mode as functions of IDT mark-to-pitch ratio.

FIG. 15 is a graph 1500 of relationships between XBAR performance and IDT mark-to-pitch ratio (mark/pitch). The solid curve 1510 is a plot of the resonance frequency of the XBAR shear primary mode as a function of IDT mark/pitch for an XBAR with a z-cut lithium niobate diaphragm 400 nm thick. The solid curve 1510 is read against the left vertical axis of the graph. The IDT conductors are aluminum 100 nm thick and the IDT pitch is 3 μm. The diaphragm thickness is the dominant parameter that determines resonance frequency of an XBAR. The resonance frequency has a smaller dependence on IDT mark/pitch. As shown in FIG. 15, varying the IDT mark/pitch from 0.15 to 0.45 μm results in reduction in resonance frequency by about 6%.

The dashed curve 1520 is a plot of electromechanical coupling of the shear primary mode as a function of IDT mark/pitch. The dashed curve 1520 is read against the right vertical axis of the graph. The relationship between coupling and mark/pitch is nonlinear. Maximum coupling occurs for IDT mark/pitch between 0.40 and 0.45. Coupling decreases with decreasing mark/pitch. However, 27% coupling is available at mark/pitch value of about 0.12, which is sufficient for most filter applications.

FIG. 14 and FIG. 15 illustrate the complexity of selecting the pitch and mark of XBAR IDTs within a filter to provide a desired resonance frequency and electromechanical coupling of each XBAR while trying to place spurious modes at frequencies that do not degrade the filter performance. In particular, since the resonance frequency of the shear primary acoustic mode varies with both IDT pitch and IDT mark, the pitch and mark must be selected in combination to set the resonance frequency of an XBAR to a predetermined target frequency. Since the same resonance frequency may be achieved with different IDT pitch and mark combinations, a filter designer has some freedom to select the pitch and mark to control the frequencies of spurious modes.

Figure 16:
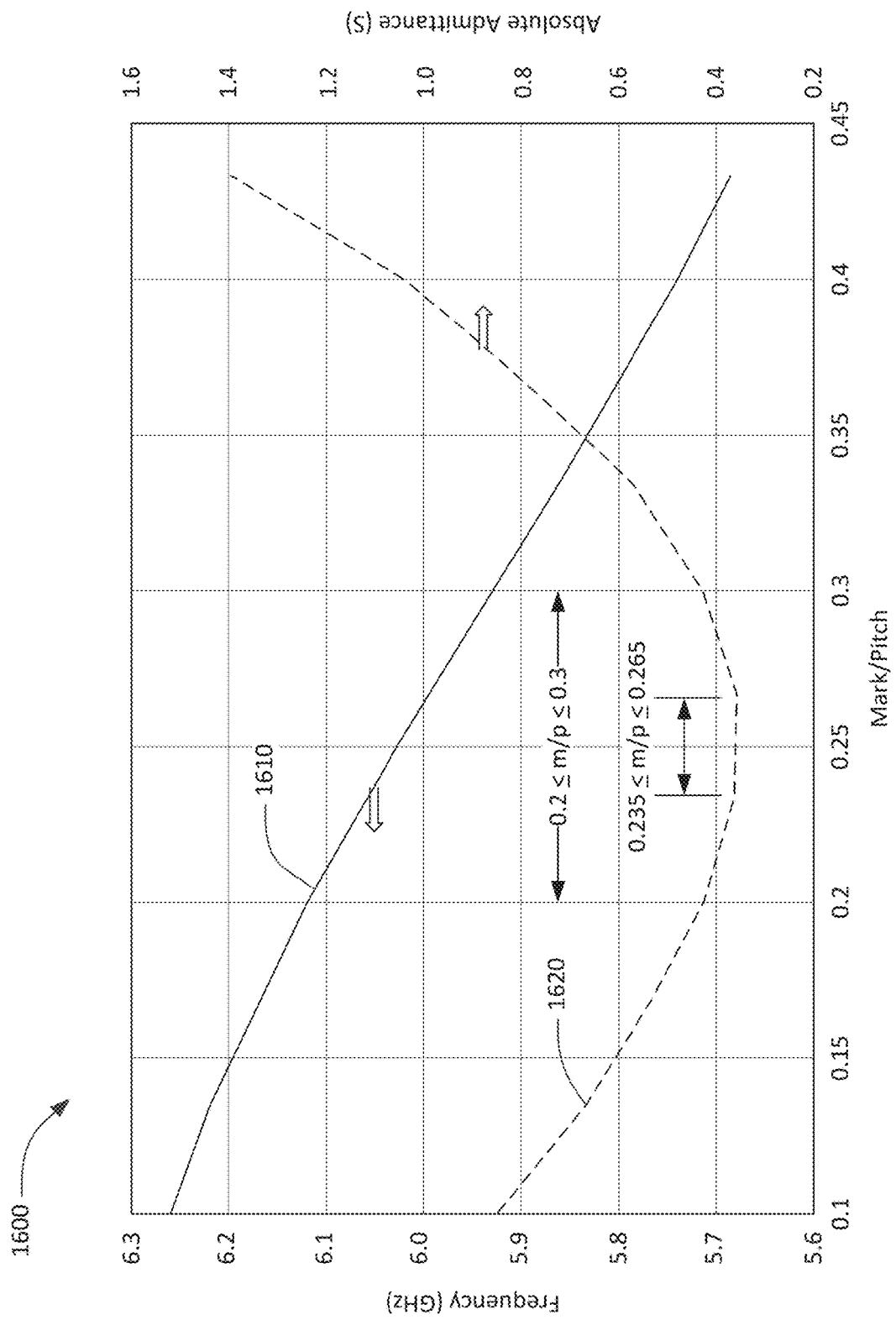
FIG. 16 is a graph of absolute admittance and frequency of the A1-3 spurious mode as functions of IDT mark-to-pitch ratio.

FIG. 16 is a graph 1600 of relationships between the A1-3 spurious mode and IDT mark-to-pitch ratio (mark/pitch). The solid curve 1610 is a plot of the resonance frequency of the A1-3 mode as a function of IDT mark/pitch for an XBAR with a z-cut lithium niobate diaphragm 400 nm thick. The solid curve 1610 is read against the left vertical axis of the graph. The IDT conductors are aluminum 100 nm thick and the IDT pitch is 3 µm. The A1-3 mode resonance frequency depends on IDT mark/pitch. As shown in FIG. 9, varying the IDT mark/pitch from 0.15 to 0.45 µm results in reduction in resonance frequency by about 10%.

The dashed curve 1620 is a plot of the absolute admittance of the A1-3 mode as a function of IDT mark/pitch. The dashed curve 1620 is read against the right vertical axis of the graph. The relationship between admittance and mark/pitch is nonlinear. Minimum admittance occurs for IDT mark/pitch from 0.235 to 0.265. The admittance increases for mark/pitch values outside of this range but is still small for a mark/pitch range from 0.2 to 0.3.

The resonance and anti-resonance frequencies of the primary acoustic mode of an XBAR is determined by multiple factors including the type, crystallographic orientation, and thickness of the piezoelectric slab and the pitch and mark of the IDT fingers. In particular, different combinations of mark and pitch on the same piezoelectric diaphragm can excite the same primary acoustic mode. In this context, two acoustic modes are considered to be the same if the two acoustic modes have the same direction of acoustic energy flow and the same resonance and/or anti-resonance frequencies.

A radio frequency or microwave signal applied across the IDT of an XBAR may also excite undesired spurious acoustics modes. The frequency and strength of such spurious acoustic modes also depend on multiple factors including the pitch and mark of the IDT fingers. However, two or more mark/pitch combinations that excite the same primary acoustic mode do not necessarily excite the same spurious modes. When the pitch and mark within an IDT is changed between two or more mark/pitch combinations that produce the same primary acoustic mode but different spurious modes, the different spurious modes will not add constructively over the area of the IDT.

The XBAR primary acoustic mode is mostly bulk in nature, which can result in weak frequency dependence on mark and pitch. Thus, chirping (or variance) of mark, or mark and pitch, in the IDT of the XBAR can potentially suppress undesirable spurious modes that depend upon mark and/or pitch, such as metal and propagating modes, with only slight broadening of the primary mode resonance.

Figure 17:
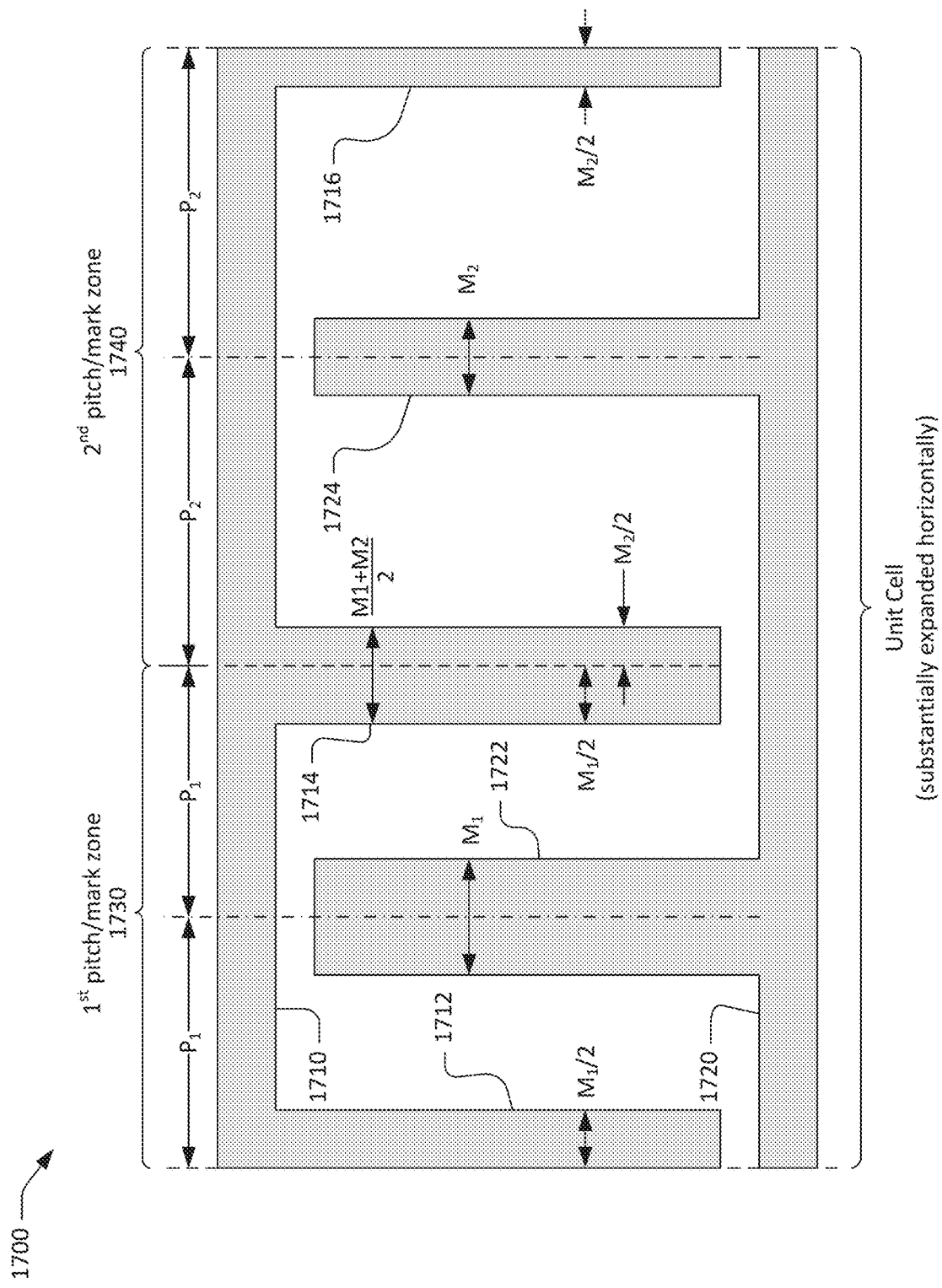
FIG. 17 is an expanded schematic plan view of a unit cell for an interdigital transducer (IDT) with pitch and mark varied along the length of the IDT.

FIG. 17 is an expanded schematic plan view of a unit cell 1700 for an IDT where the pitch and mark vary along the length of the IDT. The scale of the plan view has been stretched or expanded horizontally for ease of presentation of the various dimensions. In the unit cell 1700, $P_1$ is a first pitch value, $P_2$ is a second pitch value, $M_1$ is a first mark value and $M_2$ is a second mark value. The differences between $P_1$ and $P_2$ and between $M_1$ and $M_2$ are exaggerated for ease of visualization. An IDT having a pitch $P_1$ and a mark $M_1$ would excite a primary acoustic mode with particular resonance and antiresonance frequencies. An IDT having a pitch $P_2$ and a mark $M_2$ would excite the same primary acoustic mode, which is to say a primary acoustic mode with the same resonance and/or antiresonance frequencies.

The unit cell 1700 includes a first set of IDT fingers 1712, 1714, 1716 extending from an upper busbar 1710, and a second set of IDT fingers 1722, 1724 extending from a lower busbar 1720. In this patent, directional terms such as upper, lower, left, right, vertical, horizontal, etc. refer to direction or position within the drawing being discussed and do not imply any physical position or orientation. The unit cell 1700 is intended to be cascaded in the horizontal direction (as will be described in conjunction with FIG. 18) to form an IDT. The unit cell 1700 only includes portions of the end fingers 1712 and 1716. Other portions of those fingers exist within adjacent unit cells (not shown in FIG. 17).

The unit cell 1700 is divided into a first pitch/mark zone 1730 and a second pitch/mark zone 1740. Within the first pitch/mark zone 1730, the pitch between adjacent fingers is $P_1$ and the mark of the fingers is $M_1$. Within the second pitch/mark zone 1740, the pitch between adjacent fingers is $P_2$ and the mark of the fingers is $M_2$. The mark/pitch combination of the IDT changes between $M_1/P_1$ and $M_2/P_2$ every two fingers. To this end, each finger 1712, 1714, 1716 of first set of IDT fingers extending from the upper busbar 1710 has a uniform width of $(M_1+M_2)/2$, including portions of fingers 1712 and 1716 within adjacent unit cells. Note that the pitch is not measured to the respective centers of the first set of IDT fingers, but to a dashed line that divides each finger in a ratio of $M_1/M_2$. For example, finger 1714 is divided such that the portion of the finger extending left into the $1^{st}$ pitch/mark zone 1730 has a width of $M_1/2$, and the portion of this finger extending right into the $2^{nd}$ pitch/mark zone 1740 has a width of $M_2/2$. The second set of IDT fingers 1722, 1724 extending from the lower busbar 1720 has a center-to-center distance between adjacent fingers equal to $P_1+P_2$. The mark of the second set of IDT fingers 1722, 1724 alternates between $M_1$ (e.g. finger 1722) and $M_2$ (e.g. finger 1724). The net effect is that the unit cell 1700 has two periods of pitch $P_1$ and mark $M_1$ followed by two periods of pitch $P_2$ and mark $M_2$.

Figure 18:
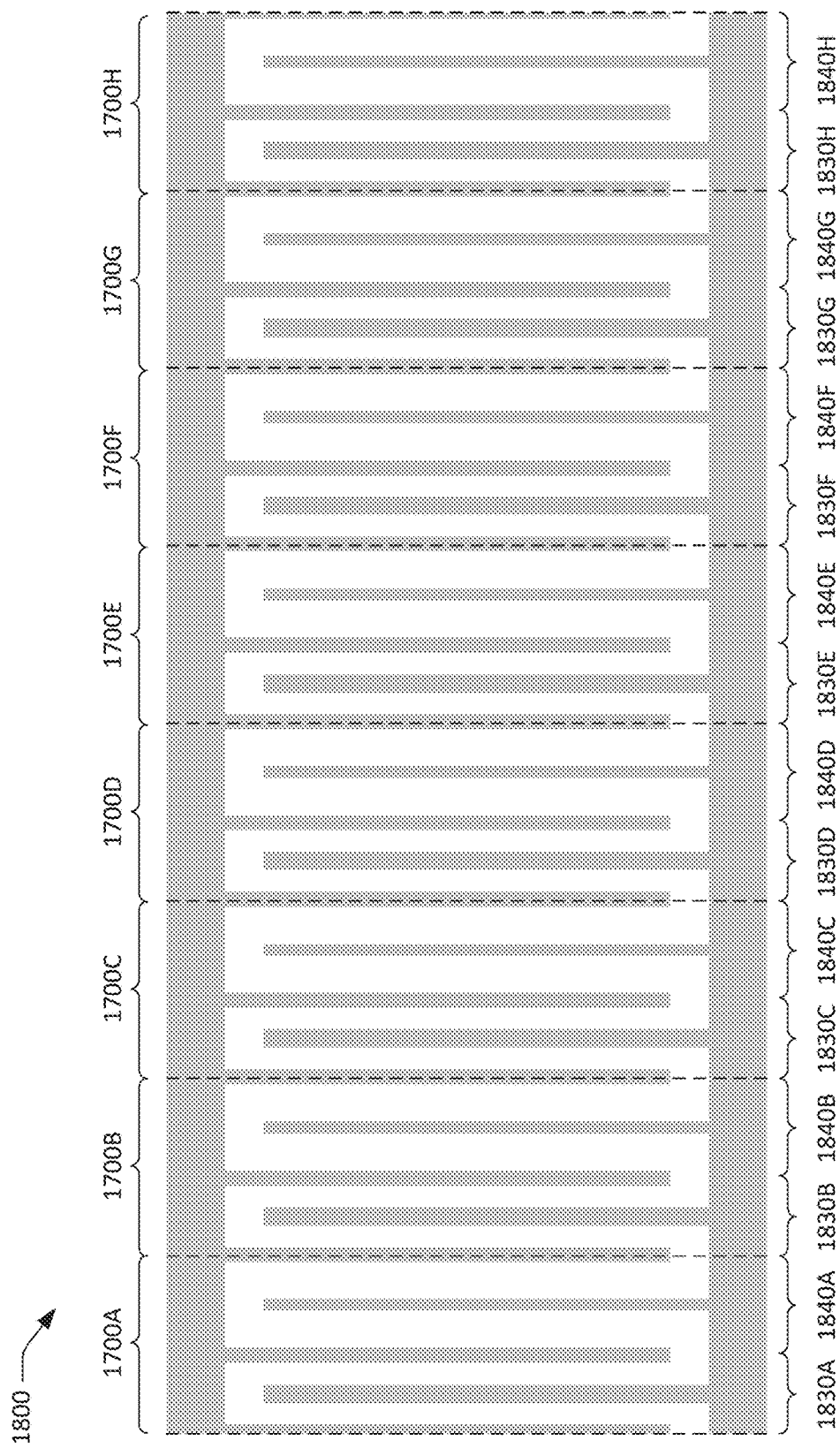
FIG. 18 is a schematic plan view of an IDT made up of eight of the unit cells of FIG. 5.

The unit cell 1700 may be cascaded to provide an IDT with any desired length with a corresponding number of fingers. FIG. 18 is a schematic plan view of an IDT 1800 composed of eight copies 1700A to 1700H of the unit cell 1700 juxtaposed along the length of the IDT 1800 resulting in a total of 33 fingers. The IDT 1800 is shown reasonably to scale (approximately 1600:1), with the exception that the differences between $P_1$ and $P_2$ and between $M_1$ and $M_2$ are still exaggerated for ease of visualization. The IDT 1800 has eight first pitch/mark zones 1830A to 1830H in which the pitch and mark are $P_1$ and $M_1$, respectively. The eight first pitch/mark zones 1830A to 1830H are interleaved with eight second pitch/mark zones 1840A to 1840H, in which the pitch and mark are $P_2$ and $M_2$, respectively. A pattern of two periods of pitch $P_1$ and mark $M_1$ alternating with two periods of pitch $P_2$ and mark $M_2$ is continued along the length of the IDT. Using eight copies of the unit cell 1700 is exemplary and an IDT may use more or fewer than 8 unit cells and have more or fewer than 33 fingers.

Figure 19:
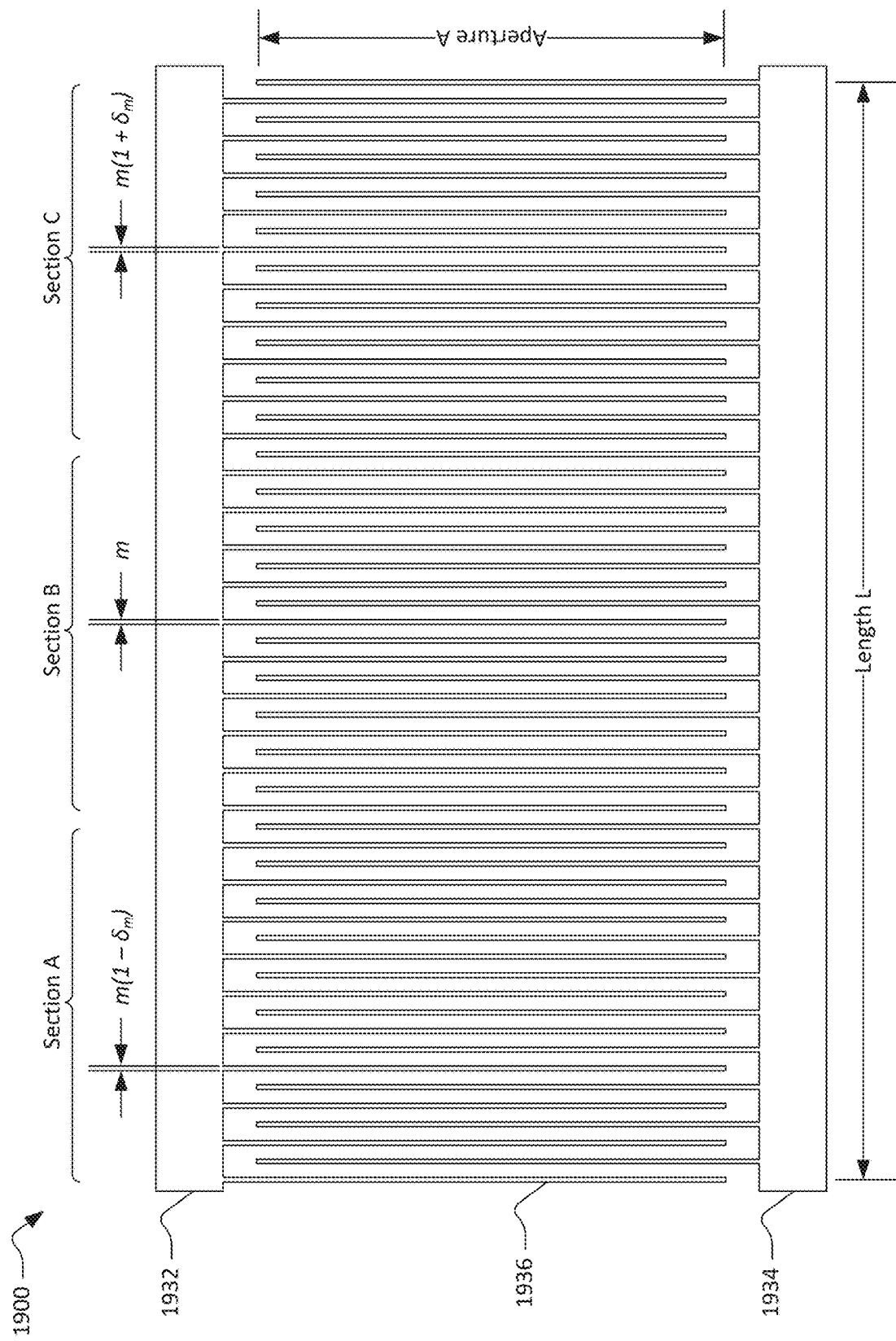
FIG. 19 is a plan view of a multi-mark interdigital transducer (IDT).

FIG. 19 is a plan view of an exemplary multi-mark IDT 1900. A "multi-mark IDT" is an IDT where the mark of the IDT fingers varies along the length of the IDT. At any given point along the length, the mark may not vary across the aperture of the IDT. Further, the pitch, can be constant over the entire IDT. The multi-mark IDT 1900 may be a portion of an XBAR such as the XBAR 100 of FIG. 1.

The multi-mark IDT 1900 includes a first busbar 1932, and a second busbar 1934, and a plurality of interleaved fingers such as finger 1936. The interleaved fingers extend alternately from the first and second busbars 1932, 1934. The multi-mark IDT 1900 is divided into three sections, identified as Section A, Section B, and Section C, along the length L of the IDT. Each of Sections A, B, and C includes 20 fingers, for a total of 60 fingers in the multi-mark IDT 1900. The use of three sections and 60 fingers is exemplary. An IDT may have more than or fewer than 60 total fingers. An IDT may be divided along its length into two or more sections, each of which includes a plurality of adjacent fingers. The total number of fingers may be divided essentially equally between the two or more sections. In this context, "essentially" means "as close as possible." For example, an IDT with 100 fingers divided into three sections with 33, 34, and 33 fingers is considered to be divided essentially equally. The total number of fingers may be divided unequally between the two or more sections.

In this example, the fingers in Section B have mark m, which is the nominal mark of the IDT. The finger of Section A have a mark of $m(1-\delta_m)$, and the fingers of Section C have a mark of $m(1+\delta_m)$. $\delta_m$ is greater than 0 and less than or equal to 0.05. $\delta_m$ may typically be less than 0.01. $\delta_m$ may be selected during a filter design to achieve the most effective reduction of spurious modes. At any point along the length L of the IDT 1900, the mark is constant across the aperture A. The pitch of the IDT fingers is constant and the same in all sections. When an IDT is divided into two sections or more than three sections, the maximum mark may be $m(1+\delta_m)$ and the minimum mark may be $m(1-\delta_m)$.

In the example multi-mark IDT 1900, the mark increases monotonically from left (as seen in the figure) to right. This is not necessarily the case in all multi-mark IDTs. The sections of a multi-mark IDT may be arranged in some other order. Further, in the multi-mark IDT 1900, the change in mark between adjacent sections is constant. This is also not necessarily the case in all multi-mark IDTs. The change in mark between adjacent sections may be the same or different.

Figure 20:
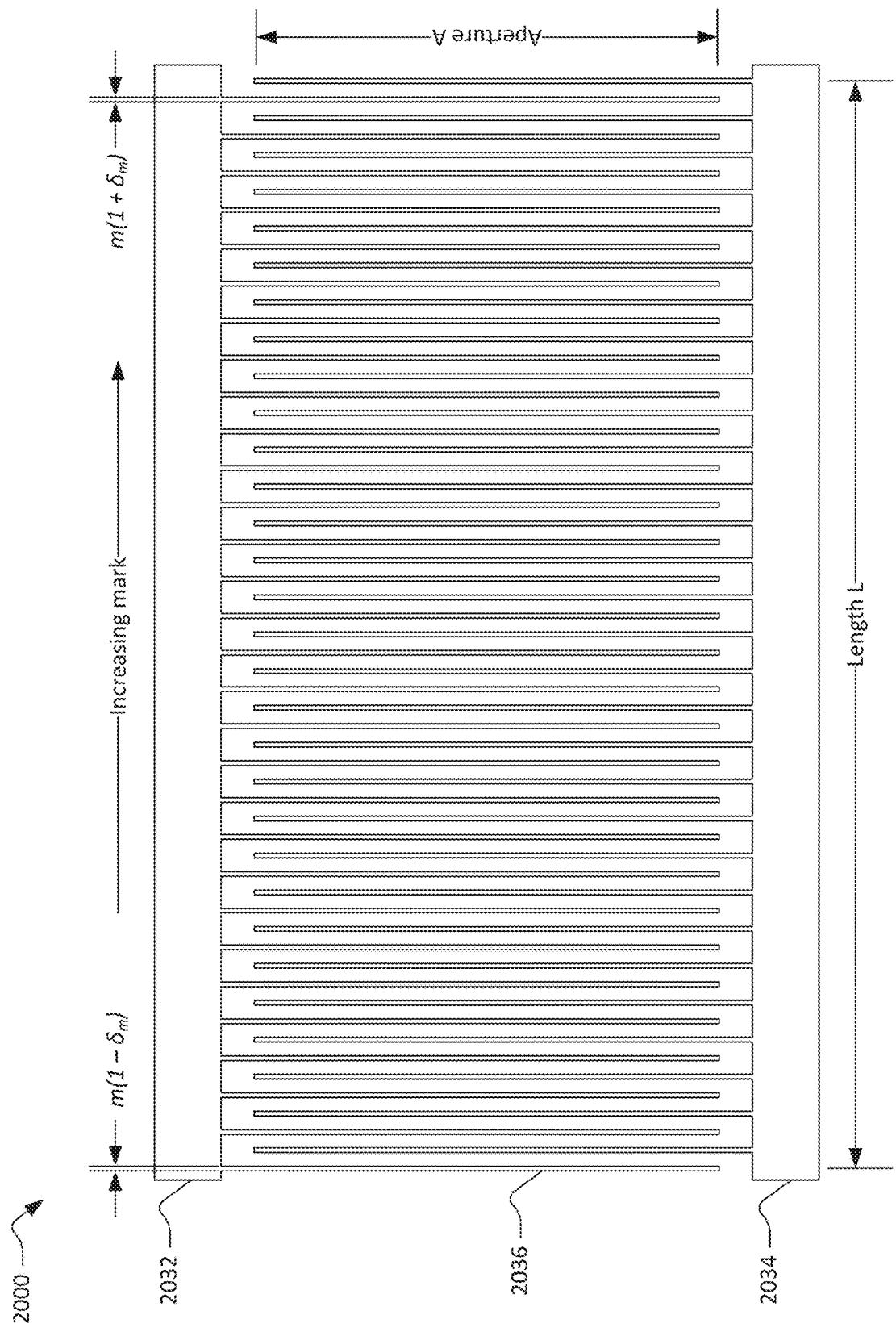
FIG. 20 is a plan view of another multi-mark IDT.

FIG. 20 is a plan view of another multi-mark IDT 2000 with continuously varying mark. The IDT 2000 includes a first busbar 2032, and second busbar 2034, and a plurality of interleaved fingers such as finger 2036. The interleaved fingers extend alternately from the first and second busbars 2032, 2034. The IDT 2000 is not divided into sections, but rather has a continuous change in mark for the fingers 2036 along its length L. The IDT 2000 has 60 fingers, which is exemplary. An IDT may have more than or fewer than 60 total fingers. The multi-mark IDT 2000 may be a portion of an XBAR such as the XBAR 100 of FIG. 1.

As shown in FIG. 20, the mark at the left edge of the IDT 500 is $m(1-\delta_m)$, and the mark at the right edge of the IDT 500 is $m(1+\delta_m)$. The mark varies continuously between these two extremes. The variation in mark may typically, but not necessarily, be a linear function of position along the length L of the IDT. $\delta_m$ is greater than 0, less than or equal to 0.05, and typically less than 0.01. $\delta_m$ may be selected during a filter design to achieve the most effective reduction of spurious modes. At any point along the length of the IDT 2000, the mark is constant across the aperture A. The pitch of the IDT fingers is constant over the entire IDT.

Slight variations in the mark of the IDT in an XBAR can result in disruption or destructive interference of spurious modes with negligible effect on the shear primary mode.

Multi-mark IDTs may be divided into two sections or more than three sections, or may be continuous. The number of sections may not be the same for all resonators in a filter, and a filter may include both sectioned and continuous multi-mark IDTs. The value of $\delta_m$ may be different for some or all of the resonators. A filter may contain a combination of resonators with uniform mark and multi-mark resonators.

In other examples, the pitch of the IDT can vary continuously, similar to the continuous variation of mark shown in FIG. 20. The pitch may vary as the mark varies, or may vary at a different rate. The pitch and mark may both vary continuously. The pitch and/or the mark may vary between multiple maxima and minima along the length of the IDT. The mark may vary by section while the pitch varies continuously, or pitch may vary by section while the mark varies continuously. The mark may increase in one direction along the length of the IDT (either continuously or by section), while the pitch decreases in the same direction (either continuously or by section). Variation of mark and pitch can be optimized with respect to one another, and variation of mark and pitch can be different from one resonator to another, such that greatest suppression of spurious modes is achieved for best performance of the filter.

Figure 21:
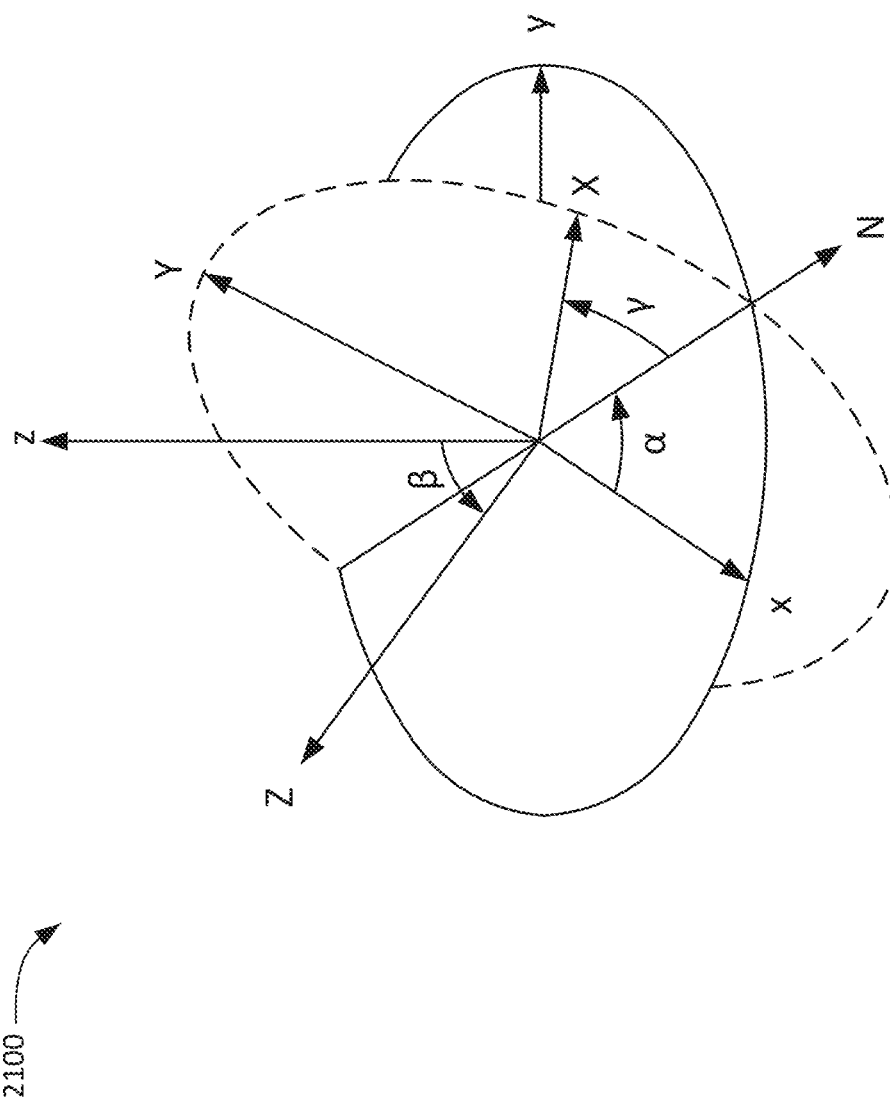
FIG. 21 is a graphical representation of Euler angles.

FIG. 21 is a graphical illustration of Euler angles 2100. Euler angles are a system, introduced by Swiss mathematician Leonhard Euler, to define the orientation of a body with respect to a fixed coordinate system. The orientation is defined by three successive rotations about angles α, β, and γ.

As applied to acoustic wave devices, xyz is a three-dimensional coordinate system aligned with the crystalline axes of the piezoelectric material. XYZ is a three-dimensional coordinate system aligned with the acoustic wave device, where Z is normal to the surface of the piezoelectric material. XY is the plane of the surface of the piezoelectric material. X is the direction of the electric field and acoustic wave propagation for SAW and most plate-mode devices, and Y is typically parallel to the fingers on an IDT. In XBAR devices, X is the direction of the electric field, but acoustic wave propagation is dominantly along the Z direction. All of the XBAR devices described in application Ser. No. 16/230, 443 and application Ser. No. 16/381,141 use piezoelectric plates with the z axis normal to the plate surface and the y axis orthogonal to the IDT fingers. Such piezoelectric plates have Euler angles of 0, 0, 90°.

For historical reasons, lithium niobate plates having Euler angles [0°, β, 0°] are commonly referred to as "Y-cut", where the "cut angle" is the angle between the y axis and the normal to the plate. The "cut angle" is equal to β+90°. For example, a plate with Euler angles [0°, 30°, 0°] is commonly referred to as "120° rotated Y-cut".

Figure 22:
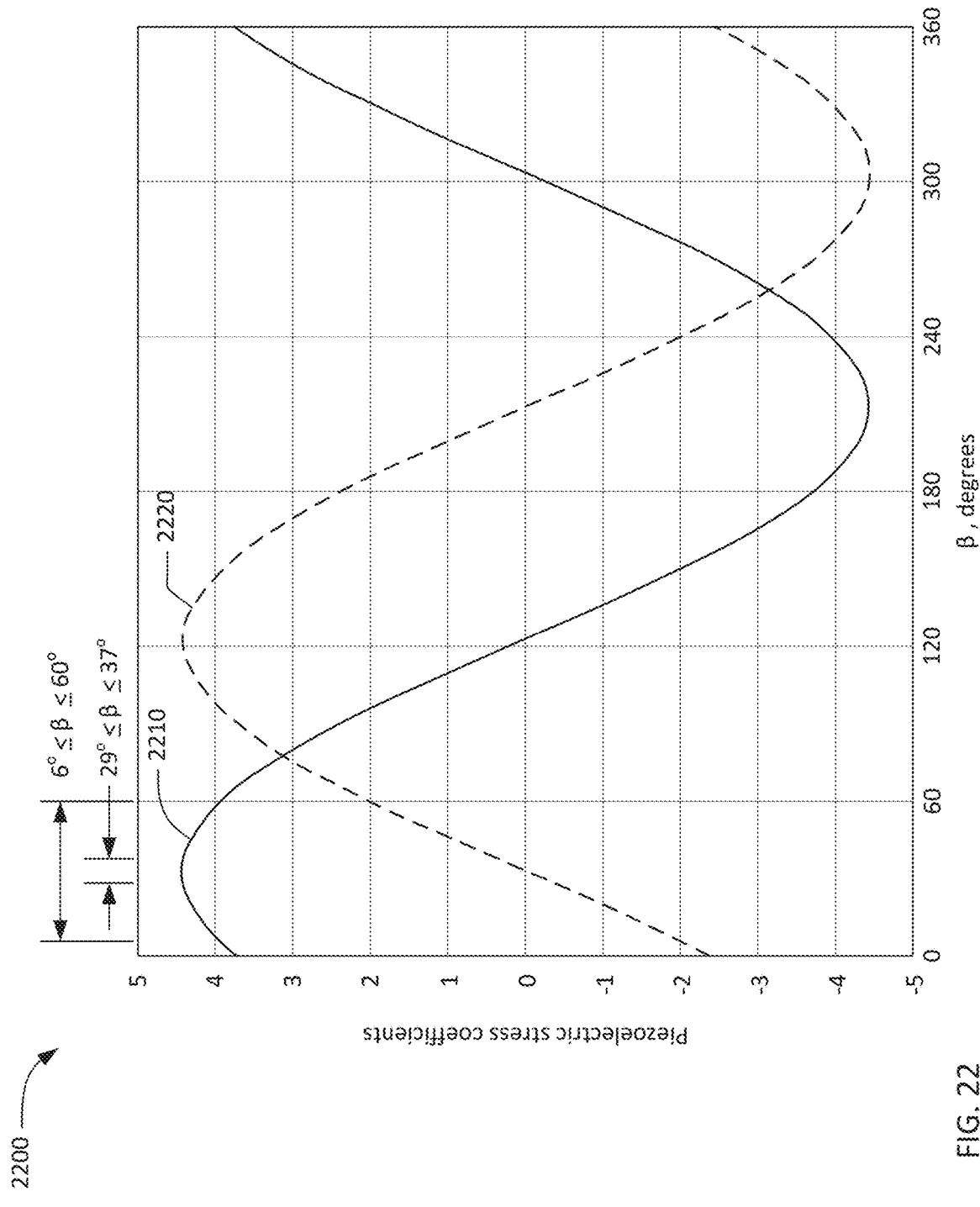
FIG. 22 is a chart of the e14 and e15 piezoelectric coefficients of a lithium niobate plate with Euler angles [0°, β, 0°] as functions of β.

FIG. 22 is a graph 2200 of two piezoelectric coefficients e15 and e16 for lithium niobate plates having Euler angles [0°, β, 0°]. The solid line 2210 is a plot of piezoelectric coefficient e15 relating electric field along the x axis to shear stress or torque εxz axis as a function of β. This shear stress excites the shear primary acoustic mode shown in FIG. 3. The dashed line 2220 is a plot of piezoelectric coefficient e16 relating electric field along the x axis to shear stress or torque εxy as a function of β. This shear stress excites horizontal shear modes (e.g. the SH0 plate mode) with atomic displacements normal to the plane of FIG. 3, which are undesired parasitic modes in an XBAR. Note that these two curves are identical and shifted by 90°, (as y-axis shifted from x-axis).

Inspection of FIG. 22 shows that the first piezoelectric stress coefficient is highest for Euler angle β about 30°. The first piezoelectric stress coefficient is higher than about 3.8 (the highest piezoelectric stress coefficient for an unrotated Z-cut lithium niobate) for $0° \le \beta \le 60°$. The second piezoelectric stress coefficient is zero for Euler angle $\beta$ about 30°, where the first piezoelectric stress coefficient is maximum. In this context "about 30°" means "within a reasonable manufacturing tolerance of 30°". The second piezoelectric stress coefficient is less than about 10% of the first piezoelectric stress coefficient for $26° \le \beta \le 34°$.

Shear wave velocity and diaphragm thickness are both temperature dependent, with the temperature coefficient of shear wave velocity (TCV) being the dominant factor in the temperature dependence of resonance frequency.

The difference between the resonance and anti-resonance frequencies of an XBAR is determined, in part, by the electro-mechanical coupling between the electric field and the primary shear wave. This coupling depends on piezoelectric coupling coefficient $e_{15}$. $e_{15}$ is an element of a 3×6 matrix of piezoelectric coupling coefficients that describe the physical response of a piezoelectric material to an applied electric field. A larger value of $e_{15}$ results in more efficient coupling to the primary shear acoustic mode, which results in wider spacing between the resonance and anti-resonance frequencies of an XBAR.

Figure 23:
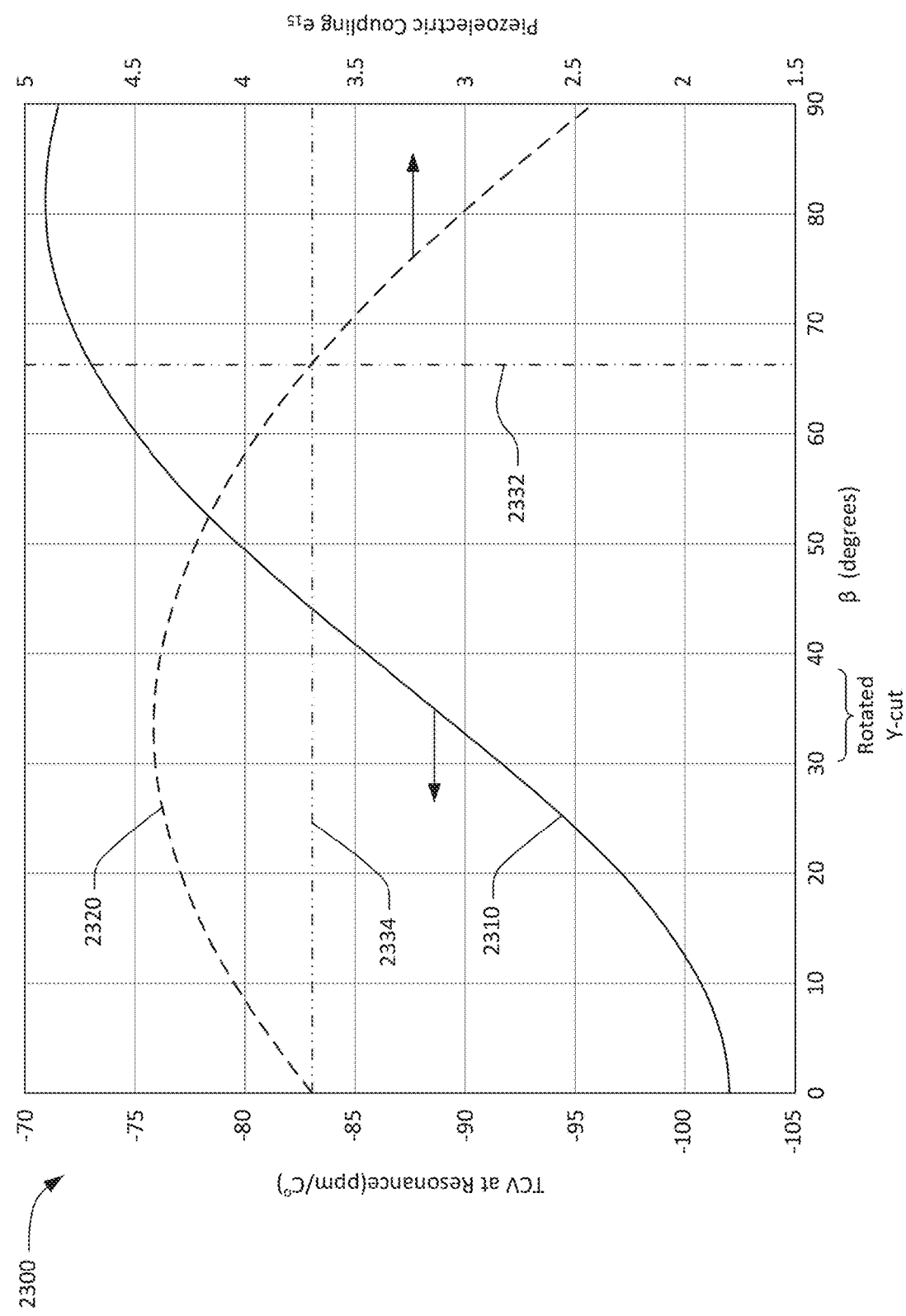
FIG. 23 is a graph of piezoelectric coupling and temperature coefficient of velocity as functions of Euler angle β for lithium niobate.

FIG. 23 is a chart 2300 of piezoelectric coupling coefficient $e_{15}$ and temperature coefficient of velocity TCV as functions of Euler angle $\beta$ for lithium niobate with Euler angles (0°, $\beta$, 0°). Specifically, the solid curve 2310 is a plot of TCV versus $\beta$. The solid curve 2310 is read against the left-hand axis. TCV is expressed in part per million per degree Celsius (ppm/° C.). The dashed curve 2320 is a plot of $e_{15}$ versus $\beta$. The dashed curve 2320 is read against the right-hand axis.

Lithium niobate crystal orientations previously used for XBARs include Z-cut and rotated Y-cut. Z-cut has Euler angles=(0°, 0°, 90°). Rotated Y-cut has Euler angles=(0°, $\beta$, 0°), with $\beta$ between 30 and 38 degrees. Z-cut lithium niobate has a TCV of about −102 ppm/° C. and $e_{15}$ of about 3.7. Rotated Y-cut lithium niobate has $e_{15}$ about 4.4 and TCV between about −86 ppm/° C. and −92 ppm/° C.

Inspection of FIG. 23 shows that rotated Y-cut lithium niobate with $\beta$ about 67 degrees (broken line 432) has a value of $e_{15}$ of about 3.7 (broken line 434) which is equivalent to the $e_{15}$ for Z-cut lithium niobate. Rotated Y-cut lithium niobate with $\beta$ about 67 degrees has a TCV of about −73 ppm/° C., which is 30% smaller (in magnitude) than the TCV of Z-cut lithium niobate. Filters comprised of XBARs using lithium niobate piezoelectric plates with $\beta$ substantially equal to 67° may have performance comparable to filters using Z-cut lithium niobate with significantly less frequency dependence on temperature. In this and similar contexts, "substantially equal" means equal with defined manufacturing tolerances. The range from $\beta=38°$ to $\beta=67°$ offers a continuous trade-off between piezoelectric coupling and TCV. For example, a rotated Y-cut lithium niobate plate with $\beta=60°$ offers 5% higher piezoelectric coupling than a plate with $\beta=67°$ with only a small increase in the magnitude of TCV.

The bandwidth and other requirements of a particular filter may dictate a minimum value for $e_{15}$. The Euler angles (0°, $\beta$, 0°) of the piezoelectric plate may be selected with $\beta$ set to the highest value in the range from 40° to 67° that provides the required minimum value of $e_{15}$, while minimizing, to the extent possible, the TCF of the filter.

Figure 24:
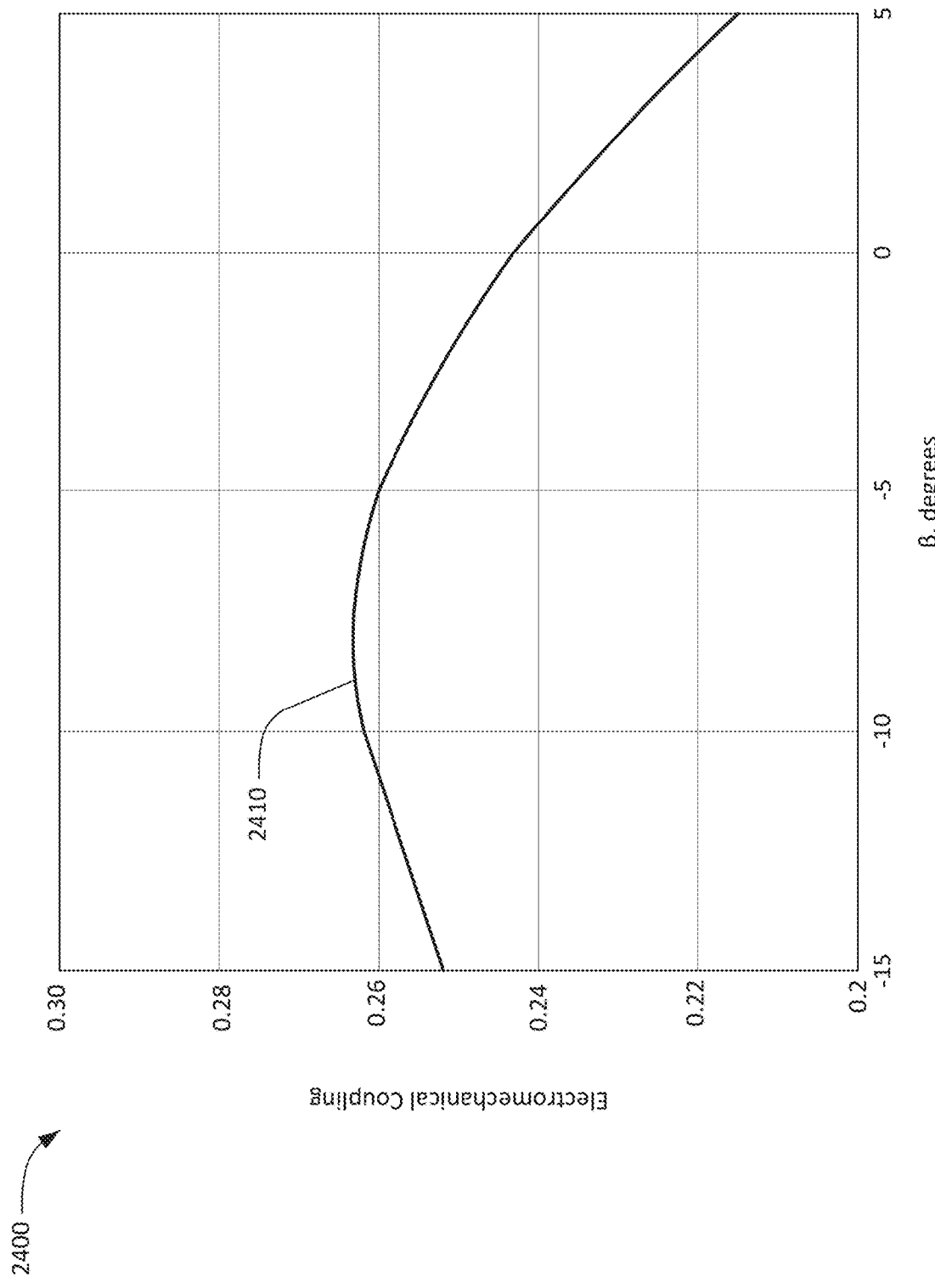
FIG. 24 is a chart of the electromechanical coupling of an XBAR as a function of Z-axis tilt angle β.

FIG. 24 is a chart 2400 of the electromechanical coupling coefficient of representative XBAR devices using piezoelectric plates with Euler angles 0, $\beta$, 90°, where $\beta$ is in the range from −15° to +5°. The chart in FIG. 24 is based on simulation of XBAR devices using finite element methods. The line 2410 is a plot of electromechanical coupling coefficient as a function of $\beta$. Inspection of the chart 2400 shows that the electromechanical coupling coefficient is greater than 0.26 for $\beta$ greater than or equal to −11° and less than or equal to −5°, as compared to a value of about 0.243 for $\beta=0$.

The Q-factor of an acoustic resonator is commonly defined as the peak energy stored during a cycle of the applied RF signal divided by the total energy dissipated or lost during the cycle. The Q-factor of an XBAR is a complex function of numerous parameters including the length, or number of fingers, in the IDT of the XBAR.

Possible loss mechanisms in an acoustic resonator include resistive losses in the IDT and other conductors; viscous or acoustic losses in the piezoelectric plate, IDT fingers, and other materials; and leakage of acoustic energy out of the resonator structure. The peak energy stored in a resonator is proportional the capacitance of the resonator. In an XBAR resonator, the capacitance is proportional to the number of IDT fingers. Resistive losses and viscose losses are also proportional to the number of IDT fingers. Acoustic energy that leaks from the resonator in the transverse direction (i.e. the direction parallel to the IDT fingers) is proportional to the length of the resonator and thus also proportional to the number of IDT fingers. In contrast, energy lost from the ends of the IDT in the longitudinal direction (i.e. the direction normal to the IDT fingers) is roughly constant, independent of the number of IDT fingers. As the number of IDT fingers and the peak energy stored in an XBAR is reduced, the acoustic energy lost in the longitudinal direction becomes an ever-increasing fraction of the peak energy stored.

Figure 25:
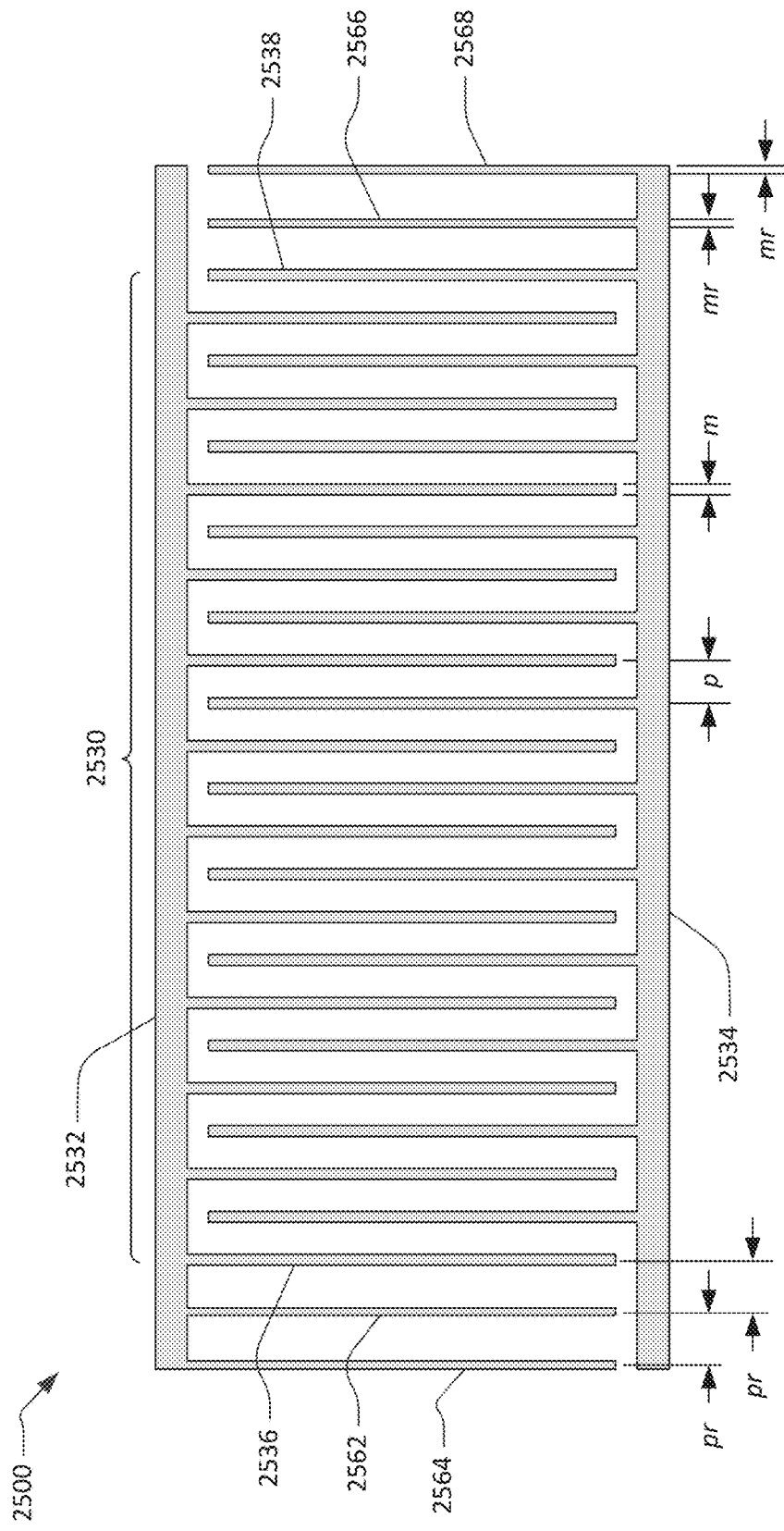
FIG. 25 is a schematic plan view of an IDT with reflector elements.

FIG. 25 is a plan view of an exemplary conductor pattern 2500 that reduces the acoustic energy leakage in the longitudinal direction at the ends of an XBAR. The conductor pattern 2500 includes an IDT 2530 and four reflector elements 2562, 2564, 2566, 2568. The IDT 2530 includes a first busbar 2532, a second busbar 2534, and a plurality of n interleaved IDT fingers extending alternately from the first and second busbars. In this example, n, the number of IDT fingers, is equal to 24. In other XBARs, n may be in a range from 20 to 100 or more IDT fingers. IDT finger 2536 is the $1^{st}$ finger and IDT finger 2538 is the n'th finger. Numbering the IDT fingers from left to right (as shown in FIG. 25) is arbitrary and the designations of the $1^{st}$ and n'th fingers could be reversed.

As shown in FIG. 25, the odd numbered IDT fingers extend from the first busbar 432 and the even numbered IDT fingers extend from the second busbar 2534. The IDT 2530 has an even number of IDT fingers such that the $1^{st}$ and n'th IDT fingers 2536, 2538 extend from different busbars. In some cases, an IDT may have an odd number of IDT fingers such that the $1^{st}$ and n'th IDT fingers and all of the reflector elements extend from the same busbar.

A total of four reflector elements are provided outside of periphery of the IDT 2530. A first reflector element 2562 is proximate and parallel to 1st IDT finger 2536 at the left end of the IDT 2530. A second reflector element 2566 is proximate and parallel to n'th IDT finger 2538 at the right end of the IDT 2530. An optional third reflector element 2564 is parallel to the first reflector element 2562. An optional fourth reflector element 2568 is parallel to the second reflector element 2566.

First and third reflector elements 2562, 2564 extend from the first busbar 2532 and thus are at the same electrical potential as the 1st IDT finger 2536. Similarly, second and fourth reflector elements 2566 and 2568 extend from the second busbar 2530 and thus are at the same electrical potential as the n'th IDT finger 2538.

The reflector elements 2562, 2564, 2566, 2568 are configured to confine acoustic energy to the area of the IDT 2530 and thus reduce acoustic energy losses in the longitudinal direction. To this end, the pitch pr between adjacent reflector elements and between reflector elements 2562 and 2566 and the adjacent first and n'th IDT fingers, respectively, is typically greater than the pitch p of the IDT fingers. The width or mark mr of the reflector elements 2562, 2564, 2566, 2568 is not necessarily equal to the mark m of the IDT fingers. As will be described subsequently, the mark mr of the reflector elements may be selected to optimize Q-factor at a specific frequency or range of frequencies.

In other embodiments, reflector elements (e.g., four reflector elements are provided outside of periphery of the IDT. First and third reflector elements are proximate and parallel to 1st IDT finger at the left end of the IDT that are connected to each other but are not connected to either busbar. First and third reflector elements are capacitively coupled to 1st IDT finger and thus are at substantially the same electrical potential as the 1st IDT finger. The reflector elements are considered to be at substantially the same potential if, when an RF signal is applied between the busbars, the potential between the reflector elements and the $1^{st}$ IDT finger is small compared to the potential between adjacent IDT fingers. Similarly, second and fourth reflector elements are proximate and parallel to n'th IDT finger at the right end of the IDT. Second and fourth reflector elements are connected to each other and not connected to either busbar. Second and fourth reflector elements are capacitively coupled to the n'th IDT finger and thus are at nearly the same electrical potential as the n'th IDT finger.

Figure 26A:
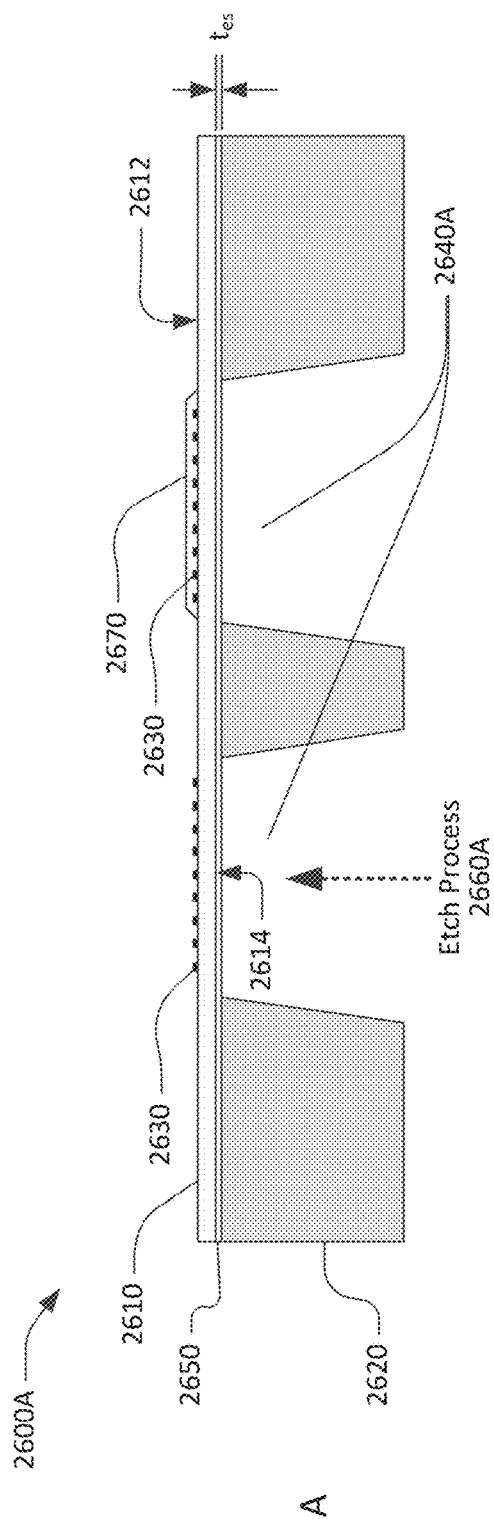
FIG. 26A is a schematic cross-sectional view of an XBAR with an etch-stop layer and back-side etched cavities.

FIG. 26A is a schematic cross-sectional view of an XBAR device 2600A with an etch-stop layer and back-side etched cavities. The XBAR device 2600A includes two XBARs, each of which is similar to the XBAR 100 of FIG. 1. A back surface 2614 of a piezoelectric plate 2610 is attached to a substrate 2620. An electrode pattern is formed on a front surface 2612 of the piezoelectric plate 2610. The electrode pattern includes interleaved fingers 2630 of respective IDTs for the two XBARs. The IDT fingers 2630 are disposed over respective cavities 2640A formed in the substrate 2620. The materials of the piezoelectric plate, substrate, and electrode pattern are as previously described.

The primary difference between the XBAR device 2600A and the XBAR 100 of FIG. 1 is the presence of an etch-stop layer 2650 sandwiched between the piezoelectric plate 2610 and the substrate 2620. The term "sandwiched" means the etch-stop layer 2650 is both disposed between and physically connected to a surface of the substrate 2620 and the back surface 2614 of the piezoelectric plate 2610. In some embodiments, as will be described subsequently, layers of additional materials may be disposed between the etch-stop layer 2650 and the surface of the substrate 2620 and/or between the etch-stop layer 2650 and the back surface 2614 of the piezoelectric plate 2610. In XBAR device 2600A, the piezoelectric plate 2610 is not bonded directly to the substrate 2620 but is attached to the substrate 2620 via the etch-stop layer 2650.

The cavities 2640A are formed by using an etch process to remove material from the substrate. The etch process may be a "wet" process using a liquid etchant, or a "dry" process such as reactive ion etching or sputter etching that use a gaseous etchant. As represented by the dashed arrow 2660A, the etch process proceeds from the back surface of the substrate and progressively removes material from the substrate until the cavities 2640A are formed. In the absence of the etch-stop layer 2650, at least a portion of the back surface 2614 of the piezoelectric plate 2610 would be exposed to the etch process 2660. The performance of the XBAR 2600A is sensitive to the thickness of the piezoelectric and, to at least some extent, to the smoothness of the back surface 2614. Any erosion of the back surface 2614 by the etch process 2660 may have a deleterious effect on the performance of the XBAR 2600A.

The etch-stop layer 2650 protects the back surface 2614 from the etch process. To this end, the etch-stop layer 2650 is impervious to the etch process represented by the dashed arrow 2660A. The word "impervious" has several definitions including "not affected by" and "not allowing fluid to pass though". Both of these definitions apply to the etch-stop layer 2650. The etch-stop layer is not materially affected by the etch process and does not allow the liquid or gaseous etchant used in the etch process to penetrate to the piezoelectric layer 2610. The etch-stop layer need not be inert with respect to the etchant but must be highly resistant to the etchant such that a substantial portion of the etch stop layer remains after completion of the cavity etch. The remaining etch stop layer 2650 is not removed after the cavities 2640A are formed and becomes a portion of the diaphragms of the XBAR devices.

The etch-stop layer 2650 is formed from an etch-stop material. The etch-stop material must be a dielectric with very low conductivity and low acoustic loss. The etch-stop material must have high adhesion to the surface(s) on which it is formed. Further, the etch-stop material must be compatible with attaching the piezoelectric plate to the substrate with a wafer bonding process. Most importantly, the etch-stop material must be impervious, as previously defined, to the processes and chemicals used to etch the substrate material. Suitable etch-stop materials may include oxides such as aluminum oxide and silicon dioxide, sapphire, nitrides including silicon nitride, aluminum nitride, and boron nitride, silicon carbide, and diamond.

When the etch-stop material is a high thermal conductivity dielectric, such as aluminum nitride, boron nitride, or diamond, the etch-stop layer will help conduct heat away from the diaphragm of the XBAR.

As described in U.S. Pat. No. 10,491,192, a dielectric layer 2670 may be selectively formed on the front side of the piezoelectric plate 2610 over the JDTs 2630 of some XBARs. For example, a frequency setting dielectric layer may be formed over the IDTs of shunt resonators to lower their resonant frequencies with respect to the resonant frequencies of series resonators in a filter. The electromechanical coupling efficiency of an XBAR may be reduced and spurious modes may be enhanced if the total thickness of dielectric layers on the front and back surfaces of the piezoelectric plate exceeds about 35% of the piezoelectric plate thickness. Further, filters designed for broad communications bands such as band n77 and band n79 may require a frequency setting layer with a thickness of 20% to 30% of the piezoelectric plate thickness. To allow flexibility in selection of the frequency setting layer thickness, the thickness $t_{es}$ of the etch-stop layer 2650 may be less than or equal to 10% of the piezoelectric plate thickness, and preferably about 4% to 6% of the piezoelectric plate thickness. When a frequency setting dielectric layer is not used, the thickness $t_{es}$ may be less than about 20% of the piezoelectric plate thickness.

Figure 26B:
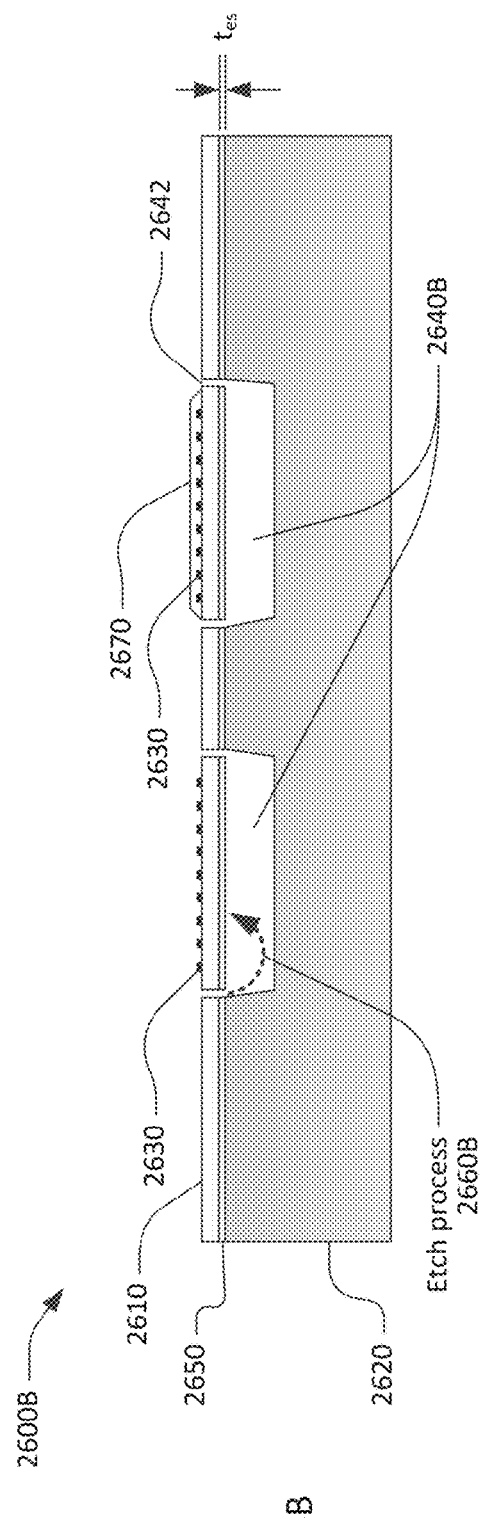
FIG. 26B is a schematic cross-sectional view of an XBAR with an etch-stop layer and front-side etched cavities.

FIG. 26B is a schematic cross-sectional view of an XBAR device 2600B with an etch-stop layer and front-side etched cavities. The XBAR device 2600B includes two XBARs, each of which is similar to the XBAR 100 of FIG. 1. A back surface of a piezoelectric plate 2610 is attached to a substrate 2620. An etch-stop layer 2650 is sandwiched between the piezoelectric plate 2610 and the substrate 2620. An electrode pattern is formed on a front surface of the piezoelectric plate 2610. The electrode pattern includes interleaved fingers 2630 of respective IDTs for the two XBARs. The IDT fingers 2630 are disposed over respective cavities 2640B formed in the substrate 2620. The materials and characteristics of the piezoelectric plate 2610, substrate 2620, etch-stop layer 2650, and electrode pattern 2630 are as previously described.

The primary difference between the XBAR device 2600B and the XBAR device 2600A of FIG. 26A is the etch process used to form the cavities 2640B. The cavities 2640B are formed with an etch process, represented by the dashed arrow 2660B, using an etchant introduced though openings 2642 in the piezoelectric plate 2610 and the underlying etch-stop layer 2650.

Figure 27:
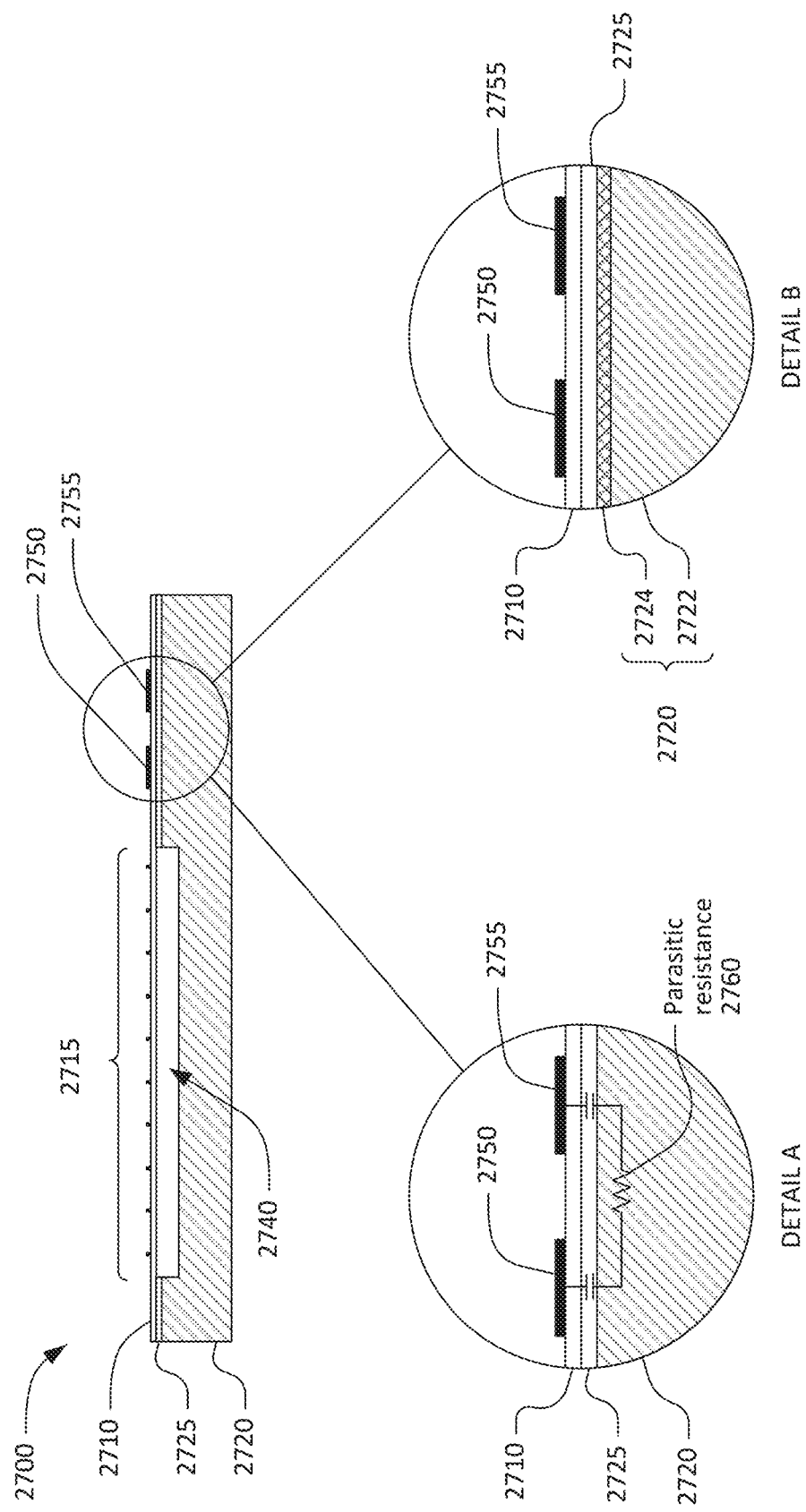
FIG. 27 is schematic cross-sectional view and two detailed cross-sectional views of an XBAR.

FIG. 27 shows a schematic cross-sectional view and two detailed cross-sectional views of a filter 2700 using XBARs. A piezoelectric plate 2710 is attached to a substrate 2720. An optional dielectric layer 2725 may be between the piezoelectric plate 2710 and the substrate 2720. A portion of the piezoelectric plate 2710 forms a diaphragm 2715 spanning a cavity 2740 in the substrate. As shown, the cavity 2740 does not fully penetrate the substrate 2720. Alternatively, the cavity 2740 may penetrate the substrate as shown in FIG. 1. Fingers of an IDT are disposed on the diaphragm 2715. Two conductors 2750 and 2755 are formed on the surface of the piezoelectric plate 2710 at a location removed from the cavity 2740. The two conductors 2750, 2755 may be signal conductors interconnecting XBARs and/or other components of the filter 2700. The conductors 2750 and 2755 may be a signal conductor and a ground conductor. While FIG. 27 only shows a single XBAR and two conductors, a filter may include multiple XBARs and more than two signal and ground conductors.

A preferred material for the substrate 2720 is silicon. Silicon wafers are readily available and inexpensive. Further, processes and equipment for handling silicon wafers are well developed. However, silicon is a semiconductor material. Silicon wafers may be doped, or loaded with impurities, to have a desired bulk resistivity. Undoped, or intrinsic, silicon wafers can form a conductive inversion layer along the boundary between the silicon and some other material, such as along the boundary of the silicon wafer 2720 and the dielectric layer 2725 of the filter device 2700. If the dielectric layer 2725 is not present, the inversion layer may form along the boundary between the silicon wafer 2720 and the piezoelectric plate 2710.

As shown in Detail A of FIG. 27, conductors 2750 and 2755 are capacitively coupled to the substrate 2720 through the piezoelectric plate 2710 and the dielectric layer 2725, if present. If the substrate 2720 is conductive, or if a conductive inversion layer is formed in the substrate 2720, the conductors 2750, 2755 will be effectively connected, at RF frequencies, by a parasitic resistance 2760. Power dissipated in the resistance 2760 will contribute to the insertion loss of the filter 2700.

Detail B of FIG. 27, shows a cross-sectional view of a portion of a filter formed on a substrate 2720 including a high resistivity silicon wafer 2722 and a trap-rich region 2724. The trap rich region 2724 may be a region within the high resistivity silicon wafer 2722 or a layer formed on a surface of the high resistivity silicon wafer 2722. In either case, the trap-rich region is immediately adjacent the dielectric layer 2725 or the piezoelectric plate 2710 if the dielectric layer 2725 is not present. The trap-rich region 2722 has an abundance of traps that capture free carriers and reduce carrier lifetime to an extent that the conductivity of the trap-rich region approaches zero.

A trap-rich region may be formed within a silicon substrate by irradiating the surface of the substrate with neutrons, protons, or various ions (silicon, argon, nitrogen, neon, oxygen, etc.) to create defects in the crystalline structure of the substrate. Alternatively, a trap-rich region may be formed within a silicon substrate by introducing deep trap impurities such as gold, copper, or other metal ions. Such impurities may be introduced by ion implantation, diffusion, or some other method. The trap-rich region may be formed by a combination of these techniques. When the dielectric layer 2725 is included in the filter 2700, the trap-rich region 2724 may be formed before the dielectric layer is formed on the substrate 2720. Alternatively, the trap-rich region 2724 may be form by ion implantation through the dielectric layer 2725.

A trap-region layer may be formed on a silicon substrate by depositing a layer of trap-rich material such as amorphous silicon or polysilicon (polycrystalline silicon). When the trap-rich region is polysilicon, the average grain size of the polysilicon should be substantially smaller than the minimum spacing between electrodes 2750, 2755. The thickness of the trap rich region formed on or within a high resistivity silicon substrate should be greater than the thickness of an inversion layer that may form in the absence of the trap-rich layer.

Figure 28:
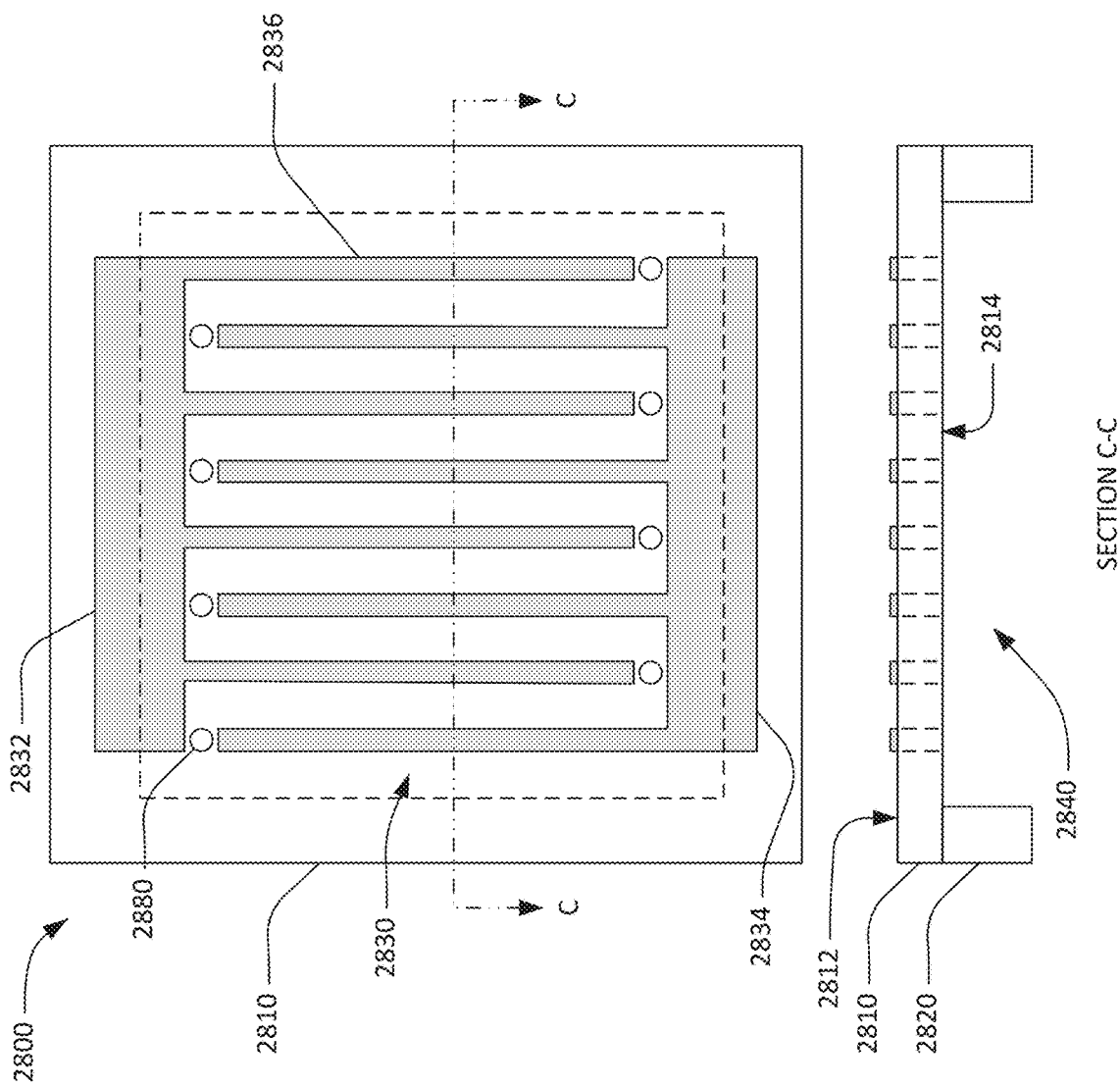
FIG. 28 is a plan view and a cross-sectional view of an XBAR with periodic etched holes.

FIG. 28 is a plan view of an XBAR 2800 with periodic etched holes. The XBAR 2800 includes a piezoelectric plate 2810 having parallel front and back surfaces 2812, 2814, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent.

The back surface 2814 of the piezoelectric plate is attached to surface of a substrate 2820. A portion of the piezoelectric plate forms a diaphragm spanning a cavity 2840 in the substrate 2820. As shown in FIG. 28, the cavity 2840 extends completely through the substrate 2820. The cavity may only extend part way through the substrate, as shown in FIG. 2A and FIG. 2B.

An IDT 2830 is formed on the surface of the piezoelectric plate 2810. The IDT 2830 includes a first busbar 2832 and a second busbar 2834. A first set of parallel fingers, such as finger 2836 extends from the first busbar 2832. A second set of parallel fingers extends from the second busbar 2834. The first and second sets of fingers are parallel and interleaved. At least the interleaved fingers of the IDT are disposed on the diaphragm. A periodic array of holes 2880 are formed in the diaphragm. As shown in FIG. 28, the periodic array includes one hole at the end of each IDT finger. Specifically, a hole is disposed between the end of each of the first set of fingers and the second busbar and a hole is disposed between the end of each of the second set of fingers and the first busbar. Other periodic arrangements of the holes, such as at the ends of alternate IDT fingers may be used.

The periodic array of holes 2880 has two effects on the performance of the XBAR 2800. First, the holes scatter, and thus inhibit resonance of, spurious acoustic waves traveling parallel to the IDT fingers. Such spurious acoustic waves can introduce ripple in the input/output transfer function of XBAR filters. Second, the array of holes 2880 appears to increase the Q-factor of XBAR devices, possibly by helping to confine the primary shear acoustic mode to the aperture of the XBAR.

As shown in FIG. 28, the holes 2880 are right circular cylinders with a diameter approximately equal to the width of the IDT fingers. The size and shape of the holes in FIG. 28 is exemplary. The holes may be larger or smaller than the width of the IDT fingers and may have a cross-sectional shape other than circular. For example, the cross-sectional shape of the holes may be oval, square, rectangular, or some other shape. The holes need not necessarily pass through the piezoelectric plate. The holes may be blind holes that only extend part way though the thickness of the piezoelectric plate. The size and depth of the holes must be sufficient to create a domain with significantly reduced acoustic impedance. An additional benefit of holes at the ends of the IDT fingers is reduction of parasitic capacitance between the IDT finger tips and the adjacent busbar.

To produce improved XBAR resonators and filters that efficiently conduct heat from the IDT or busbars to the substrate, predetermined areas of the bonding oxide layer (e.g., BOX) and/or piezoelectric layer can be removed from selected locations of the surface of the substrate of the device to provide a predetermined amount in reduction of thermal resistance between the conductor pattern and the substrate. The predetermined areas removed from the selected locations may be described as excess BOX and piezoelectric material that is removed because their removal does not affect or change the filtering performance (e.g., frequency range passed) by the filter. In some cases, the removal may change the performance by less than 5 percent of the frequency range and/or wave pass amplitude. In some cases, it is by less than 10 percent. It may be by less than 3 percent.

In some cases, to produce improved XBAR resonators and filters with excess BOX and piezoelectric material removed, the portions or areas of the BOX and piezoelectric material of a plate or layer that extend a certain distance past the cavity perimeter of the cavities of filter may be removed. This removing may include removing the BOX and piezoelectric material: a) that extends in the length direction past the perimeter of the cavity by between 2 and 25 percent more the length of the cavity; and b) that extends in the width direction past the perimeter of the cavity by between 2 and 25 percent more the width of the cavity. This removing may include removing the excess BOX and piezoelectric material to provide a predetermined amount in reduction of thermal resistance between the conductor pattern and the substrate. This removing may include removing the excess BOX and piezoelectric material from locations immediately adjacent to (e.g., touching) contact layers and/or under contact bumps. It may include removing the BOX and piezoelectric material from outside of the XBAR resonators or diaphragms of an RF filter, such as from locations beside a cavity over which the resonator or diaphragm spans (e.g., is suspended or extends).

Figure 29A:
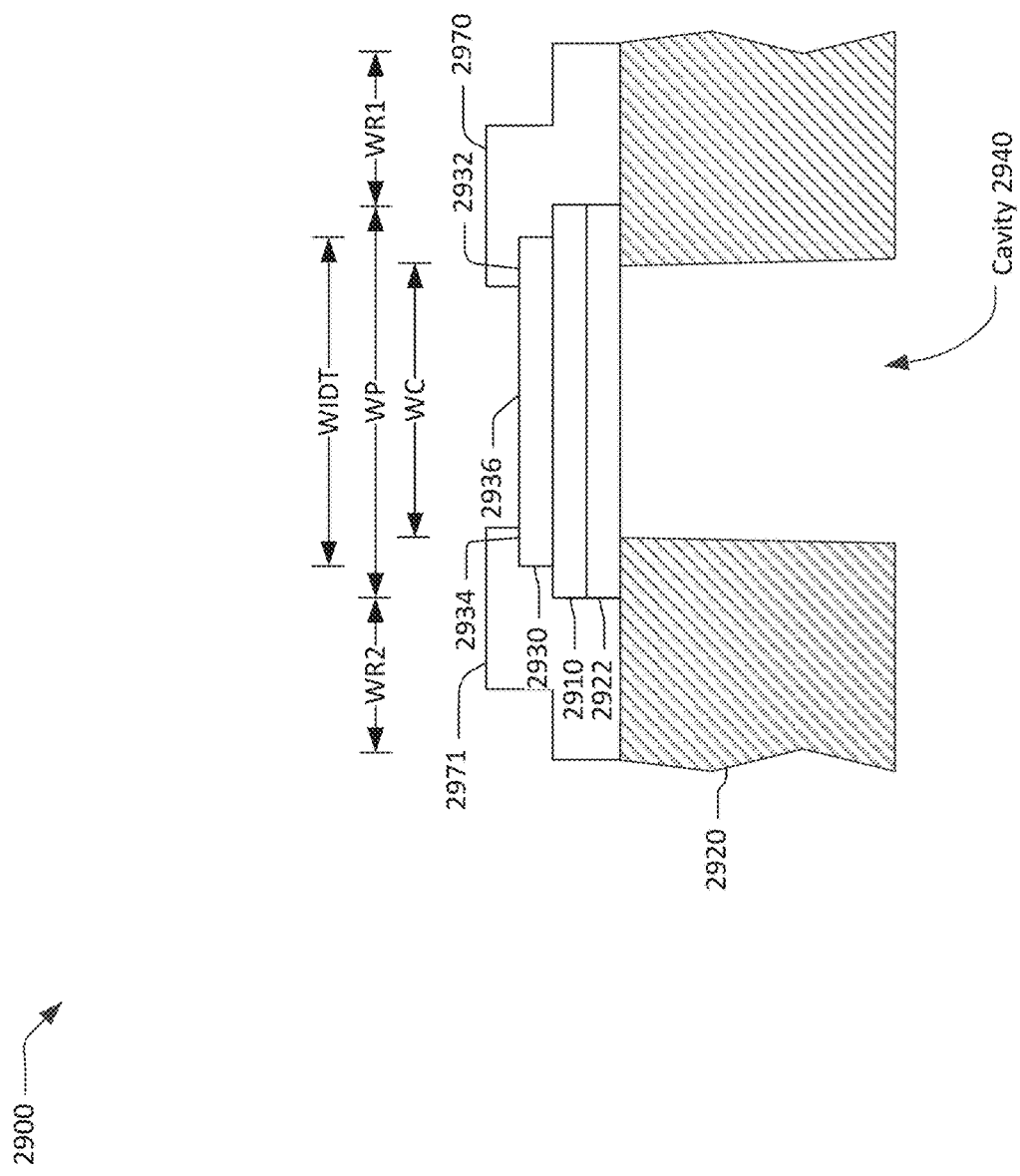
FIG. 29A is a schematic cross-sectional view of XBAR device having predetermined areas of the bonding layer and piezoelectric layer removed from selected locations.

FIG. 29A is a schematic cross-sectional view of XBAR device 2900 having predetermined areas of the bonding oxide layer 2922 (e.g., BOX layer) and piezoelectric layer 2910 removed from selected locations over the surface of the substrate of the device to provide a predetermined amount in reduction of thermal resistance between the IDT pattern 2936 and the substrate 2920. FIG. 29A may be a view of the filter device at the section A-A of FIG. 1, section B-B of FIG. 1, and/or of plane A-A of FIG. 2A. FIG. 29A shows filter device 2900 comprising substrate 2920 having cavity 2940. BOX layer 2922 is formed on the substrate and spans over the cavity 2940. Piezoelectric plate 2910 is bonded to the bonding layer 2922 and spans the cavity 2940. In some cases, bonding layer 2922 does not exist over the cavity 2940 and is only between where the plate is attached to the substrate.

An interdigital transducer (IDT) 2930 formed on a front surface of the piezoelectric plate 2910 has busbars 2932 and 2934; and interleaved fingers 2936. Each of the busbars is attached to a set of fingers that form interleaved fingers 2936. Fingers 2936 may span or be over cavity 2940. In some cases, part of the busbars of the IDT are also over the cavity. In other cases, all of the busbars are over the substrate 2920 but not over the cavity. At least portions of the busbars are over the substrate (e.g., not over the cavity) to better conduct heat generated in the IDT to the substrate.

Device 2900 has width WC of cavity 2940; width WP of layers 2922 and 2910; width WIDT of IDT 2930. It also has lengths of the cavity, layers and IDT that are related to the widths, such as noted in FIG. 1. The widths and corresponding length may define a perimeter of the cavity, layers (e.g., diaphragm) and IDT.

Second metal layers 2970 and 2971 of M2 material are attached to the top of the substrate 2920; to the side surfaces of bonding layer 2922; to the side surfaces and part of the top surface of the piezoelectric layer 2910; and to the side surfaces and part of the top surface of the IDT 2936, such as to the top of the busbars and not to the top of the fingers 2936. In some cases, the second metal layers 2970 and 2971 are a single metal layer extending around a perimeter of and form an island of the bonding layer 2922, plate 2910 and IDT 2930.

The materials that can be used for the substrate, bonding layer, piezoelectric plate/layer, IDT, fingers, busbars, conductor pattern of FIGS. 5A and 5B may be the same as those described for FIG. 1. The material of layer M1 and layer M2 of FIGS. 5A-5B may be the same as those described for FIG. 1. The bonding layer 2922 may be BOX such as silicon dioxide, $Al_2O_3$, silicon nitride, silicon carbide, SiOC, aluminum nitride, a metal oxide, another oxide or another proper bonding material. It can be multiple layers of one or more of such materials.

The heat generated in or by the diaphragm 2910 during filtering may be conducted through the fingers 2936 to busbars 2932 and 2934 of the IDT 2930; and then to the substrate 2920. However, the busbars and other parts of the IDT are separated from the substrate by the piezoelectric layer and a layer of bonding oxide (BOX).

Thus, an improved XBAR resonator 2900 that efficiently conducts heat from the fingers 2936 and busbars 2932 and 2934 to the substrate 2920 is formed by removing predetermined areas (e.g., excess amounts) WR1 and WR2 of the bonding layer 2922 and piezoelectric layer 2910 from selected locations of the surface of the substrate of the device 2900 to provide a predetermined amount in reduction of thermal resistance between the conductor pattern and the substrate. Removing may be done by an island etch concept that removes layers 2922 and 2910 around a perimeter of the resonator to leave an island of the layers 2922, 2910 and IDT 2930 over cavity 2940. In this case, areas WR1 and WR2 are a single area extending around a perimeter of and form an island of the bonding layer 2922, plate 2910 and IDT 2930.

It is considered that multiple devices 2900 may exist as islands on substrate 2920 with areas WR1 and WR2 separating each island. Here, layer 2970 may extend partially between each island. In other cases, it may extend completely between all of the islands.

Removing the predetermined areas WR1 and WR2 causes the predetermined amount of reduction in 'contact thermal resistance'. The predetermined amount in reduction of thermal resistance between the conductor pattern and the substrate may be a reduction of 2×, 3×, 5× or 10× the thermal resistance. In some cases, it is a 3× reduction. In other cases, it is a 10× reduction. The area sizes of areas WR1 and WR2 can be selected or predetermined based on the predetermined amount of reduction desired. WR1 and WR2 may range from 1 um to 200 um, with maximum extent determined by resonator to resonator or resonator to bump offsets. WR1 and WR2 need not be identical to each other, but are not excluded from being identical.

The selected locations are predetermined areas WR1 and WR2 where removal of bonding layer 2922 and piezoelectric layer 2910 take place. For example, the bonding layer 2922 and piezoelectric layer 2910 span the cavity and have excess portions that extend a certain length past the perimeter of the cavity. The excess portions may extend a certain length and width distance (WR1 and WR2) past the length and width (WC) perimeter of the cavity. The excess portions may be a perimeter of the bonding layer and piezoelectric layer that extend in the length and width past the perimeter of the cavity by: a) more than 5, 10 or 20 percent; or b) between 2 and 25 percent of the length distance and width distance of the cavity. The removal regions WR1 and WR2 correspond to some or all of the area covered by metal routing between resonators or between a resonators and bumps.

The IDT and second metal conductors may be metal or another proper conductive material. The substrate may be silicon or another proper substrate semiconductor material. The bonding layer may be BOX such as silicon dioxide or another proper bonding material.

The piezoelectric layer 2910 may be etched away from over layer 2910 at areas WR1 and WR2 using a selective etching technique or chemistry that removes layer 2910 but does not remove any of the layer 2922. Here, layer 2922 may be an etch stop layer for etching layer 2910.

The bonding layer 2922 may be etched away from over substrate 2920 at areas WR1 and WR2 using a selective etching technique or chemistry that removes layer 2922 but does not remove any or a functionally relevant thickness of the substrate 120. Here, substrate 2920 may be an etch stop layer for etching layer 2922.

In some cases, both the bonding layer 2922 and piezoelectric layer 2910 are etched away from over substrate 2920 at areas WR1 and WR2 using a selective etching technique or chemistry that removes both layers but does not remove any or a functionally relevant thickness of the substrate 120. Here, substrate 2920 may be an etch stop layer for etching both layers.

Removing the areas of BOX and LN layers 2910 and 2922 may not impact the electrical isolation path of the IDT because there is no capacitance between M2 layers and the Si substrate layer 2920 if the BOX+LN is removed from the areas WR1 and WR2. For example, a trap-rich layer with high electrical resistance formed over the surface of substrate 2920 at the areas WR1 and WR2 will likely be sufficient to ensure the electrical isolation path. In some cases, it will be desirable to maintain high resistance with a barrier layer formed over the surface of substrate 2920 at the areas WR1 and WR2, such as an oxidized Ti layer. Such a layer would be of thickness between 0 nm and 20 nm to minimize parasitic thermal resistance contributions.

Figure 29B:
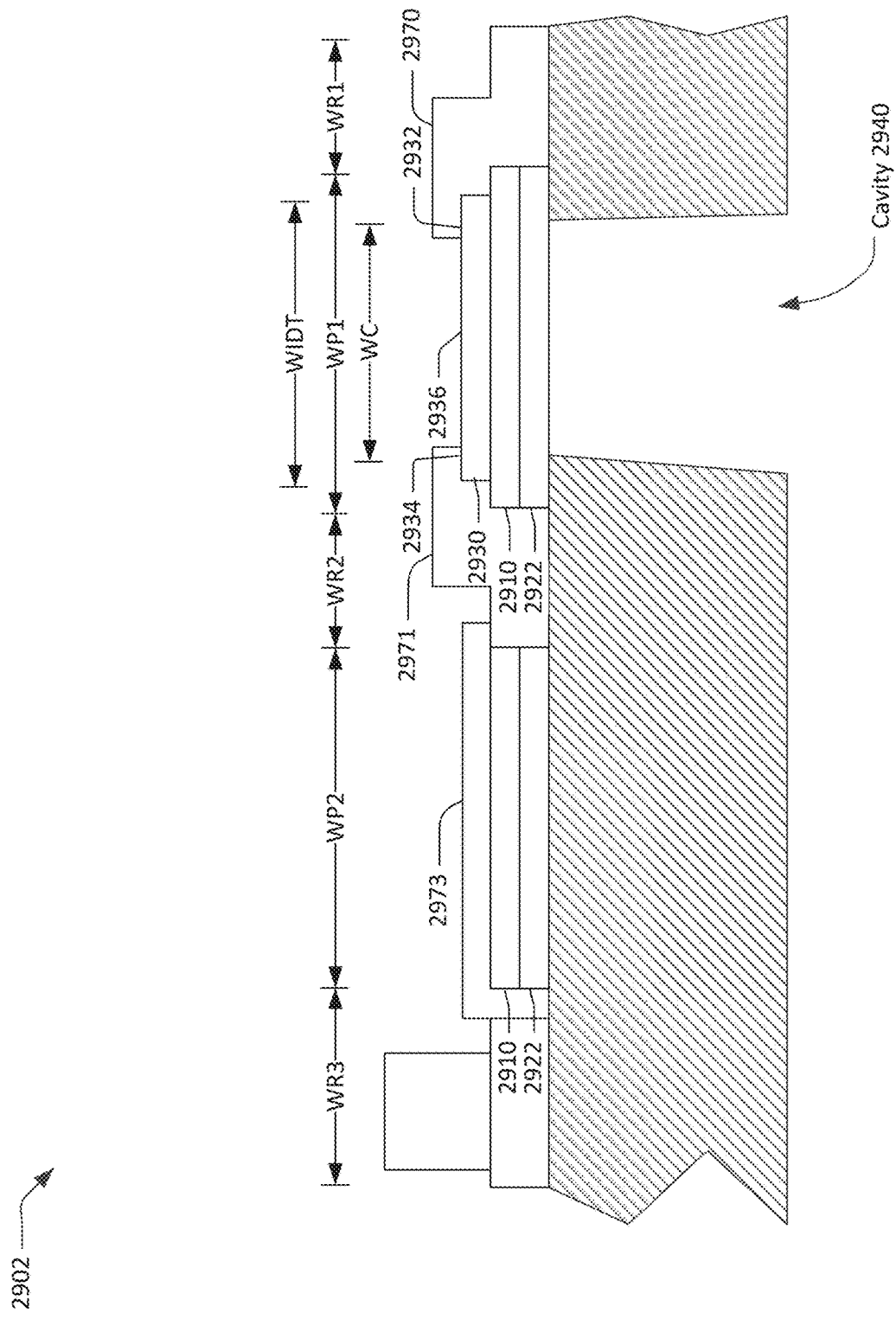
FIG. 29B is a schematic cross-sectional view of XBAR device having three predetermined areas of the bonding layer and piezoelectric layer removed from selected locations.

FIG. 29B is a schematic cross-sectional view of XBAR device 2902 having three predetermined areas of the bonding layer 2922 and piezoelectric layer 2910 removed from selected locations over the surface of the substrate of the device to provide a predetermined amount in reduction of thermal resistance between the IDT pattern 2936 and the substrate 2920. Device 2902 may represent an alternative configuration of device 2900 that includes width WP1 and another width WP2 of layers 2922 and 2910; and width WR3 of a third area of the layers 2922 and 2910 that is removed for reasons similar to removal of area WR1 and WR2. Device 2902 also has bump 2972 attached to layer 2971 as shown.

Widths WP2 and WR3 may have lengths that are related to the widths, such as noted in FIGS. 1 and 5. The widths and corresponding length may define a perimeter of the layers and area.

For device 2902, second metal layer 2973 of M2 material is attached to the side surfaces of bonding layer 2922 at WP2; to the side surfaces and the top surface of the piezoelectric layer 2910 at WP2; and to a top surface layer 2971. It also has second metal layer 2974 of M2 material attached to the top of the substrate 2920 at WR3; to a side surface of layer 2973; and with bump 2972 attached to its top surface. In some cases, the second metal layers 2973 and 2974 are separate metal layers extending through trenches formed in the bonding layer 2922 and plate 2910 beside the resonator or layer 2971. The BOX 2922 and LN 2910 over length WP2 may remain in order to provide additional electrical isolation, in regions where trap-rich Si or high resistance metal films do not provide sufficient electrical isolation. However, WP2 may also be zero, such that WR2 and WR3 are directly adjacent.

Thus, an improved XBAR resonator 2902 that efficiently conducts heat from the fingers 2936 and busbars 2932 and 2934 to the substrate 2920 is formed by removing predetermined areas (e.g., excess amounts) WR1, WR2 and WR3 of the bonding layer 2922 and piezoelectric layer 2910 from selected locations of the surface of the substrate of the device 2902 to provide a predetermined amount in reduction of thermal resistance between the conductor pattern and the substrate. Removing may be done by a trench etch concept that removes layers 2922 and 2910 in trenches beside a perimeter of the resonator separately from or in addition to the island of the layers 2922, 2910 and IDT 2930 described for FIG. 29A. The minimum size of WR3 is the diameter of the bump 2972, which typically ranges from 50 um to 100 um. WR3 may also extend as far as WR2, up to 200 um.

The selected locations and predetermined amounts for device 2902 can be the same as for device 2900. Etching the bonding layer 2922 and piezoelectric layer 2910 away from over substrate 2920 at the WR areas can be the same in device 2902 as for device 2900.

Description of Methods

Figure 30:
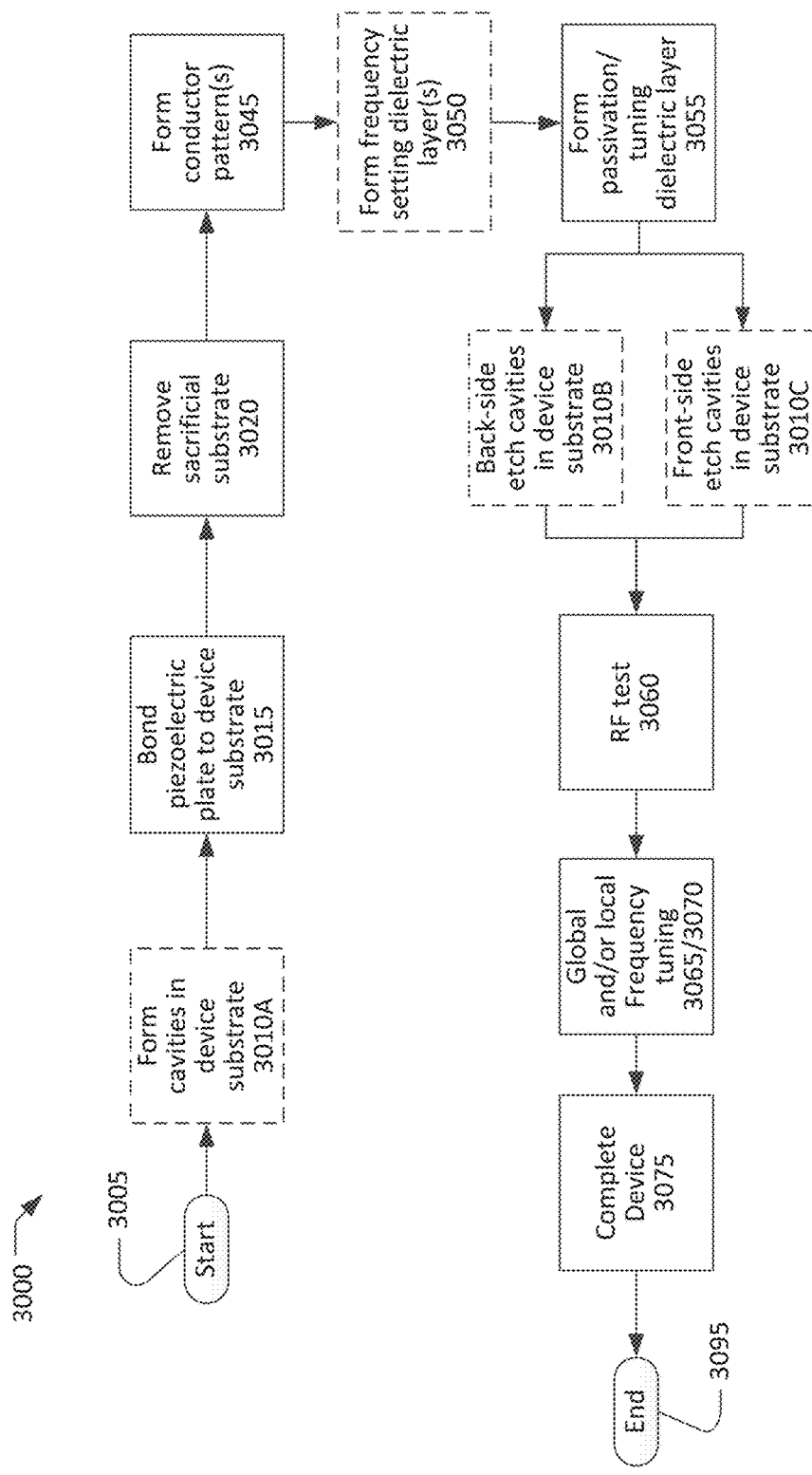
FIG. 30 is a flow chart of a process for fabricating an XBAR device.

FIG. 30 is a simplified flow chart summarizing a process 3000 for fabricating an XBAR or a filter device incorporating XBARs. The process 3000 could be for fabricating a filter device including multiple XBARs, some of which may include a frequency setting dielectric or coating layer. The process 3000 starts at 3005 with a device substrate and a thin plate of piezoelectric material disposed on a sacrificial substrate. The process 3000 ends at 3095 with a completed filter device. The flow chart of FIG. 30 includes only major process steps. Various conventional process steps (e.g. surface preparation, cleaning, inspection, baking, annealing, monitoring, testing, etc.) may be performed before, between, after, and during the steps shown in FIG. 30.

While FIG. 30 generally describes a process for fabricating a single filter device, multiple filter devices may be fabricated simultaneously on a common wafer (consisting of a piezoelectric plate bonded to a substrate). In this case, each step of the process 3000 may be performed concurrently on all of the filter devices on the wafer. XBARs or XBAR filter devices constructed according to this method can include any of the features described above. Thus, the method would include any steps necessary to include these features including modifications to the structure and the dimensions of the structure, orienting of the crystal structure of the piezoelectric plate, shaping of the electrodes and other structures related to the electrodes, etc.

The flow chart of FIG. 30 captures three variations of the process 3000 for making an XBAR which differ in when and how cavities are formed in the device substrate. The cavities may be formed at steps 3010A, 3010B, or 3010C. Only one of these steps is performed in each of the three variations of the process 3000.

The piezoelectric plate may typically be lithium niobate, including lithium niobite with a suitable crystal orientation. The piezoelectric plate may be some other material and/or some other cut. The device substrate may preferably be silicon. The device substrate may be some other material that allows formation of deep cavities by etching or other processing.

In one variation of the process 3000, one or more cavities are formed in the device substrate at 3010A, before the piezoelectric plate is bonded to the substrate at 3015. A separate cavity may be formed for each resonator in a filter device. Also, the cavities can be shaped and formed such that two or more resonators can be on one diaphragm over one cavity. The one or more cavities may be formed using conventional photolithographic and etching techniques. Typically, the cavities formed at 3010A will not penetrate through the device substrate.

At 3015, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 3020, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 3020, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and reflector elements of each XBAR, is formed at 3045 by depositing and patterning one or more conductor layers on the front side of the piezoelectric plate. All or portions of the first conductor pattern may be over the coating layer formed at 3025. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 3045 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 3045 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 3050, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 3055, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 3000, the passivation/tuning dielectric layer may be formed after the cavities in the device substrate are etched at either 3010B or 3010C.

In a second variation of the process 3000, one or more cavities are formed in the back side of the device substrate at 3010B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 3000, one or more cavities in the form of recesses in the device substrate may be formed at 3010C by etching the substrate using an etchant introduced through openings in the piezoelectric plate. A separate cavity may be formed for each resonator in a filter device. Also, the cavities can be shaped and formed such that two or more resonators can be on one diaphragm over one cavity. The one or more cavities formed at 3010C will not penetrate through the device substrate. For all cavity forming steps 3010A, 3010B, and 3010C, the dimensions of the cavity will be formed with respect to the dimensions of the IDTs of the conductor pattern, as described above with respect to FIGS. 1, 2A and 2B.

Ideally, after the cavities are formed at 3010B or 3010C, most or all of the filter devices on a wafer will meet a set of performance requirements. However, normal process tolerances will result in variations in parameters such as the thicknesses of dielectric layer formed at 3050 and 3055, variations in the thickness and line widths of conductors and IDT fingers formed at 3045, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 3055. The frequency of a filter device passband can be lowered by adding material to the passivation/tuning layer, and the frequency of the filter device passband can be increased by removing material to the passivation/tuning layer. Typically, the process 3000 is biased to produce filter devices with passbands that are initially lower than a required frequency range but can be tuned to the desired frequency range by removing material from the surface of the passivation/tuning layer.

At 3060, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 3065, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 3060 may be processed to generate a global contour map indicating the amount of material to be removed as a function of two-dimensional position on the wafer. The material is then removed in accordance with the contour map using the selective material removal tool.

At 3070, local frequency tuning may be performed in addition to, or instead of, the global frequency tuning performed at 3065. "Local" frequency tuning is performed with a spatial resolution smaller than an individual filter device. The test results from 3060 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 3065 and/or 3070, the filter device is completed at 3075. Actions that may occur at 3075 include forming bonding pads or solder bumps or other means for making connection between the device and external circuitry (if such pads were not formed at 3045); excising individual filter devices from a wafer containing multiple filter devices; other packaging steps; and additional testing. After each filter device is completed, the process ends at 3095.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator, comprising:
a piezoelectric layer having front and back surfaces, a portion of the piezoelectric layer forming a diaphragm; and
a conductor pattern at the piezoelectric layer and comprising an interdigital transducer (IDT) having interleaved fingers on the diaphragm,
wherein a thickness between the front and back surfaces of the piezoelectric layer is greater than or equal to 200 nm and less than or equal to 1000 nm, and
wherein the interleaved fingers of the IDT comprise a first portion having a first pitch and a first mark and a second portion having a second pitch and a second mark that are not equal to the first pitch and first mark, respectively.

2. The acoustic resonator of claim 1, wherein the piezoelectric layer is lithium niobite or lithium tantalate.

3. The acoustic resonator of claim 2, wherein the piezoelectric layer is one of Z-cut, rotated Z-cut, and rotated Y-cut.

4. The acoustic resonator of claim 1, wherein the IDT is one or more of aluminum, an aluminum alloy, copper, a copper alloy, beryllium, gold, tungsten, and molybdenum.

5. The acoustic resonator of claim 1, wherein a radio frequency signal applied to the IDT excites a primary acoustic mode within the piezoelectric layer.

6. The acoustic resonator of claim 5, wherein the primary acoustic mode is a shear acoustic mode.

7. The acoustic resonator of claim 1 further comprising the substrate, wherein the back surface of the piezoelectric layer is attached to a surface of the substrate either directly or via one or more intermediate layers, and wherein the diaphragm is over a cavity in at least one of the substrate and the one or more intermediate layers.

8. The acoustic resonator of claim 7, wherein the substrate is one or more of silicon, sapphire, and quartz.

9. The acoustic resonator of claim 7, wherein the cavity is a recess in the at least one of substrate and the one or more intermediate layers.

10. The acoustic resonator of claim 7, wherein the cavity extends through a thickness of the at least one of substrate and the one or more intermediate layers.

11. A filter device, comprising:
- a plurality of acoustic resonators, with at least one of the acoustic resonators including:
  - a piezoelectric layer having front and back surfaces, portions of the piezoelectric layer forming a diaphragm; and
  - a conductor pattern at the piezoelectric layer and comprising an interdigital transducer (IDT) having interleaved fingers on the diaphragm,
  - wherein a thickness between the front and back surfaces of the piezoelectric layer is greater than or equal to 200 nm and less than or equal to 1000 nm, and
  - wherein the interleaved fingers of the IDT comprise a first portion having a first pitch and a first mark and a second portion having a second pitch and a second mark that are not equal to the first pitch and first mark, respectively.

12. The filter device of claim 11, wherein the piezoelectric layer of the at least one acoustic resonator is lithium niobite or lithium tantalate.

13. The filter device of claim 12, wherein the piezoelectric layer of the at least one acoustic resonator is one of Z-cut, rotated Z-cut, and rotated Y- cut.

14. The filter device of claim 11, wherein each IDT of the plurality of acoustic resonators is one or more of aluminum, an aluminum alloy, copper, a copper alloy, beryllium, gold, tungsten, and molybdenum.

15. The filter device of claim 11, wherein a radio frequency signal applied to each IDT of the plurality of acoustic resonators excites a respective primary acoustic mode within the piezoelectric layer.

16. The filter device of claim 14, wherein the respective primary acoustic mode is a shear acoustic mode.

17. The filter device of claim 11, wherein the at least one acoustic resonator further comprises a substrate, wherein the back surface of the piezoelectric layer is attached to a surface of the substrate either directly or via one or more intermediate layers, and wherein the respective diaphragm is over a cavity in at least one of the substrate and the one or more intermediate layers.

18. The filter device of claim 17, wherein the substrate is one or more of silicon, sapphire, and quartz.

19. The filter device of claim 17, wherein the respective cavity is a recess in the at least one of substrate and the one or more intermediate layers.

20. The filter device of claim 17, wherein the respective cavity extends through a thickness of the at least one of substrate and the one or more intermediate layers.

* * * * *